United States Patent [19]

Ouchi et al.

[11] Patent Number: 5,659,560
[45] Date of Patent: Aug. 19, 1997

[54] APPARATUS AND METHOD FOR DRIVING OSCILLATION POLARIZATION SELECTIVE LIGHT SOURCE, AND OPTICAL COMMUNICATION SYSTEM USING THE SAME

[75] Inventors: Toshihiko Ouchi, Machida; Masao Majima, Isehara; Jun Nitta, Tokyo; Seiji Mishima; Ouichi Kubota, both of Atsugi, all of Japan

[73] Assignee: Canon Kabushiki Kaisha, Tokyo, Japan

[21] Appl. No.: 431,717

[22] Filed: Apr. 28, 1995

[30] Foreign Application Priority Data

| May 12, 1994 | [JP] | Japan | 6-122961 |
| May 19, 1994 | [JP] | Japan | 6-131075 |

[51] Int. Cl.$^6$ .................................................. H01S 3/10
[52] U.S. Cl. .................. 372/27; 372/29; 372/32; 372/50
[58] Field of Search ................. 372/26, 27, 29, 372/38, 32, 50

[56] References Cited

U.S. PATENT DOCUMENTS

| 4,685,108 | 8/1987 | Seymour et al. | 372/19 |
| 5,479,423 | 12/1995 | Tanikawa | 372/26 |

FOREIGN PATENT DOCUMENTS

| 0415407A2 | 3/1991 | European Pat. Off. |
| 0591863A1 | 4/1994 | European Pat. Off. |
| 58-225745 | 12/1983 | Japan |
| 62-144426 | 6/1987 | Japan |
| 63-160391 | 7/1988 | Japan |
| 2159781 | 6/1990 | Japan |

OTHER PUBLICATIONS

"Highly efficient TE/TM mode switching of GaAsP/AlGaAs strained quantum-well laser diodes" by Hidenao Tanaka et al; Applied Physics Letters 64(1994)10 Jan., No. 2, Woodbury, N.Y. US.

"Channel Selection control for optical FDM distribution systems" by K. Oda et al.; OCS89-65; pp. 21-28 (no date).

"A photo wavelength-division and time-division hybrid multiplexed network using acoustooptic tunable wavelength filters for a broadcasting studio application" by N. Shimosaka et al.; OCS91-83; pp. 59-65 (no date).

(List continued on next page.)

Primary Examiner—James W. Davie
Attorney, Agent, or Firm—Fitzpatrick, Cella, Harper & Scinto

[57] ABSTRACT

In a light source apparatus, the polarization mode of oscillation light from a semiconductor laser is switchable between two different polarization modes when a modulation current is injected into a portion of a light waveguide of the semiconductor laser. Light in one polarization mode and light in the other polarization mode are separately obtained from the oscillation light from the semiconductor laser. At least the light in one of the two different polarization modes is converted to an electric signal. Current injected into the semiconductor laser is controlled based on the electric signal such that a modulation state of light from the semiconductor laser is stabilized. The light in the other polarization mode, or light in one polarization mode emitted from the other emission side of the semiconductor laser may be used for optical transmission.

62 Claims, 51 Drawing Sheets

OTHER PUBLICATIONS

"Polarization Mode Filter/Splitter Using Mixing of Semiconductor Super-Lattice" by Suzuki et al.; OQE91–160, pp. 55–60 (no date).

"Semiconductor Tunable Wavelength Filters" by T. Numai et al.; OQE88–65; pp. 9–15 (no date).

"λ/4–shifted DFB Laser/Electroabsorption Modulator Integrated Light Source" by M. Suzuki et al. OQE 90–45; pp. 99–105 (no date).

"Characteristics of Optical Guided Modes In Multilayer Metal–Clad Planar Optical Guide with Low–Index Dielectric Buffer Layer" by Y. Yamamoto et al. IEEE Journal of Quantum Electronics, vol. QE–11, No. 9 Sep. 1975 pp. 729–735.

"FDMA–FSK Star Network With A Tunable Optical Filter Demultilexer" by I.P. Kaminow et al. Journal of Lightwave Technology, vol. 6 No. 9, Sep. 1988,pp. 1406–1414.

"1.5 Gbit/s FSK Transmission System Using Two Electrode DFB Laser As A Tunable FSD Discriminator/Photodetector" by M. J. Chawki et al. Electronic Letters Jul. 19, 1990, vol. 26, No. 15. pp. 1146–1148.

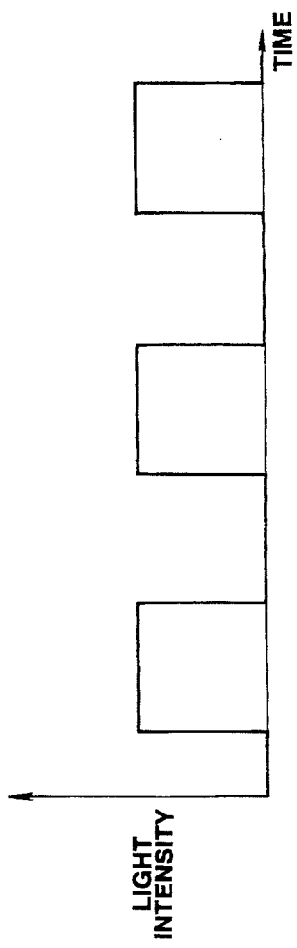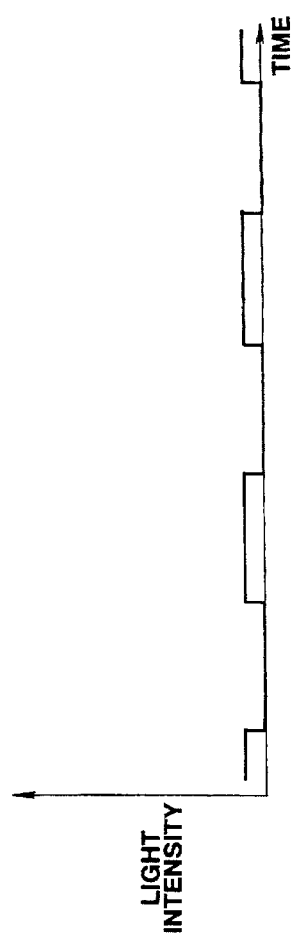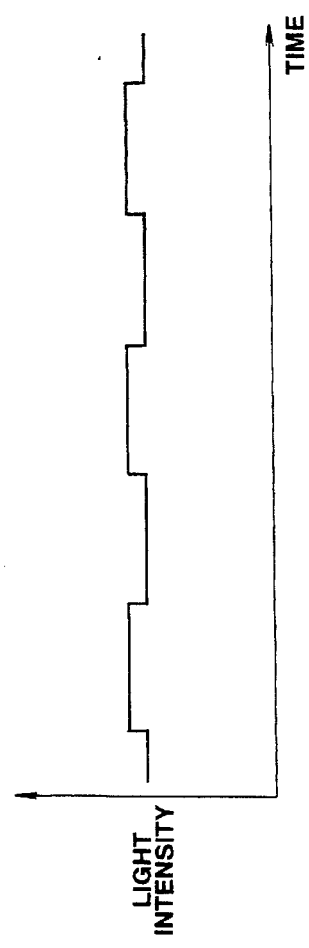

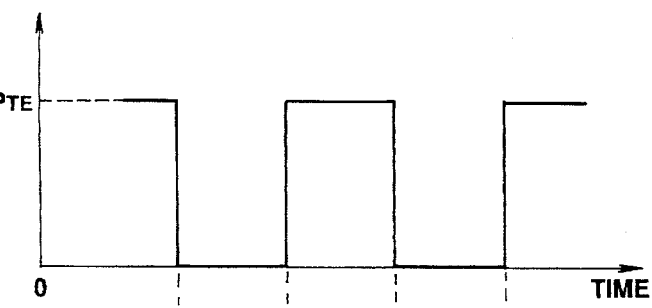
FIG.6A TE POLARIZATION OUTPUT
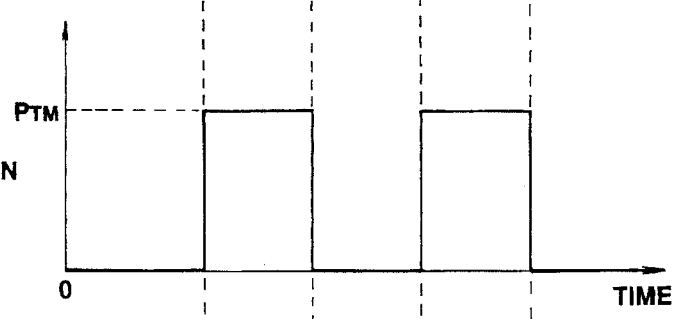
FIG.6B TM POLARIZATION OUTPUT
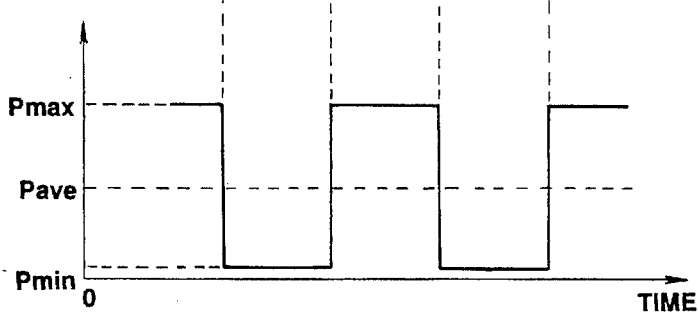
FIG.6C LIGHT SOURCE OUTPUT

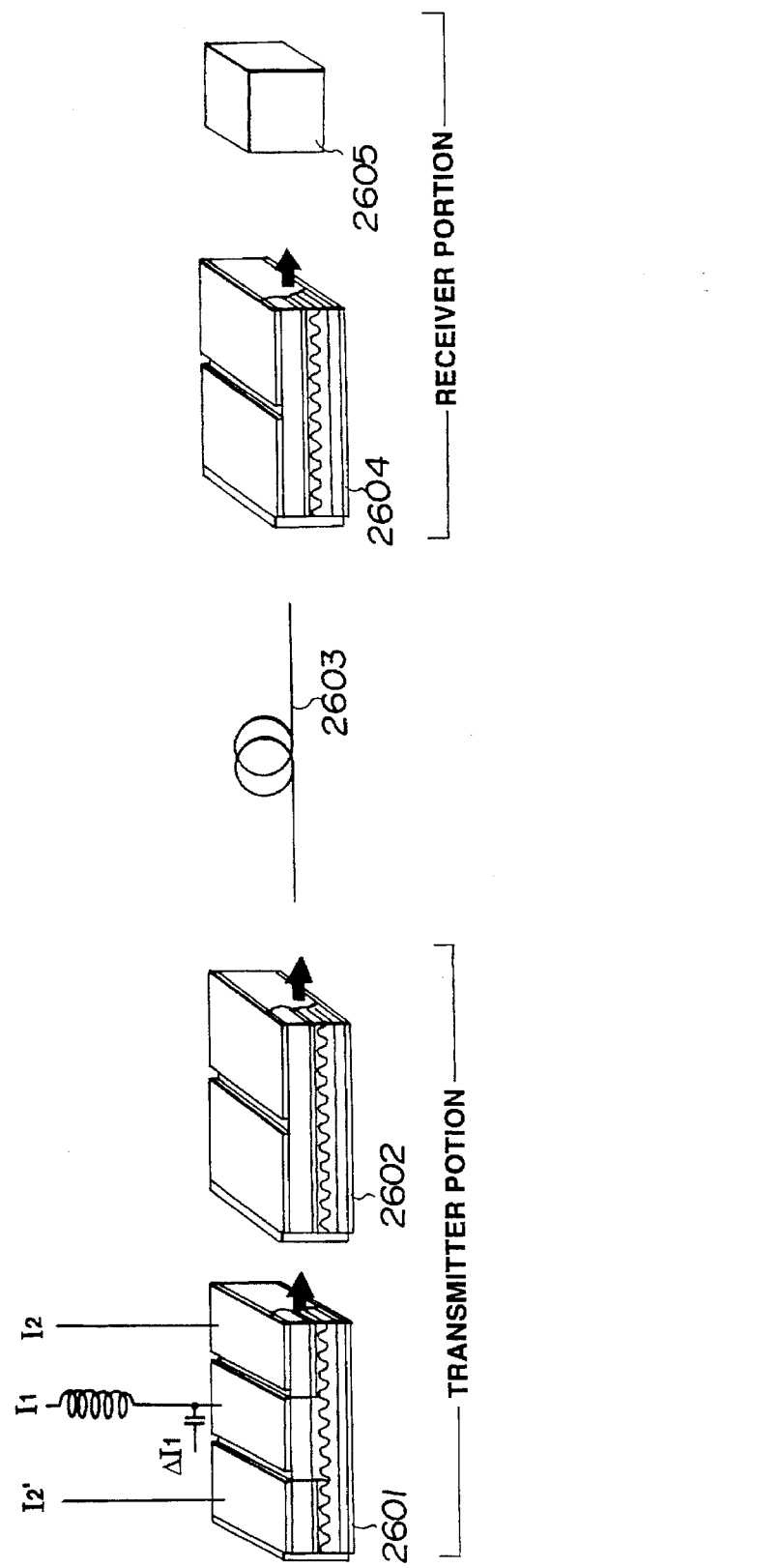

APPARATUS AND METHOD FOR DRIVING OSCILLATION POLARIZATION SELECTIVE LIGHT SOURCE, AND OPTICAL COMMUNICATION SYSTEM USING THE SAME

BACKGROUND OF THE INVENTION

1. Field of the Invention

The present invention relates to an apparatus and a method for directly and stably driving an oscillation polarization selective light source, such as a distributed feedback (DFB) semiconductor laser that can switch the polarization mode of oscillation light by a modulation current injected thereinto, and an optical communication system using this apparatus or method and the like.

2. Related Background Art

In recent years, increased transmission capacity in the field of optical communications has become desirable, and the development of optical frequency division multiplex (FDM) communication, in which signals at a plurality of optical frequencies are multiplexed in a single optical fiber, has been advanced.

There are two kinds of optical FDM communication methods, which are classified by the type of light signal used in the receiving technique. One method is a coherent optical communication in which a beat signal is produced between signal light and light from a local oscillator to obtain an intermediate-frequency output which output is detected. The other method is one in which only light at a desired wavelength or optical frequency is selected by a tunable filter, and the thus-selected light is detected. The latter method, known as an optical-frequency tunable filtering method, will be described.

The tunable filter may comprise one of a Mach-Zehnder type, a fiber Fabry-Perot type, an acousto-optic (AO) type, a semiconductor filter type and the like, which have been respectively developed.

In the Mach-Zehnder filter type and the fiber Fabry-Perot filter type, the transmission bandwidth can be relatively freely designed and a width of several Å can be obtained, so that the frequency multiplicity of optical FDM communication can be increased. Further, there is a great advantage in that the polarization state of signal light does not adversely affect the quality of the received signal. An example of a Mach-Zehnder type filter is disclosed in K. Oda et al. "Channel Selection Characteristics of Optical FDM Filter", OCS 89–65, 1989. An example of a fiber Fabry-Perot type filter is disclosed in I. P. Kaminow et al. "FDMA-FSK Star Network with a Tunable Optical Filter Demultiplexer", IEEE J. Lightwave Technol., vol. 6, No. 9, p. 1406, September, 1988. Those filter types, however, have the disadvantages that considerable light loss occurs and that downsizing of a receiver device is difficult because the integration of a semiconductor photodetector and the filter is not possible.

In the AO modulator filter type, the receiving control is performed easily since the transmission bandwidth is large, e.g., several tens of Å, but the multiplicity of transmitted wavelengths cannot be increased. An example of an AO modulator type filter is disclosed in N. Shimosaka et el. "A photonic wavelength division/time division hybrid multiplexed network using accoustic tunable wavelength filters for a broadcasting studio application", OCS 91–83, 1991. This filter type, however, has the drawbacks that light loss occurs, that the integration with a semiconductor photodetector is not possible and that polarization control of signal light is necessary because the polarization state of signal light adversely affects the quality of the received signal.

In the semiconductor filter type, e.g., a distributed feedback (DFB) filter provided with a diffraction grating formed in a light guide layer for single longitudinal mode operation, the transmission bandwidth can be narrowed (e.g., down to about 0.5 Å), optical amplification (approx. 20 dB) exists, the multiplicity of transmitted wavelengths can be increased and the minimum receiving sensitivity can be improved (i.e., the minimum receiving intensity can be reduced). An example of a semiconductor type filter is disclosed in T. Numai et al. "Semiconductor Tunable Wavelength Filter", OQE 88–65, 1988. Further, this type of filter can be formed with the same material as a semiconductor photodetector, so that integration and downsizing are feasible.

On the other hand, in an optical communication system using the above kinds of filters and a semiconductor laser as a light source, the semiconductor laser is required to have stable oscillation and polarization direction and to maintain a dynamic single mode. Therefore, a DFB laser, a distributed Bragg reflector (DBR) laser, or the like is used as a semiconductor laser since each radiates in only the transverse electric (TE) mode. At present, the most popular modulation system for transmission signals in transmission systems is digital amplitude modulation, or amplitude shift keying (ASK) in which a drive current injected into a laser is directly modulated, or digital frequency modulation or frequency shift keying (FSK) in which a signal current having a minute amplitude is superposed on a bias current.

In the FSK system, techniques have been developed, for example, for using the wavelength discrimination function of an optical filter to demodulate signals. In this connection, reference should be made to M. J. Chawki et al. "1.5 Gbit/s FSK Transmission System Using Two Electrode DFB Laser As A Tunable FSK Discriminator/Photodetector", Electron. Lett. vol. 26 No. 15, p. 1146, 1990.

Furthermore, another system has been proposed in which the polarization mode of oscillated light from a DFB laser is switched between light in TE and TM (transverse magnetic) modes and only one of TE and TM modes is selected (see, for example, Japanese Patent Laid-Open No.2(Heisei)-159781). When an ordinary DFB laser is used, however, it is difficult to reduce a modulated drive current below 10 mA because there is a great difference in gain of its active layer between TE and TM modes. Thus, dynamic wavelength fluctuation is not reduced much, even compared with the ASK system.

Further, in the direct optical intensity or amplitude modulation system, the spectral line width is widened to about 0.3 nm due to the dynamic wavelength fluctuation. In addition, the wavelength tunable width is typically approximately 3 nm, so that the number of channels cannot be made large and hence the direct ASK modulation system is unsuitable for frequency or wavelength division multiplexing transmission (generally, the optical frequency or wavelength interval between adjacent channels in the frequency division multiplexing transmission is much narrower than that in the wavelength division multiplexing transmission). On the other hand, when an external intensity modulator is used to modulate constant-intensity light from a light source or semiconductor laser, the number of devices will increase and hence this system is disadvantageous in cost even though the wavelength fluctuation can be reduced.

Further, in the direct frequency modulation system, the channel width is narrow and hence the number of channels can be increased. However, the tracking control of a tunable filter needs to be accurately performed. Further, there is a tendency for crosstalk between wavelengths indicating codes "1" and "0" to occur depending on a change in surroundings, and an error rate of received signals increases.

Further, in the polarization modulation system in which the polarization mode is switched, though the modulation can be performed by a minute signal, a polarizer disposed in front of the emission end of a laser and a filter disposed at the side of a receiver are needed to perform signal transmission with deep modulation. Thus, the number of devices and cost cannot be reduced. Furthermore, the extinction ratio is sensitive to a change in a bias current injected into the laser.

The direct polarization modulation system will be described in more detail. FIG. 1 illustrates the system. As illustrated in FIG. 1, the system includes a two-electrode DFB-LD 11-1, an adder 15-1, driving circuits 11-10-1 and 11-10-2, and a polarizer 11-11. In the two-electrode DFB-LD 11-1, the oscillation polarization mode can be switched by changing currents injected through the two electrodes. Such characteristics can be obtained by adjusting device parameters, such as the Bragg wavelength of a diffraction grating and the gain spectrum of an active layer. The driving circuits 11-10-1 and 11-10-2 supply currents corresponding to input signals thereinto, respectively. Those currents are injected into the two-electrode DFB-LD 11-1 through the two electrodes. The adder 15-1 adds two input signals, i.e., a bias signal and a modulation signal, to each other. The output of the adder 15-1 is connected to the driving circuit 11-10-1, and a bias signal is directly input into the driving circuit 11-10-2. The modulation signal and the two bias signals are supplied to the light source apparatus from a transmitter in which the light source apparatus is contained. The polarizer 11-11 only transmits a TE polarization component of output light from the two-electrode DFB-LD 11-1, and the thus-created modulated output (i.e., ASK signal) is transmitted through a transmission line.

FIG. 2 illustrates oscillation characteristics of a two-electrode DFB-LD which can switch its oscillation polarization mode between TE and TM modes. The abscissa indicates a current $I_1$ injected through a front side electrode, the ordinate indicates a current $I_2$ injected through a rear side electrode, and a region of TE mode oscillation (right-hand lower portion of the thick dotted line) and a region of TM mode oscillation (left-hand upper portion of the thick dotted line) are shown. Curves in each region indicate contours of output intensities of the respective polarization modes, and the intensity of the output increases along an arrow.

FIG. 3 illustrates a manner of oscillation switching between TE and TM modes. FIG. 3 illustrates changes in light intensities of respective polarization modes in the case when the current injected through the front electrode is fixed to $I_{1b}$ and the current $I_2$ injected through the rear electrode is changed. A portion near a switching region (described below) is illustrated in enlarged form. The oscillation occurs in only the TE mode when $I_2 < I_{2smin}$, the oscillation occurs in both TE and TM modes when $I_{2smin} < I_2 < I_{2smax}$, and the oscillation occurs in only the TM mode when $I_2 > I_{2smax}$. When $I_{2smin} < I_2 < I_{2smax}$, the oscillation condition is unstable both in the TE and TM modes, and the time-averaged light intensity of the TE mode decreases and that of the TM mode increases as the current $I_2$ increases. At a point of $I_{2sc}$, the light intensity of the TE mode is equal to that of the TM mode. In the following explanation, the region between $I_{2smin}$ and $I_{2smax}$ is referred to as the switching region.

The direct polarization modulation can be achieved by setting a bias current point below the switching region and superposing a modulated current thereon. For example, $I_1$ can be fixed and $I_2$ can be modulated. First, $I_1$ is fixed at $I_{1b}$. The switching between TE and TM modes occurs when $I_2$ is changed in a range between a value below $I_{2smin}$ and a value above $I_{2smax}$. The bias component $I_{2b}$ and the modulation component $I_{2m}$ of $I_2$ are set such that the condition $I_{2b} < I_{2smin}$ and $I_{2b} + I_{2m} > I_{2smax}$ is satisfied. Thus, the oscillation takes place in the TE mode when $I_2 = I_{2b}$, while the oscillation takes place in the TM mode when $I_2 = I_{2b} + I_{2m}$. The polarizer 11-11 takes out only the TE mode component of the light signal, and an intensity-modulated light signal is obtained. In this example, the light output is ON when $I_2 = I_{2b}$, and the light output is OFF when $I_2 = I_{2b} + I_{2m}$. Thus, the modulation signal is inverted by the light source apparatus illustrated in FIG. 1.

In the modulation system, the DFB-LD is directly modulated, so the structure thereof is as simple as the direct FSK modulation system. Further, the amplitude of the modulation current is small, say several mA, and the laser is always oscillated in both states corresponding to mark and space of the FSK modulation signal. Therefore, optical frequency chirping of the oscillated light signal obtained by the modulation is as small as the external modulation system.

The direct polarization modulation can also be obtained by setting a bias point of injection current in the switching region and modulating the current with an appropriate modulation amplitude. This case will be described using FIGS. 2, 5 and 6A–6C. $I_1$ is fixed at $I_{1b}$. $I_2$ is a square waveform whose bias component is $I_{2b}$ and whose modulation component has an amplitude $I_{mod}$. The upper end of this square waveform is $I_{mod}/2$, and the lower end of this square waveform is $-I_{mod}/2$. They respectively correspond to mark and space of FSK. $I_{2b}$ and $I_{mod}$ are set such that only the TE mode is oscillated when $I_{2E} = I_{2b} - I_{mod}/2$ and only the TM mode is oscillated when $I_{2M} = I_{2b} + I_{mod}/2$ (see FIGS. 6A and 6B). The intensity-modulated light signal can be produced by selecting either the TE or TM polarization component using the polarizer 11-11 (see FIG. 6C). In the following description, when "bias component" or "bias point" is refered to, the above-discussed two meanings (the case where the modulation component is considered to be DC-like and the case where the modulation component is considered to be AC-like) are used discriminately.

The direct polarization modulation system has the following disadvantage. The distribution of the TE and TM oscillation regions of a multi-electrode DFB-LD varies for each device. Therefore, the bias point of the direct polarization modulation needs to be set on the basis of precise measurements for each device. Further, the distribution of the TE and TM oscillation regions changes due to temperature and the like even in the same device. Hence, it is difficult to maintain the state of polarization modulation (e.g., an intensity ratio between TE and TM modes that corrensponds to the modulation signal).

Impairment of the state of polarization modulation due to some change in a device will be described using FIGS. 3 and 4A–4C. FIGS. 4A–4C illustrate light outputs when the bias component of injection current is appropriate and when it deviates from an optimum switching point.

In FIG. 3, the bias component $I_{2b}$ and the modulation component $I_{2m}$ of $I_2$ are initially set such that $I_{2b} < I_{2smin} - \delta$ and $I_{2b} + I_{2m} > I_{2smax} + \delta$ are satisfied. The magnitude of $\delta$ is minute. In the two-electrode DFB-LD 11-1 under such a condition, only TE mode light is emitted when $I_2 = I_{2b}$ and only TM mode light is emitted when $I_2 = I_{2b} + I_{2m}$. The intensity-modulated light signal produced by the polarizer 11-11 changes as shown in FIG. 4A. Since the light source inverts the modulation signal, the intensity of the light signal is high when $I_2=I_{2b}$ and low $I_2=I_{2b}+I_{2m}$.

When current values $I_{2smin}$, $I_{2smax}$ and $I_{2sc}$ of the switching region vary and $I_{2b}$ exceeds $I_{2smin}$, the light intensity of the TE mode at the time of $I_2=I_{2b}$ decreases, whereas the light intensity of the TM mode increases. Further, when $I_{2b}$ exceeds $I_{2smax}$, only the TM mode begins to be oscillated. This is illustrated in FIG. 4B. In comparison, when $I_{2b}$ becomes lower than $I_{2smax}-I_{2m}$, the light intensity of the TM mode at the time of $I_2=I_{2b}+I_{2m}$, decreases and the light intensity of TE mode increases. Further, when $I_{2b}$ becomes less than $I_{2smin}-I_{2m}$, only the TE mode begins to be oscillated. This is illustrated in FIG. 4C.

As is apparent from the foregoing, when current values of the switching region deviate, the modulation efficiency of polarization modulation is impaired (see FIG. 4C), or in some cases no correct modulation will be achieved (see FIG. 4B).

SUMMARY OF THE INVENTION

It is an object of the present invention to provide an apparatus and a method for directly and stably driving an oscillation polarization selective light source that can switch the polarization mode of oscillation light by a modulation current injected thereinto, an optical communication system using this apparatus or method and the like.

According to one aspect of the present invention, there is provided a method for driving a semiconductor laser which includes a preparing step of preparing a semiconductor laser whose polarization mode of oscillation light can be switched between two different polarization modes; an injecting step of injecting a modulation current into a portion of a light waveguide of the semiconductor laser to switch the polarization mode of oscillation light between the two different polarization modes; an obtaining step of obtaining light in one polarization mode and light in the other polarization mode from the oscillation light of the semiconductor laser; a converting step of converting light in at least one of the two different polarization modes to an electric signal; and a controlling step of controlling current injected into the semiconductor laser based on the electric signal such that a modulation state (for example, a light intensity, such as a peak intensity and an averaged intensity, of at least one of the two different polarization modes, or the oscillation wavelength thereof) of light from the semiconductor laser is stabilized.

According to another aspect of the present invention, there is provided an apparatus for driving a semiconductor laser which includes a semiconductor laser; an obtaining unit for obtaining light in one polarization mode and light in an other polarization mode from oscillation light of a semiconductor laser; a converting unit for converting light in at least one of the two different polarization modes to an electric signal; and a controlling unit for controlling current injected into the semiconductor laser based on an electric signal such that a modulation state of light from the semiconductor laser is stabilized. The polarization mode of oscillation light from the semiconductor laser can be switched between two different polarization modes by injecting a modulation current into a portion of a light waveguide of the semiconductor laser.

According to another aspect of the present invention, there is provided an optical communication system for communicating over a light transmission line that transmits signals from a transmitter side to a receiver side. The system includes a light source which includes an apparatus for driving a semiconductor laser recited above, a coupling unit for coupling light in one of two different polarization modes from a semiconductor laser to the light transmission line, and a receiver for directly detecting the light in one of the two different polarization modes transmitted through the light transmission line. The receiver is disposed on the receiver side.

According to another aspect of the present invention, there is provided an opto-electric converting apparatus which includes a light source which includes an apparatus for driving a semiconductor laser recited above, a coupling unit for coupling light in one of two different polarization modes from the semiconductor laser to a light transmission line, and a receiver for directly detecting light in one of the two different polarization modes transmitted through the light transmission line.

According to another aspect of the present invention, there is provided an optical cable television system for communicating over a light transmission line that transmits signal light from a broadcasting center to a subscriber side. The system includes a light source which has an apparatus for driving the semiconductor laser recited above, a coupling unit for coupling light in one of two different polarization modes from the semiconductor laser to the light transmission line and a receiver and an optical filter for directly detecting light in one of the two different polarization modes transmitted through the light transmission line. The light source and the coupling unit are disposed at the broadcasting center, and the receiver and the optical filter are disposed on the subscriber side.

These advantages and others will be more readily understood in connection with the following detailed description of the preferred embodiments in conjunction with the drawings.

BRIEF DESCRIPTION OF THE DRAWINGS

FIGS. 4A, 4B and 4C are respectively illustrations of light intensities of oscillation light in three cases of the switching region.

FIG. 6A is an illustration of a change in light output in a TE mode occurring when oscillation light is switched between TE mode and TM mode.

FIG. 6B is an illustration of a change in light output in TM mode occurring when oscillation light is switched between TE mode and TM mode.

FIG. 6C is an illustration of a change in light output from a light source occurring when oscillation light is switched between TE mode and TM mode.

FIG. 45 is a perspective view of a twenty-fifth embodiment of the present invention.

DESCRIPTION OF THE PREFERRED EMBODIMENTS

First Embodiment

A first embodiment of the present invention will be described with reference to FIGS. 9 through 13.

Figure 11A:
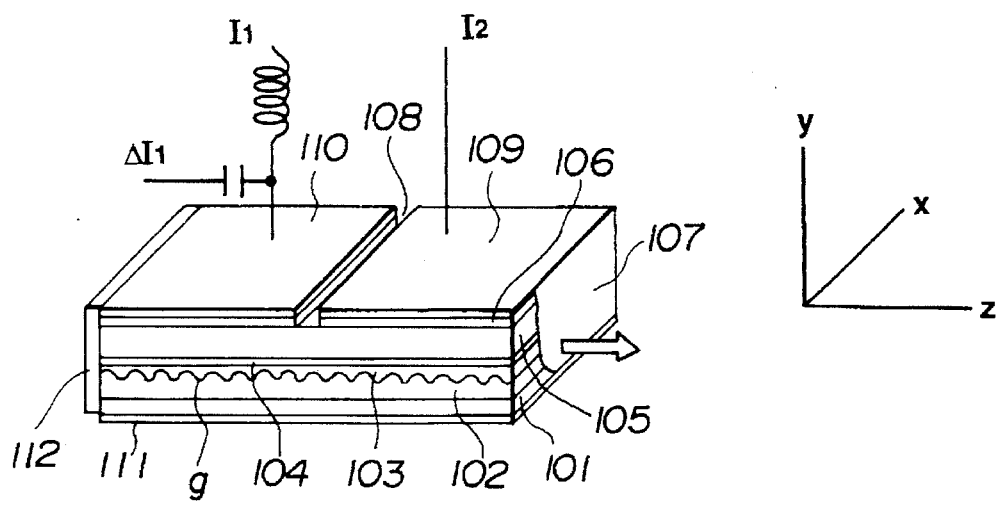
FIG. 11A is a view illustrating the structure of a semiconductor laser used in the first embodiment of the present invention.

As shown in FIG. 11A which is a perspective view illustrating a right-hand half of a two-electrode DFB-LD (laser diode) semiconductor laser, the laser includes an n-type InP substrate 101, an n-type InP buffer layer 102 on which a diffraction grating g having a depth of 0.05 µm is formed, an n-type $In_{0.82}Ga_{0.18}As_{0.4}P_{0.5}$ lower light guide layer 103 having a thickness of 0.2 µm, an active layer 104 having a strained quantum well structure, a p-type InP clad layer 105, a p-type $In_{0.53}Ga_{0.47}As$ contact layer 106, a high-resistance InP burying layer 107, an electrode separation region 108 which is formed by removing the contact layer 106, an electrode 109 of Cr/AuZnNi/Au film which is located on the light emission side through which a constant bias current $I_2$ is injected, an electrode 110 of Cr/AuZnNi/Au film through which a signal-superimposed current ($I_1$+ $\Delta I_1$) is injected, an electrode 111 of AuGeNi/Au film formed on the bottom of the substrate 101 and an antireflection coating 112 of SiO film which is deposited on only an end facet on a side opposite the light emission side. The active layer 104 is constructed of ten pairs of intrinsic $In_{0.28}Ga_{0.72}As$ well layers (thickness: 10 nm) and intrinsic $In_{0.82}Ga_{0.18}As_{0.4}P_{0.6}$ barrier layers (thickness: 10 nm). In the active layer 104 which is a tensile-strain multiple quantum well layer, transition energy between the level of heavy holes in the valence band and the ground level of electrons in the conduction band ($E_{hh0}$–$E_{e0}$) is made equal to transition energy between the level of light holes in the valence band and the ground level of electrons in the conduction band ($E_{1h0}$–$E_{e0}$). Therefore, when compared with an ordinary DFB laser, an oscillation threshold for a TM mode (which corresponds to the transition energy ($E_{1h0}$–$E_{e0}$)) is low and the oscillation polarization-mode switching between TE and TM modes can be effectively performed by properly controlling the current injected into the device, for example. The structure of the laser shown in FIG. 11A is slightly different from a DFB laser 1 shown in FIG. 9 in that the grating g is formed below (not above) the active layer 104. Those lasers, however, operate in substantially the same manner.

Figure 9:
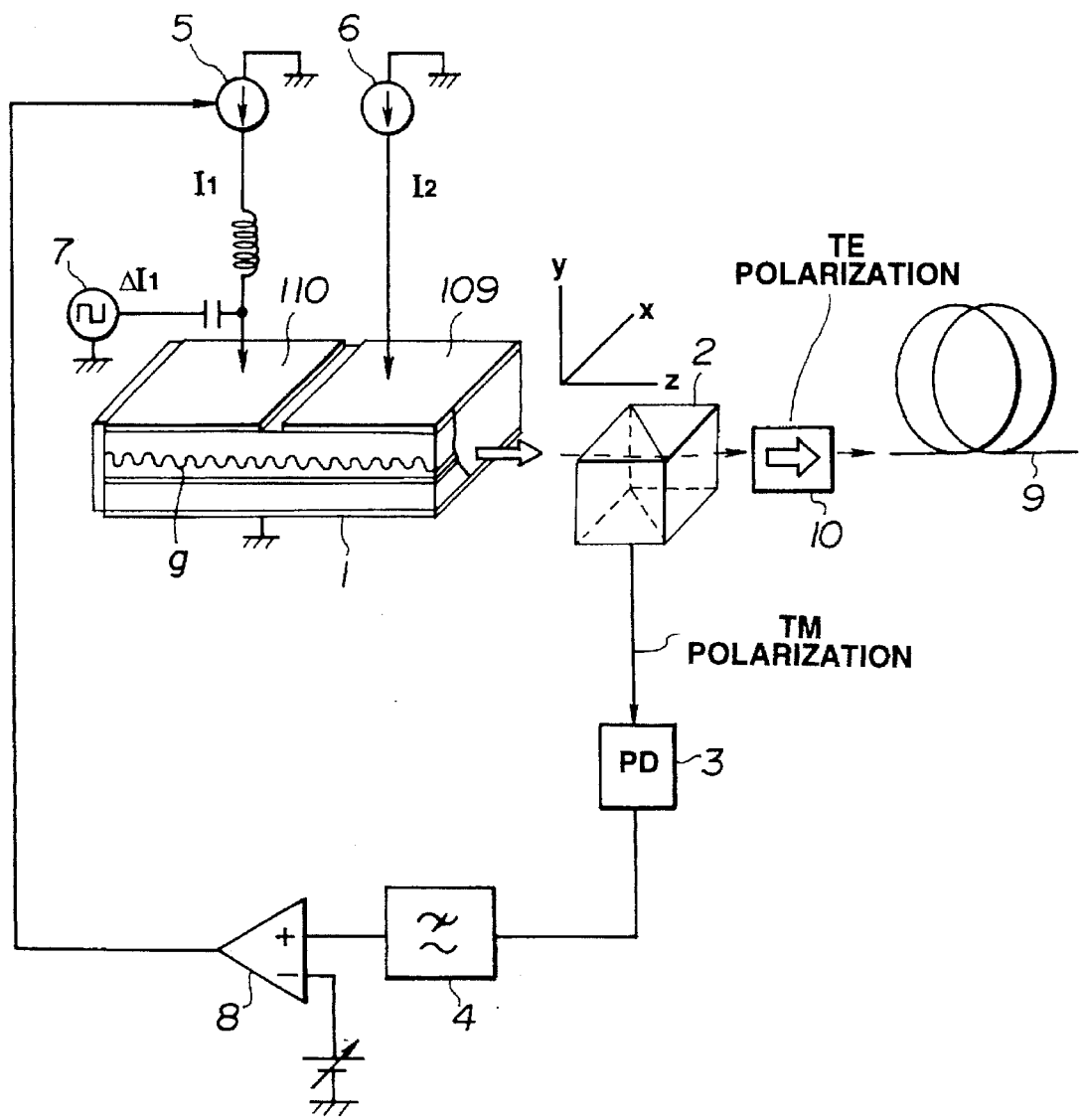
FIG. 9 is a view illustrating a first embodiment of a method for driving a semiconductor laser according to the present invention.
Figure 10:
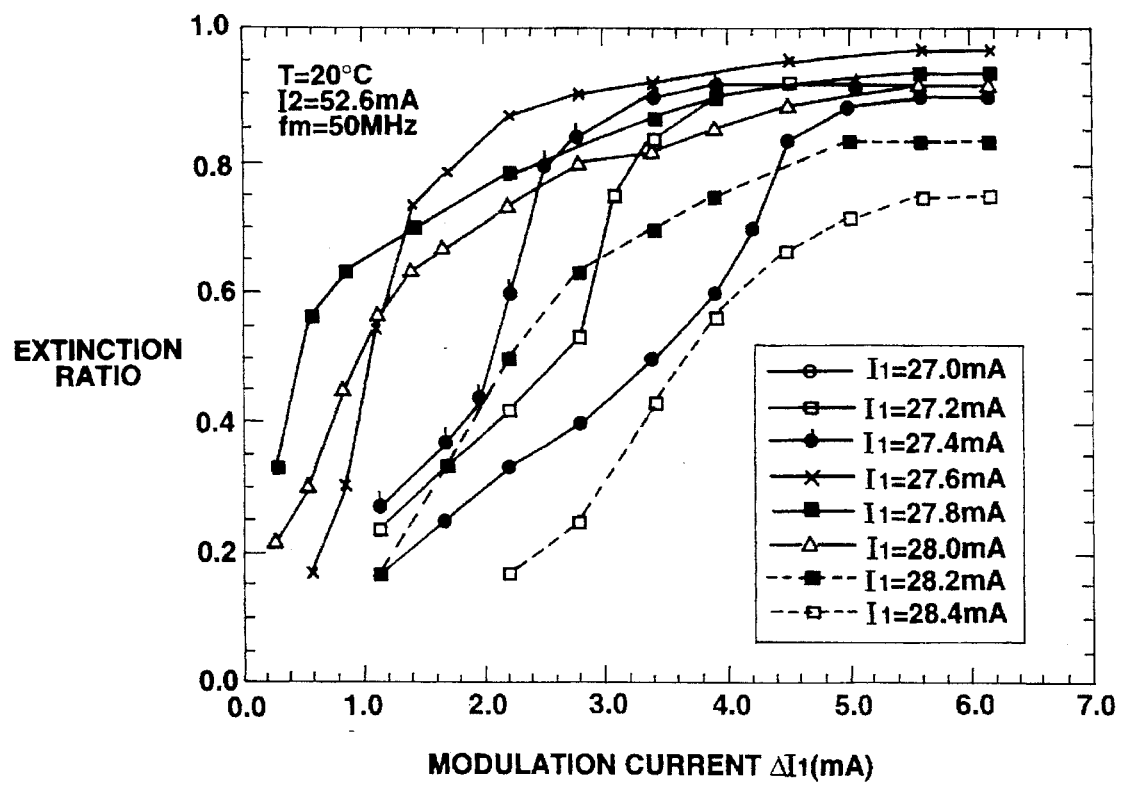
FIG. 10 is an illustration of the relationship between the amplitude of modulation current and the extinction ratio of oscillation polarization modulation.
Figure 13:
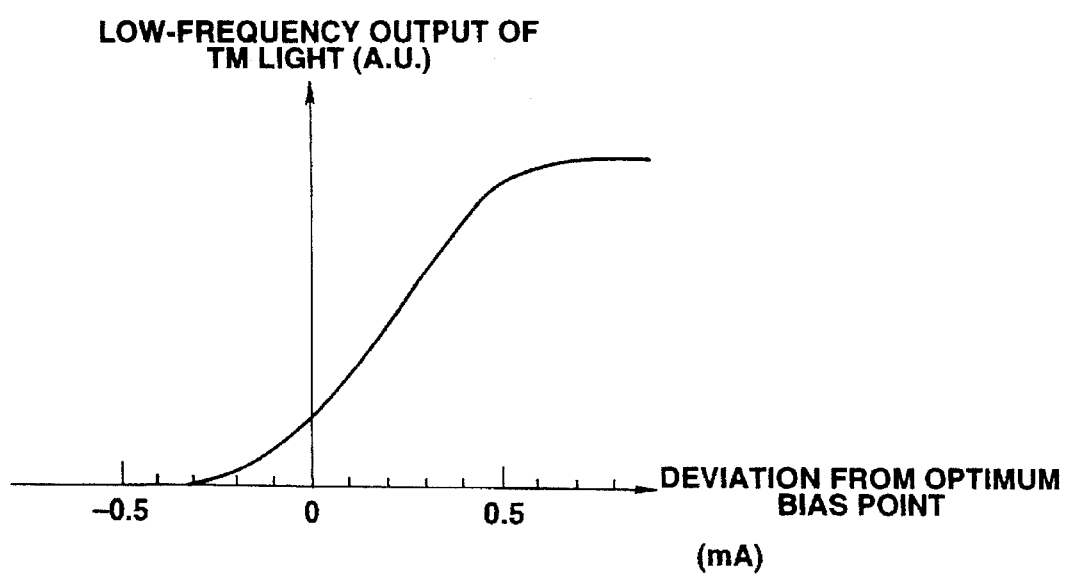
FIG. 13 is an illustration of the relationship between deviation from an optimum bias point and the intensity of light in TM mode.
Figure 41:
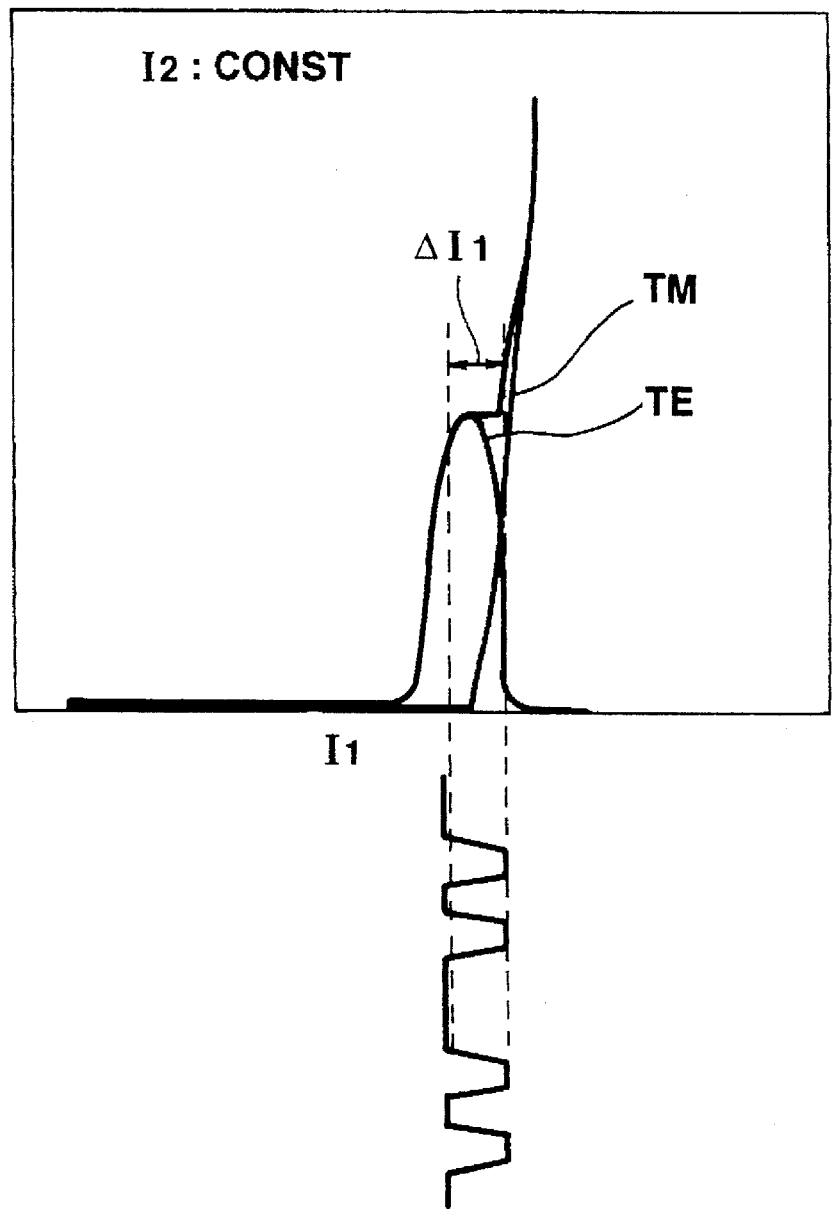
FIG. 41 is a graph illustrating current vs. light output characteristics of a semiconductor laser.
Figure 42:
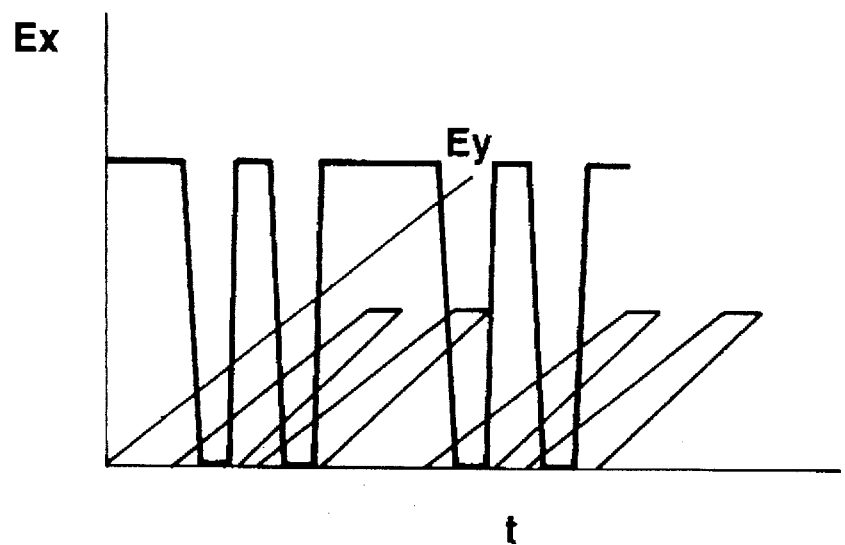
FIG. 42 is a graph illustrating a waveform of modulated output of a semiconductor laser.

The principle of this embodiment will be briefly described with reference to FIGS. 9 and 10. A digital signal of a minute amplitude is superposed on the bias current $I_1$ injected one electrode of the two-electrode DFB semiconductor laser 1, so that the polarization modulation is switched between the TE mode and the TM mode. The polarization modulation relates to techniques for modulating the polarization plane over time as illustrated in FIG. 42 in response to a square signal of $I_1$ using the phenomenon that the oscillation polarization mode is switched from TE polarization to TM polarization at a given bias point when $I_1$ is changed while the bias current $I_2$ is kept constant as illustrated in FIG. 41. FIG. 10 illustrates a graph in which the relationship between the amplitude of the modulation current and the extinction ratio for TE polarization light after transmitted through the polarization beam splitter 2 is plotted with a parameter of the bias current $I_1$ (the bias current $I_2$ is maintained at 52.6 mA). It can be seen from FIG. 10 that the extinction ratio is large even at a minimum modulation current amplitude when $I_2$=27.6 mA, and this point can be determined as optimum. As $I_2$ decreases from that point, a larger modulation current amplitude is needed to obtain the same extinction ratio. As $I_2$ increases from that point, a sufficient extinction ratio cannot be obtained even if the modulation current amplitude is increased. Thus, an optimum point can be said to exist for $I_1$, and this is because the extinction ratio varies depending on whether the bias point is closer to TE polarization region or TM polarization area. Therefore, a deviation amount of the bias point is monitored using one polarization mode of the modulated light (in this case, TM polarization mode) which is not used for optical transmission, and feedback control is performed based on that monitoring. As illustrated in FIG. 9, light from the laser 1 is divided into TE and TM modes by the polarization beam splitter (PBS) 2, and TM light is received by a photodiode 3. The bias current $I_1$ is controlled by a current source for driving the laser 1. As illustrated in FIG. 13, the monitoring signal decreases when the bias point shifts towards the TM polarization area, and increases when the bias point shifts towards the TE polarization area. Hence, the deviation amount can be detected by that signal, and a feedback control system can be built. By using the above driving method, the extinction ratio of TE light to be transmitted to the transmission line can be stabilized.

Figure 11B:
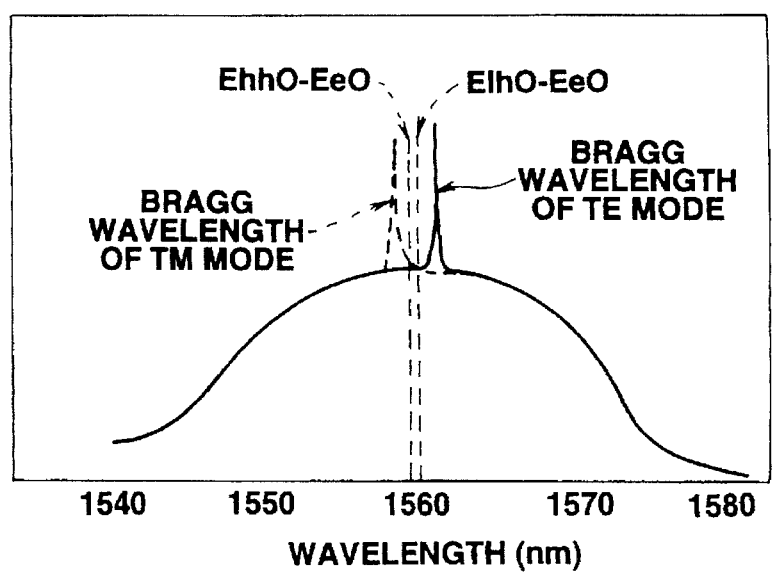
FIG. 11B is an illustration of characteristics of a semiconductor laser used in the first embodiment of the present invention.

Next, the operation of the laser will be described. FIG. 11B illustrates oscillation spectra observed when bias currents are injected through the electrodes 109 and 110 and a state immediately prior to laser oscillation is established. The wavelength corresponding to the transition energy between the level of light holes and the ground level of electrons ($E_{1h0}$–$E_{e0}$) is approximately 1.56 µm, and the wavelength corresponding to the transition energy between the level of heavy holes and the ground level of electrons ($E_{hh0}$–Ee0) is also approximately 1.56 µm. Oscillation spectra of TE mode (solid line) and TM mode (dotted line) are substantially identical with each other. The pitch of the diffraction grating g is set to 240 nm such that the distributed feedback wavelengths for both modes determined by the diffraction grating g fall close to the wavelength corresponding to the transition energy ($E_{lh0}$–Ee0). Thus, the Bragg wavelength of the TE mode becomes 1.562 µm and the Bragg wavelength of the TM mode becomes 1.558 µm.

Figure 12A:
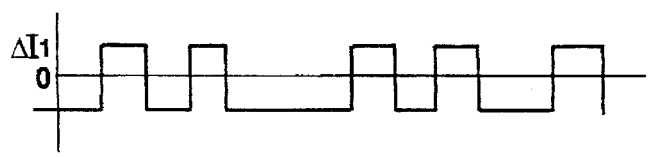
FIGS. 12A, 12B, 12C and 12D are respectively illustrations of the driving principle of a semiconductor laser used in the first embodiment.
Figure 12B:
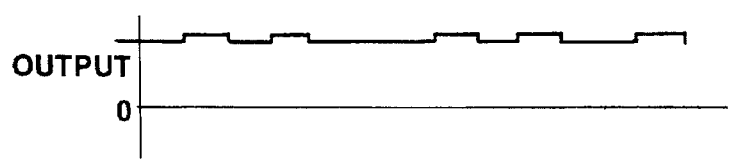
Figure 12C:
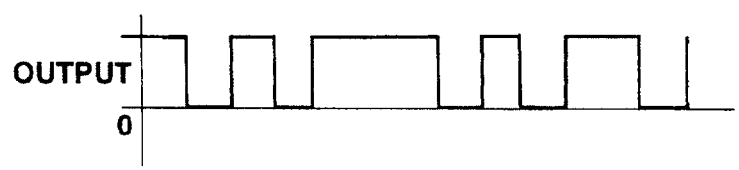
Figure 12D:
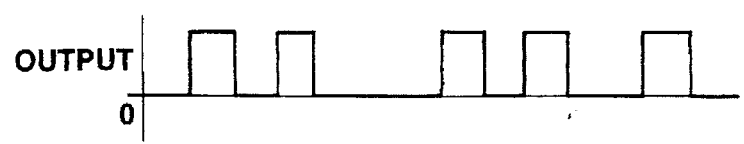

The switching between TE and TM modes takes place as described above when a DC bias current 52 mA is injected through the electrode 109 and a digital signal having the amplitude of 5 mA is superposed on a DC bias current 27.6 mA injected through the electrode 110. The laser light is divided into TE polarization and TM polarization by a polarization beam splitter 2 as shown in FIG. 9. FIGS. 12A through 12D illustrate waveforms of respective signals. FIG. 12A illustrates the waveform of a modulation current $\Delta I_1$ supplied from a current source 7, on which the digital signal is superposed, FIG. 12B illustrates the waveform of a light output emitted from the laser 1, FIG. 12C illustrates the waveform of a light output in the TE mode and FIG. 12D illustrates the waveform of a light output in the TM mode. The intensity of light emitted from the laser 1 remains substantially unchanged as illustrated in FIG. 12B, but its polarization mode is modulated. The output waveform of light having the TM mode is in-phase with the waveform of the modulation current $\Delta I_1$, but in an anti-phase relationship with the output waveform of light having the TE mode, as illustrated in FIGS. 12C and 12D. The modulation frequency ranges from 200 kHz to 5 GHz. Low-frequency range characteristic is not good due to heat influences.

Turning to FIG. 9, the output light from the light source 1, whose frequency and polarization modes are both modulated, is divided into TE light and TM light by the PBS 2. The TE light is coupled to an optical fiber 9 through an isolator 10 and transmitted through the optical fiber 9. The isolator 10 is constructed of a Faraday rotator which rotates the polarization plane of light by 45° and Glan-Thompson prisms between which the Faraday rotator is sandwiched. The isolator 10 not only prevents reflected light from the optical fiber 9 and the like from being incident on the semiconductor laser 1 and disturbing the oscillation, but also improves the extinction ratio between TE light and TM light using the Glan-Thompson prisms disposed on opposite sides of the isolator 10. Here, an extinction ratio between TE light and TM light of more than 20 dB can be obtained, and ASK transmission with the extinction ratio of such a value can be achieved.

On the other hand, TM light is detected by a photodetector or the photodiode 3 and monitored. When this signal is converted to a signal whose band is less than 10 kHz by a low pass filter (LPF) 4, components, which are modulated by high-speed signals of more than 100 Mbps, are averaged and its output voltage varies, as illustrated in FIG. 13, depending on the amount of deviation from an optimum bias current point. Therefore, when the output of the LPF 4 is compared with a reference voltage in a differential amplifier 8 and the amplifier output is fed back to a current source 5 for injecting a DC bias into the electrode 110, the bias current point is automatically stabilized. The output of the differential amplifier 8 may be fed back to a current source 6 for injecting a DC bias current into the electrode 109. The automatic stabilization is performed by a proportional plus integral (PI) control, and it is possible to reduce a change in the extinction ratio to less than 1% over a long time by optimizing gain or feedback ratio and integration time. Thus, a long-term error rate, which was the problem of a prior art polarization mode modulation transmission, can be further reduced.

Second Embodiment

Figure 14:
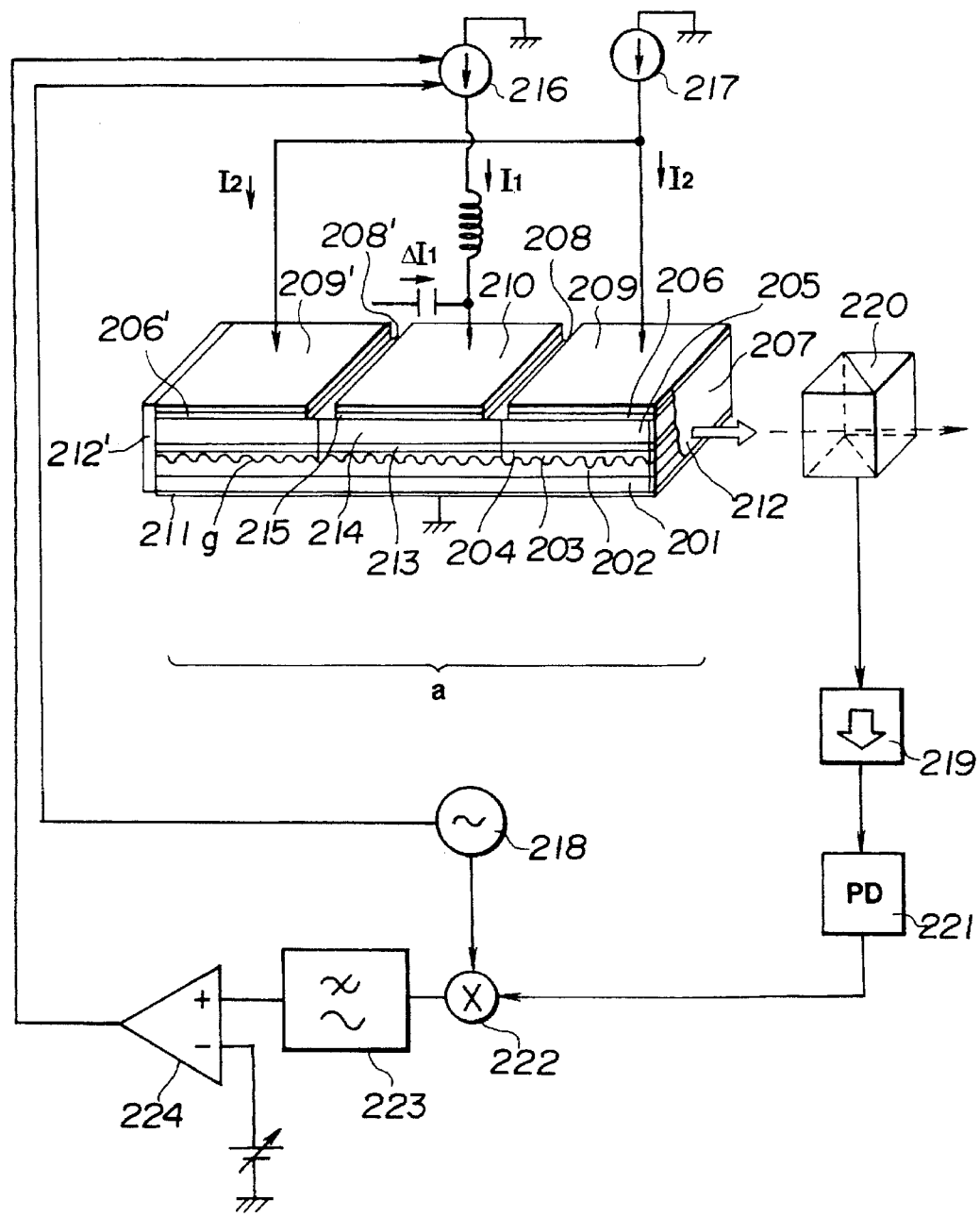
FIG. 14 is a second embodiment of an arrangement for driving a semiconductor laser according to the present invention.
Figure 15:
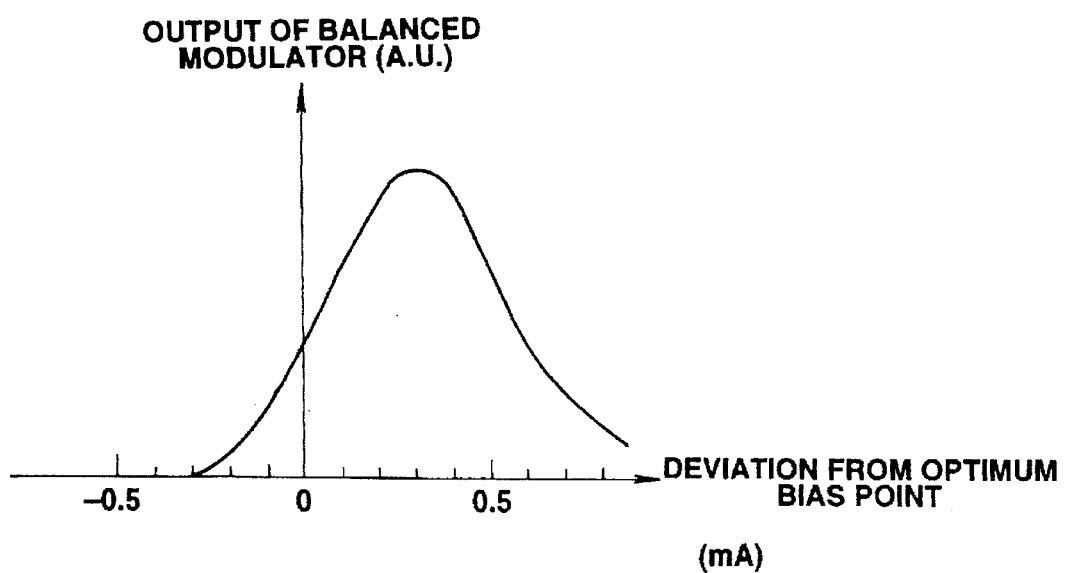
FIG. 15 is an illustration of the relationship between deviation from an optimum bias point and the output intensity of a balanced modulator used in the second embodiment.

A second embodiment of the present invention will be described with reference to FIGS. 14 and 15. A portion indicated by a in FIG. 14 is a semiconductor DFB laser which has a similar structure to that of the first embodiment, except that a three-electrode structure is adopted and a phase adjusting region, in which an active layer is removed, is provided under a center electrode 210. Thus, controlability of the polarization mode switching is further improved.

As shown in FIG. 14, the laser includes an n-type InP substrate 201, an n-type InP buffer layer 202 on which a diffraction grating g having a depth of 0.05 μm is formed, an n-type $In_{0.82}Ga_{0.18}As_{0.4}P_{0.5}$ lower light guide layer 203 having a thickness of 0.2 μm, an active layer 204 having a strained quantum well structure, a p-type InP clad layer 205, p-type $In_{0.53}Ga_{0.47}As$ contact layers 206 and 206', a high-resistance InP burying layer 207, electrode separation regions 208 and 208' which are respectively formed by removing the contact layer 206, electrodes 209 and 209' of Cr/AuZnNi/Au film which are located on the light emission sides through which a constant bias current $I_2$ is injected, an electrode 210 of Cr/AuZnNi/Au film through which a signal of superimposed current $(I_1+\Delta I_1)$ is injected, an electrode 211 of AuGeNi/Au film formed on the bottom of the substrate 201 and antireflection coatings 212 and 212' of SiO film which are deposited on end facets of the laser. The active layer 204 is constructed of ten pairs of intrinsic $In_{0.28}Ga_{0.72}As$ well layers (thickness: 10 nm) and intrinsic $In_{0.82}Ga_{0.18}As_{0.4}P_{0.6}$ barrier layers (thickness: 10 nm).

The phase adjusting region is formed by selectively re-growing an intrinsic $In_{0.82}Ga_{0.18}As_{0.4}P_{0.6}$ light guide layer 213, a p-type InP clad layer 214, a p-type $In_{0.53}Ga_{0.47}As$ contact layer 215 after etching the contact layer, the clad layer and the active layer. The pitch and the like of the grating g are the same as those of the first embodiment.

The operation of the above laser will be described. In a current driving method, the same DC bias current $I_2$ is injected into the electrodes 209 and 209' from a current source 217, and the DC bias current $I_1$ from a current source 216 and the modulation current $\Delta I_1$ are injected into the electrode 210.

The switching between TE and TM modes takes place as described above when $I_2$=60 mA, $I_1$=20 mA and the digital signal $\Delta I_1$=2 mA.

Compared with the first embodiment, gain remains unchanged and only phase is controlled in the phase adjusting region under the center electrode 210, and the phase is controlled by changing the refractive index due to only a change in carrier density with little influence of heat. Therefore, high efficiency and a wide modulation band can be obtained. That is, the amplitude of the modulation current $\Delta I_1$ is small (i.e., 2 mA) and the modulation band is widened to a range between 10 kHz and 5 GHz.

The stabilization of a bias current point is performed in the following manner.

The DC bias current $I_1$ is modulated by a sinusoidal wave from a sinusoidal wave generator 218. The sinusoidal wave has a frequency of 20 kHz and an amplitude of about 0.2 mA that does not cause polarization mode switching. TM light is picked out by a polarization beam splitter 220 and detected by a photodiode 221. The output of the photodiode 221 is mixed with the sinusoidal wave by a balanced modulator or multiplier 222. When this signal is transmitted through a low pass filter 223 whose cut-off frequency is 10 kHz, the output of the LPF 223 has a differential waveform of the output in FIG. 13, as shown in FIG. 15. In this waveform of FIG. 15, the slope characteristic on the left side of a peak is utilized. The output of the LPF 223 is compared with a reference voltage by a differential amplifier 224 and the amplifier output is fed back to the current source 216 of $I_1$. In this way, power fluctuation of TM polarization light can be detected more precisely than the first embodiment.

When an isolator 219 is disposed before the detection of TM light, noise in TE light can further be removed, and return light to the laser can be prevented. In the case when return light to the laser is reduced by inclining the photodiode 221 from a direction of light incident on the photodiode 221, for example, a polarizer can be used in place of the isolator.

Third Embodiment

A third embodiment of the present invention will be described with reference to FIGS. 16 and 17. In this embodiment, a laser is used as a light source for wavelength division multiplexing transmission, so the oscillation wavelength of a DFB laser described in the first or second embodiment is changed by controlling the DC bias currents and wavelength stabilization is also performed.

Figure 17:
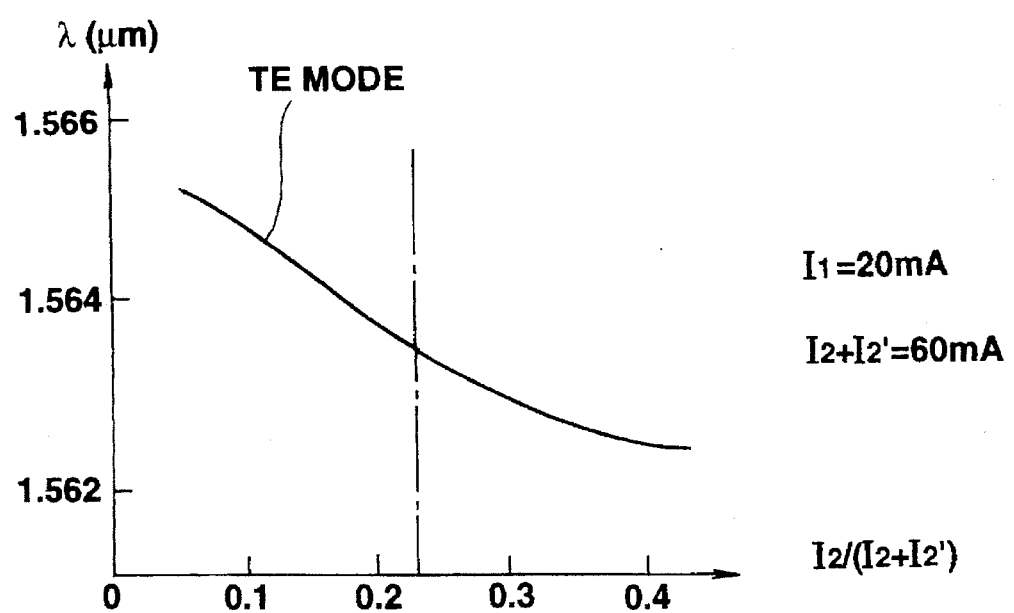
FIG. 17 is an illustration of a tuning characteristic of a tunable laser used in the second embodiment.

The wavelength tuning characteristic of a three-electrode DFB laser described in the second embodiment is illustrated in FIG. 17. Here, currents $I_2$ and $I_2'$ injected through the electrodes 209 and 209' are independently controlled, and the ratio therebetween is varied while the magnitude of $I_2+I_2'$ is maintained at a constant value of 60 mA. Further, the DC bias current $I_1$ is also maintained at 20 mA, and the measurement is conducted in a range where a single mode oscillation is effected in the TE mode. As illustrated in FIG. 17, when the current ratio is changed from 0.1 to 0.4, a tunable width of about 3.0 nm can be obtained with a single mode maintained.

Figure 16:
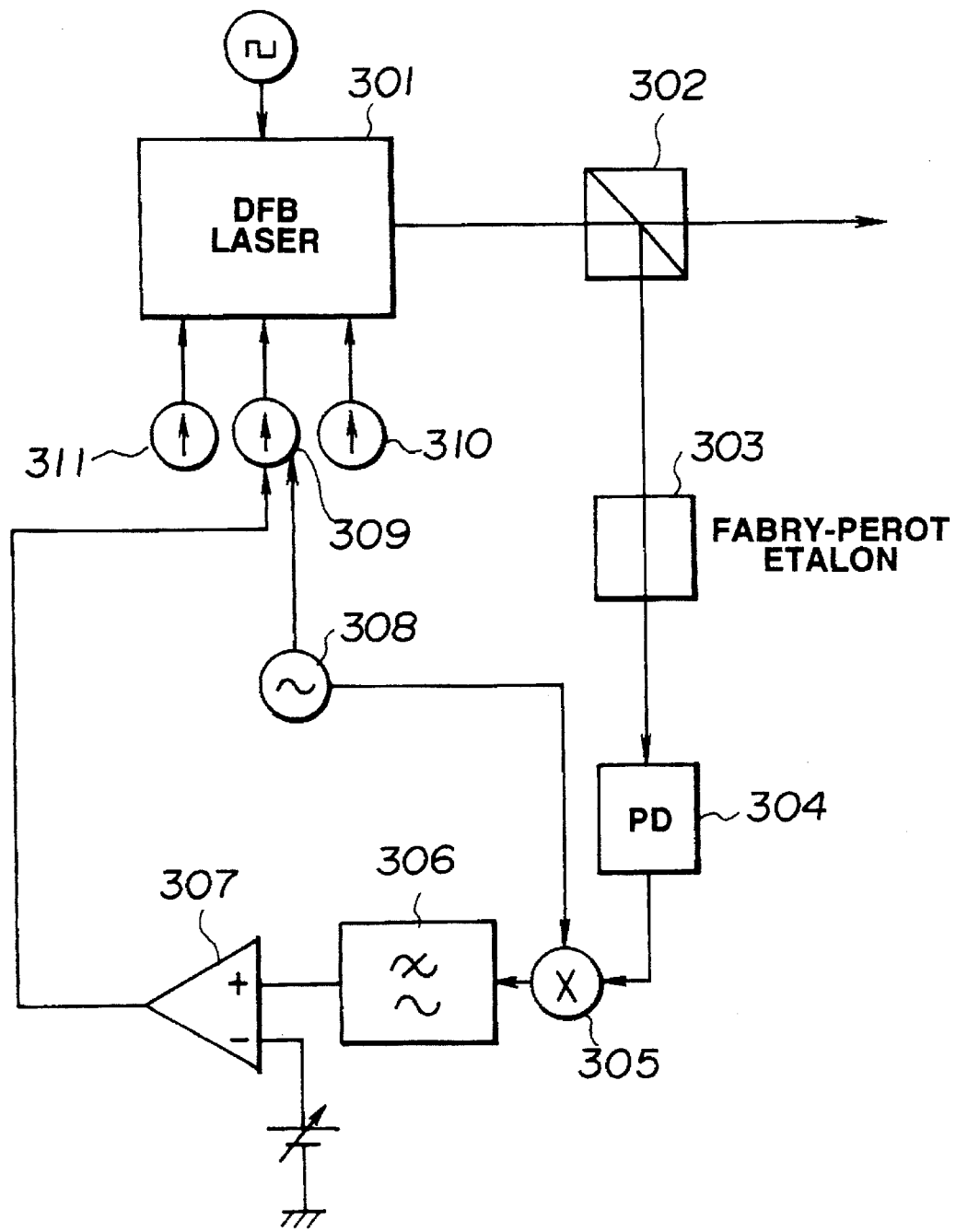
FIG. 16 is a third embodiment of an arrangement for driving a semiconductor laser according to the present invention.

The oscillation wavelength is stabilized by a system similar to that of the second embodiment, as shown in FIG. 16. In the third embodiment, however, light is transmitted through a wavelength discriminator for detecting a change in oscillation wavelength, such as a Fabry-Perot etalon 303, and the light is detected. When the oscillation wavelength is shorter than a transmission peak of the Fabry-Perot etalon 303, the oscillation wavelength of a DFB laser 301 is changed in anti-phase with the sinusoidal wave from a sinusoidal wave generator 308. The light signal is detected by a photodiode 304 and the output of a balanced modulator 305 is negative. When the oscillation wavelength is longer than the transmission peak of the Fabry-Perot etalon 303, the oscillation wavelength of the DFB laser 301 changes to an in-phase relationship with the wave from the sinusoidal wave generator 308. Similarly, the light signal is detected by the photodiode 304 and the output of the balanced modulator 305 is positive. When the oscillation wavelength is just at the transmission peak of the Fabry-Perot etalon 303, the oscillation wavelength of the DFB laser 301 changes to a double frequency with respect to the wave from the sinusoidal wave generator 308. The light signal is detected by the photodiode 304 and the output of the balanced modulator 305 is zero. Therefore, the oscillation wavelength of the DFB laser 301 is stabilized at the transmission peak of the Fabry-Perot etalon 303 by feedback control. In this embodiment, the Fabry-Perot etalon 303 has a free spectral range (FSR) of 10 GHz and a finesse of 10, and oscillation wavelengths of the DFB laser 301 can be arranged at intervals of 10 GHz (about 0.05 nm) with a wavelength stability of less than 0.1 GHz. By changing the design of the Fabry-Perot etalon 303, wavelength interval and stability can be set to desired values, respectively. The signal to noise (S/N) between the amount of wavelength fluctuation detected by the Fabry-Perot etalon 303 and the amount of fluctuation in light power of TM mode is over 10, and the S/N is sufficient to perform the feedback control.

Thus, when such wavelength stabilization and the bias point stabilization described in the second embodiment are simultaneously performed in parallel, an optimum method for driving a light source can be obtained for wavelength division multiplexing transmission. This is conducted by an arrangement in which structures of the second and the third embodiments are arranged in parallel, for example.

In this embodiment, the DFB laser 301 is modulated at a low frequency, similar to the second embodiment and the control is performed, but the control may be performed without such low-frequency-modulation, as in the first embodiment. In FIG. 16, reference numeral 302 is a polarization beam splitter, reference numeral 306 is a low pass filter, reference numeral 307 is a differential amplifier, reference numeral 309 is a current source which is provided for the center electrode of the DFB laser 301, and reference numerals 310 and 311 are current sources which are respectively provided for the electrodes on opposite sides of the DFB laser 301.

Fourth Embodiment

Figure 18:
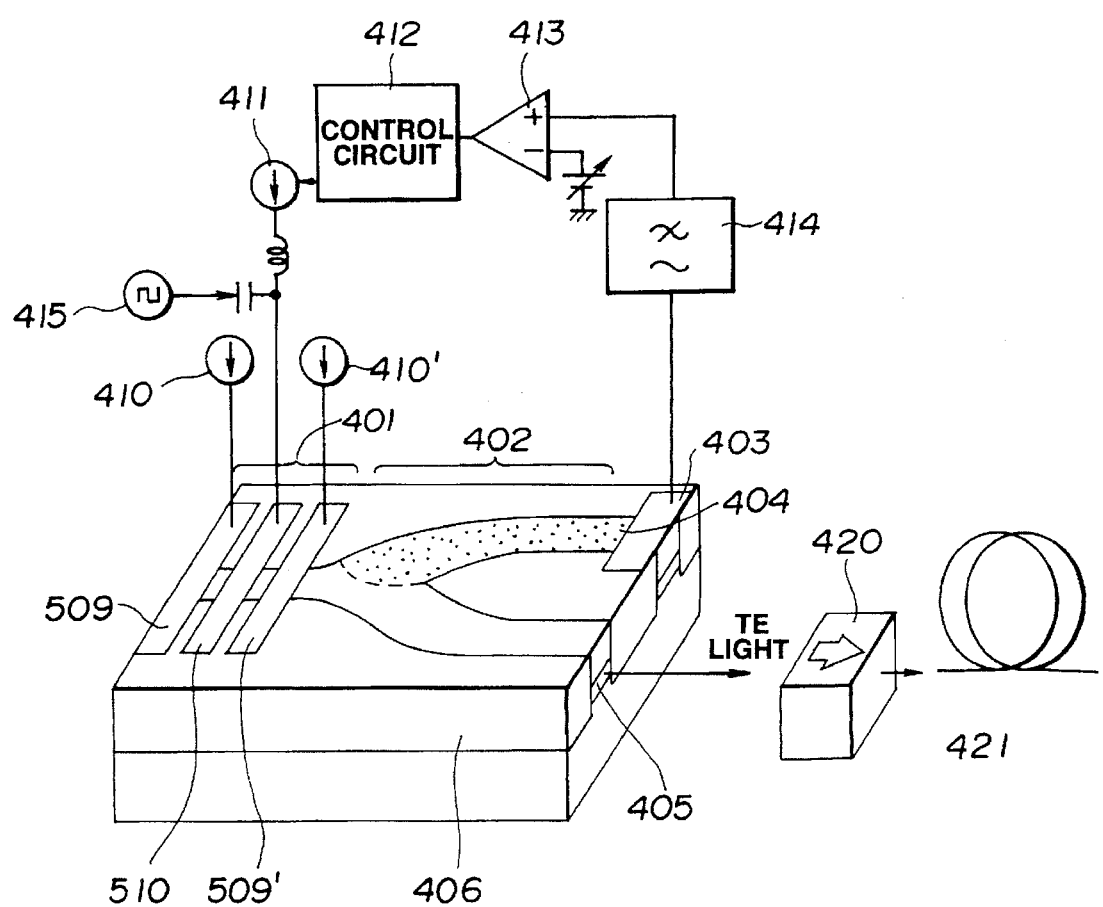
FIG. 18 is a view of a third embodiment of an arrangement for driving an integrated optical semiconductor apparatus according to the present invention.

A fourth embodiment of the present invention will be described with reference to FIGS. 18 and 19. FIG. 18 is a perspective view of an integrated semiconductor device, and FIG. 19 illustrates its cross section taken along its waveguide.

As shown in FIG. 18, a three-electrode DFB laser 401, a polarization mode splitter 402 of a Y-branching structure, and a photodetector 403 for detecting only one oscillation polarization mode are integrated. Waveguides are formed by a burying structure 406 of a high-resistance InP. In this embodiment, an SiN film is loaded only on a region 404 of the mode splitter 402 and annealing is conducted to perform mixing or disordering of a super-lattice layer in the waveguide thereat. The refractive index for TE polarization is decreased, while the refractive index for TM polarization is increased, by mixing the super-lattice layer (see Suzuki et al., "Polarization Mode Filter/Splitter Using Mixing of Semiconductor Super-Lattice", Report in Symp. of Japan Electron. Information Communication Academy, OQE 91–160, p. 55, 1991). As a result, only TM polarization light is propagated along the region 404 of the mode splitter 402. Thus, only light in TM mode is received by the photodetector 403, while light in TE mode is taken out through a light emission portion 405. Here, a value of 10 dB can be obtained as the extinction ratio between TE light and TM light appearing at the respective ends of the Y-branching polarization mode splitter 402. Naturally, light in TE mode may be received by the photodetector 403 and light in TM mode may be emitted. The polarization mode splitter 402 may be fabricated by loading ZnO and performing annealing and mixing due to diffusion of Zn. Or, a metal thin film may be loaded only on one waveguide to form an asymmetrical Y-branching, and light in TE mode may be propagated along a metal-loaded side since loss of TM mode is large on the metal-loaded side (see Y. Yamamoto et al., J. Q. Electron., QE-11, p. 729, 1975). With respect to the size of the device, the length of the DFB laser portion 401 is 800 μm, the length of the mode splitter portion 402 is about 2500 μm, the length of the photodetector portion 403 is 200 μm, and the total length is about 3500 μm.

The structure and the fabrication method of this embodiment of the present invention will be described with reference to FIG. 19.

Figure 19:
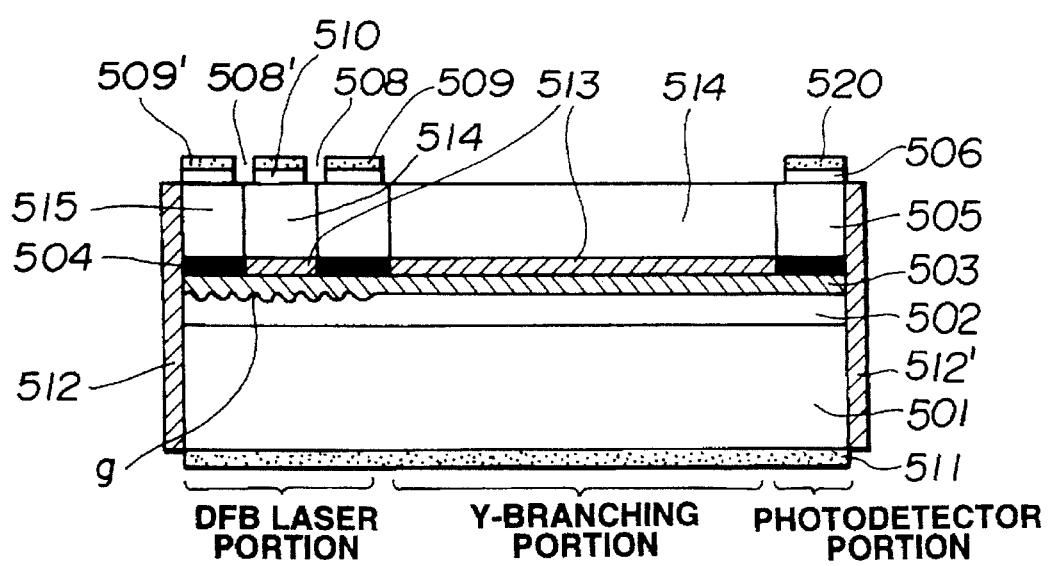
FIG. 19 is a cross-sectional view of a fourth embodiment of an integrated optical semiconductor apparatus according to the present invention taken along a waveguide direction.

As shown in FIG. 19, the device includes an n-type InP substrate 501, an n-type InP buffer layer 502 on which a diffraction grating g having a depth of 0.05 μm is formed, an n-type $In_{0.82}Ga_{0.18}As_{0.4}P_{0.6}$ lower light guide layer 503 having a thickness of 0.2 μm, an active layer 504 having a strained quantum well structure, a p-type InP clad layer 505, a p-type $In_{0.53}Ga_{0.47}As$ contact layer 506, electrode separation regions 508 and 508' which are respectively formed by removing the contact layer 506, p-side electrodes 509 and 509' of Cr/AuZnNi/Au film, an electrode 510 of Cr/AuZnNi/Au film through which a superimposed signal current is injected, an electrode 511 of AuGeNi/Au film formed on the bottom of the substrate 501, an electrode 520 of AuGeNi/Au film in the photodetector 403 and antireflection coatings 512 and 512' of SiO film which are deposited on opposite end surfaces. The active layer 504 is constructed of ten pairs of intrinsic $In_{0.28}Ga_{0.72}As$ well layers (thickness: 10 nm) and intrinsic $In_{0.82}Ga_{0.18}As_{0.4}P_{0.6}$ barrier layers (thickness: 10 nm). In the DFB laser portion 401 and the Y-branching waveguide portion 402, a light guide layer 513 of a super-lattice structure which consists of twenty pairs of intrinsic $In_{0.53}Ga_{0.47}As$ well layers (thickness: 3 nm) and intrinsic InP barrier layers (thickness: 5 nm), a p-type InP clad layer 514, a p-type $In_{0.59}Ga_{0.41}As_{0.9}P_{0.1}$ contact layer 515 (this contact layer is not layered in the Y-branching waveguide portion 402) are selectively re-grown after performing patterning and then etching the contact layer, the clad layer and the active layer. Then, after performing a Y-shaped patterning and etching down to the substrate 501, a high-resistance InP burying layer is formed to build the burying structure 406. The re-grown light guide layer 513 has an energy band gap which corresponds to a wavelength of about 1.03 μm, and hence this structure has small loss for light at the oscillation wavelength of 1.55 μm from the laser.

In the active layer 504 which is a tensile-strain multiple quantum well layer, transition energy (its corresponding wavelength: 1.56 μm) between the level of heavy holes in the valence band and the ground level of electrons in the conduction band ($E_{hh0}-E_{e0}$) is made equal to transition energy between the level of light holes in the valence band and the ground level of electrons in the conduction band ($E_{lh0}-E_{e0}$). Therefore, when compared with an ordinary DFB laser, an oscillation threshold for the TM mode (which corresponds to the transition energy ($E_{lh0}-E_{e0}$)) low and the oscillation polarization mode switching between TE and TM modes can be effectively performed. The pitch of the diffraction grating g of the DFB laser portion 401 is set to 240 nm such that the distributed feedback wavelengths for both modes determined by the diffraction grating g fall close to the wavelength corresponding to the transition energy ($E_{lh0}-E_{e0}$). Thus, the Bragg wavelength of the TE mode becomes 1.562 μm and the Bragg wavelength of the TM mode becomes 1.558 μm. Those are similar to the first embodiment.

The DFB laser portion 401 may have another structure, such as a structure in which no grating is formed in the region having no active layer (i.e., the region under the electrode 510), a structure in which a phase shift section is formed in the grating g, or a structure in which all regions have the active layer 504. Further, simply a two-electrode DFB laser may be adopted. Namely, any oscillation polarization mode selective semiconductor laser may be used.

The operation of this laser will now be described. The switching between TE and TM modes takes place as described above when each DC bias current of 26 mA is injected through the electrodes 509 and 509' by DC current sources 410 and 410' and a digital signal 415 having the amplitude of 2 mA is superposed on a DC bias current of 27.6 mA injected through the electrode 510 by a DC current source 411. The laser light is divided into TE polarization and TM polarization by the polarization mode splitter 402. The waveforms of respective signals are substantially the same as those of FIGS. 12A through 12D.

As shown in FIG. 18, the output light from the light source 401 is divided into TE light and TM light by the mode splitter 402. The TE light is coupled to an optical fiber 421 through an isolator 420 and transmitted through the optical fiber 421. The isolator 420 is constructed by a Faraday rotator and Glan-Thompson prisms between which the Faraday rotator is sandwiched. The isolator 420 not only prevents reflective light from the optical fiber 421 and the like from being incident on the semiconductor laser 401 and disturbing the oscillation, but also improves the extinction ratio between TE light and TM light using the Glan-Thompson prisms disposed on opposite sides of the isolator 420. Here, an extinction ratio between TE light and TM light of more than 20 dB can be obtained, and the ASK transmission with an extinction ratio of such a value can be achieved.

In comparison, TM light is detected by a photodiode 403 and is monitored. When this signal is changed to a signal whose band is less than 10 kHz by a low pass filter (LPF) 414, components, which are modulated by high-speed signals of more than 100 Mbps, are averaged and its output voltage varies, as shown in FIG. 13, depending on the amount of deviation from an optimum bias current point. Therefore, when the output of the LPF 414 is compared with a reference voltage by a differential amplifier 413 and then fed back to the current source 411 for injecting the DC bias into the electrode 510, through a control circuit 412, the bias current point is automatically stabilized. The output of the differential amplifier 413 may be fed back to the current source 410 or 410' for injecting the DC bias current into the electrode 509 or 509'. The automatic stabilization is performed by a proportional plus integral (PI) control of the control circuit 412, and it is possible to reduce a change in the extinction ratio to less than 1% over a long time by optimizing gain and integration time. Thus, similar to the first embodiment, a long-term error rate, which was a problem of a prior art polarization mode modulation transmission, can be further reduced.

Here, currents injected through the electrodes 509 and 509' can be independently controlled to change the oscillation wavelength. When the same current is injected through the electrodes 509 and 509' as described above, the wavelength is 1.562 μm. When the current ratio therebetween is varied from 1:1 to 1:9 while the total current magnitude is maintained at a constant value of 52 mA, the wavelength can be changed by about 3 nm to 1.565 μm.

Thus, an integrated semiconductor device of this embodiment becomes suitable for wavelength division multiplexing optical communications by using the above-discussed driving method.

Fifth Embodiment

Figure 20:
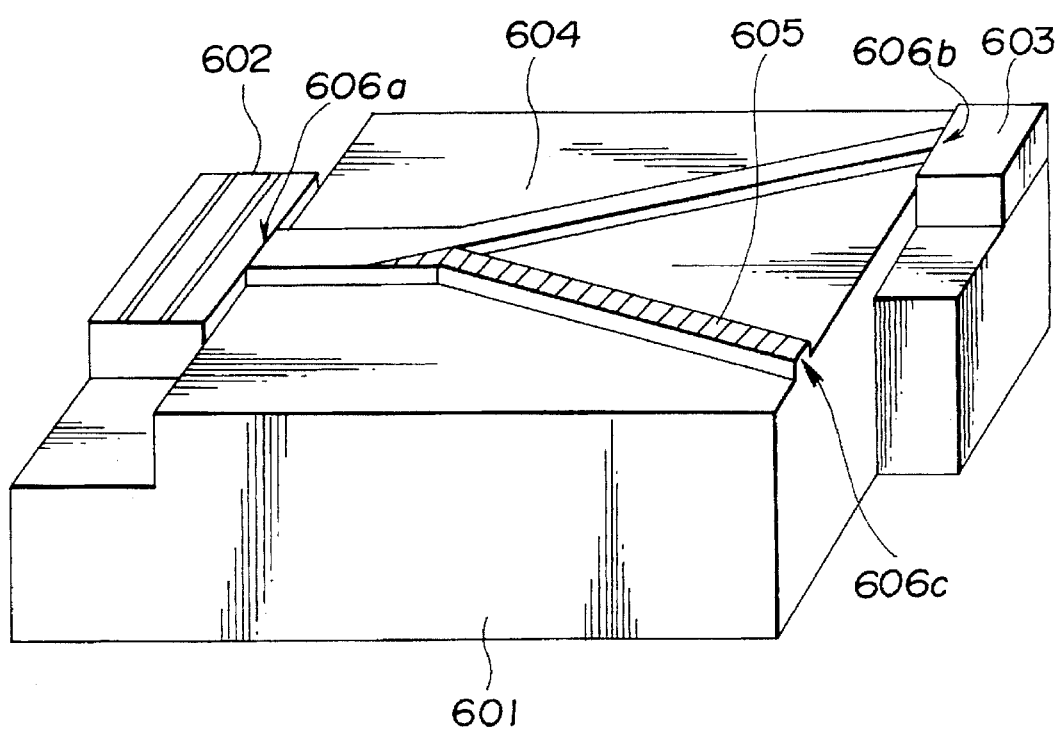
FIG. 20 is a perspective view of a fifth embodiment of a hybrid integrated optical semiconductor apparatus according to the present invention.

A fifth embodiment of the present invention will be described with reference to FIG. 20. In a hybrid apparatus shown in FIG. 20, a Y-branching type polarization mode splitter 604 is formed on a LiNbO$_3$ substrate 601, and a three-electrode DFB laser 602 and a photodiode 603 are fixed to the substrate 601 by adhesive. In the mode splitter 604, a metal thin film 605 is loaded on one-side waveguide of the Y-branching mode splitter 604 such that a TE mode can be propagated along the waveguide on this side. A TM mode is propagated along the other waveguide, and detected by the photodetector 603. The DFB laser 602 has the same structure as that of the DFB laser portion of the fourth embodiment. Polarization mode modulation can be performed by applying a modulation signal having the amplitude of 2 mA to the center electrode. Antireflection coatings are respectively provided on optical coupling portions 606a and 606b and an emission end 606c of TE mode light. The driving method and others of this embodiment are the same as those of the fourth embodiment.

Sixth Embodiment

Figure 21:
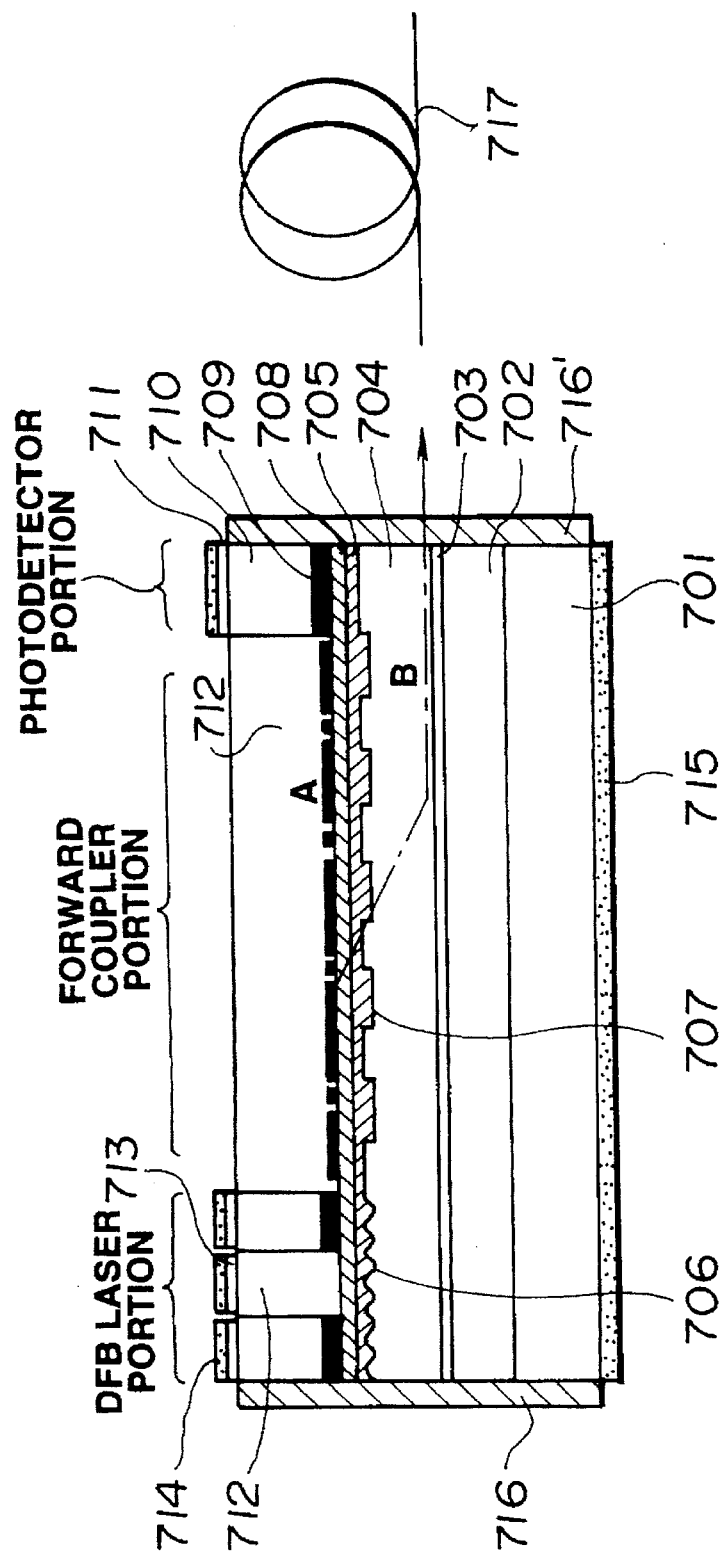
FIG. 21 is a cross-sectional view of a sixth embodiment of an integrated optical semiconductor apparatus according to the present invention taken along a waveguide direction.
Figure 22:
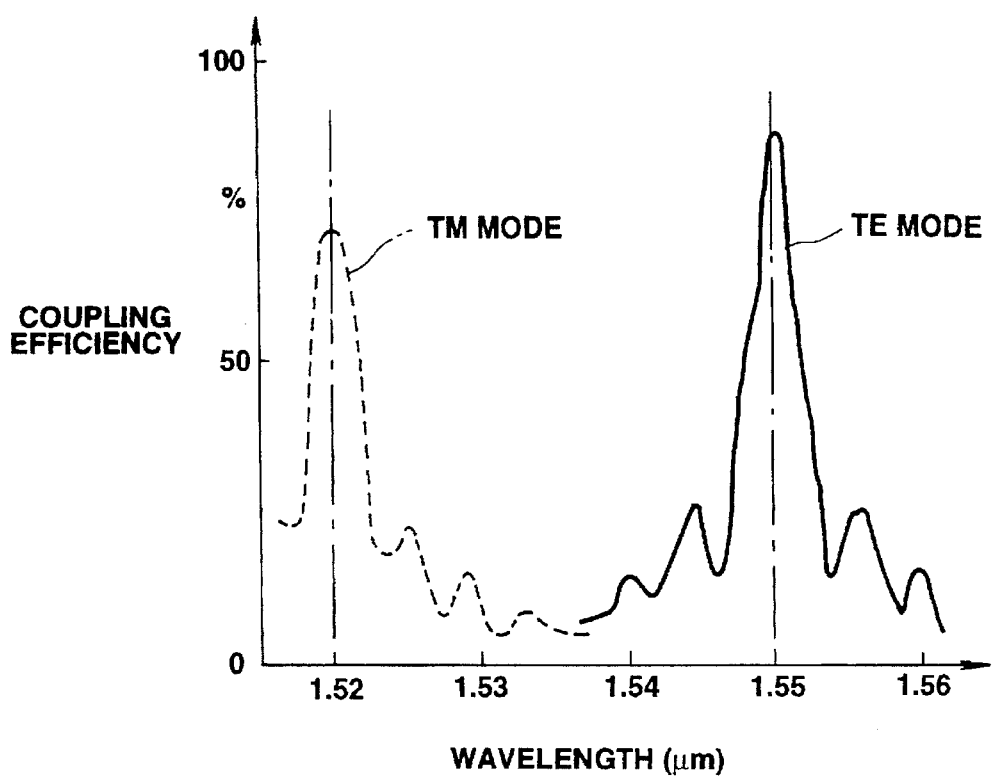
FIG. 22 is an illustration of characteristics of a forward coupler portion used in the sixth embodiment.

A sixth embodiment of the present invention will be described with reference to FIGS. 21 and 22. FIG. 21 is a cross section view of an integrated semiconductor device taken along its waveguide, in which a vertical type forward coupler is used as a polarization mode splitter and is monolithically integrated on a semiconductor substrate.

The structure and the fabrication method of this embodiment of the present invention will be described with reference to FIG. 21.

As shown in FIG. 21, an n-type InP buffer layer 702, an n-type InGaAsP lower waveguide layer 703 having a band gap wavelength of 1.1 μm, and an n-type InP clad layer 704 are consecutively layered on an n-type InP substrate 701 during the first growth. A diffraction grating 706 with a fine pitch of 240 nm is formed on the clad layer 704 in a DFB laser portion, and a diffraction grating 707 with a rough pitch of 14.5 µm on the clad layer 704 is formed in a forward coupler portion. No diffraction grating is formed in a photodetector portion. An n-type InGaAsP light guide layer 705 having a band gap wavelength of 1.1 µm, an n-type InGaAsP upper waveguide layer 708 having a band gap wavelength of 1.3 µm, an active layer 709 having a strained quantum well structure, a p-type InP clad layer 710 and an $In_{0.53}Ga_{0.47}As$ contact layer 711 are consecutively layered on the clad layer 704 during the second growth. The active layer 709 is constructed of ten pairs of intrinsic $In_{0.28}Ga_{0.72}As$ well layers (thickness: 10 nm) and intrinsic $In_{0.82}Ga_{0.18}As_{0.4}P_{0.5}$ barrier layers (thickness: 10 nm).

Then, in the center portion of the DFB laser portion and the forward coupler portion, etching is conducted down to the upper waveguide layer 708 to remove the active layer 709, and a p-type InP clad layer 712 and an $In_{0.53}Ga_{0.47}As$ contact layer 713 are layered during the third selective growth. The waveguide, whose width is 2.5 µm, is formed by a burying structure using a high-resistance InP (not shown).

Then, p-side and n-side electrodes 714 and 715 are formed. In the DFB laser portion, the p-side electrode 714 is formed into a three-electrode structure. In the forward coupler portion, electrode and contact layers are removed. After the device is cleaved, antireflection coatings 716 and 716' are deposited on opposite end surfaces. With respect to the size of the device, the length of the DFB laser portion is 800 µm, the length of the forward coupler portion is 1000 µm, and the length of the photodetector portion is 200 µm.

The operation of this embodiment will now be described. The oscillation polarization switching between TE and TM modes takes place in the DFB laser portion when a modulation signal having the amplitude of 2 mA is applied to the center electrode, similar to the fourth embodiment. In the forward coupler portion, a portion of light A propagated in the upper waveguide layer 708 is coupled to the lower waveguide layer 703 (light B), and the light B is taken out. FIG. 22 illustrates coupling characteristic from the upper waveguide 708 to the lower waveguide 703 in the forward coupler portion which acts as a wavelength discriminator. As shown in FIG. 22, the filtering characteristic for the TE mode exhibits a center wavelength of 1.55 µm which is the oscillation wavelength of the laser. Its half width is about 5 nm. On the other hand, the filtering characteristic for the TM mode exhibits a center wavelength of 1.52 µm which is about 30 nm shorter than 1.55 µm. Therefore, only the TE mode of the laser oscillation light at 1.55 µm is propagated through the lower waveguide 703 and taken out. The TM mode thereof is propagated along the upper waveguide 708 and detected by the photodetector.

The light taken out from the lower waveguide 703 is only the TE mode of the polarization-modulated light, and thus is ASK signal. The light in TE mode is coupled to an optical fiber 717. The rear end of the photodetector may be damaged by etching or the like to cut TM light which is propagated through the upper waveguide 708. Thus, leaking light is scattered. Further, an isolator may be inserted before the optical fiber 717.

The driving and other methods are the same as those of the fourth embodiment. The DFB laser has a wavelength tunable characteristic of a width of about 3 nm, as described in the fourth embodiment. In this wavelength range, the coupling efficiency of TE light to the lower waveguide 703 decreases only about 25%.

In the forward coupler portion, the center wavelength of filtering can be changed by applying an electric field thereto. Therefore, if the center filtering wavelength is shifted corresponding to a change in the laser oscillation wavelength, the coupling efficiency can be kept unchanged.

Seventh Embodiment

Figure 23:
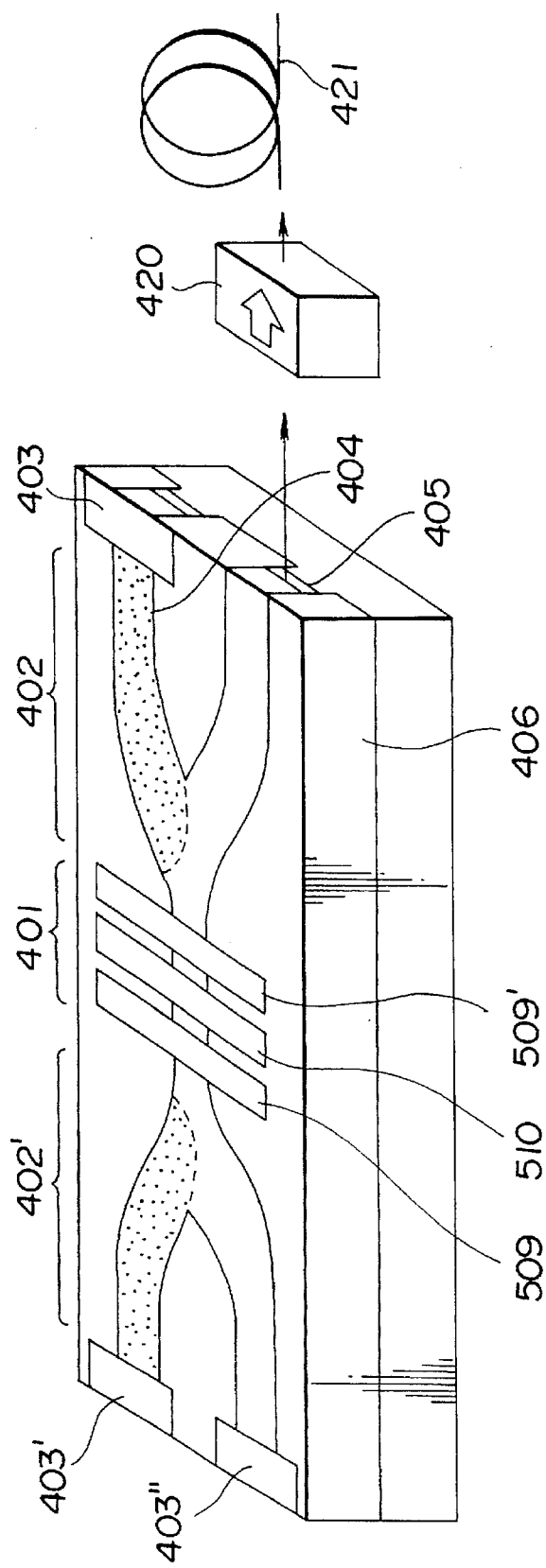
FIG. 23 is a perspective view of a seventh embodiment of an integrated optical semiconductor apparatus according to the present invention.

A seventh embodiment of the present invention will be described with reference to FIG. 23. In this embodiment, two Y-branching polarization mode splitters 402 and 402' described in the fourth embodiment are integrated on both emission end sides of the DFB laser 401. Two photodetectors 403' and 403" are arranged in the mode splitter 402' on one side to detect both TE light and TM light. In the mode splitter 402 on the other side, only one photodetector 403 is arranged to detect only TM light.

Respective outputs of the photodetectors may be used for stabilizing the extinction ratio as in the fourth embodiment, or for automatic power control (APC) to stabilize the intensity of output light. This embodiment is effective when TE light is needed since only TM light is insufficient to control the extinction ratio.

The light to be taken out is TE light output from the mode splitter 402 on one side, and this light is coupled to the optical fiber 421 through the isolator 420.

Those polarization mode splitters 402 and 402' may be hybrid types as described in the fifth embodiment, vertical type forward couplers as described in the sixth embodiment or a combination of these elements.

In integrated semiconductor apparatus of the fourth to seventh embodiments, a semiconductor optical amplifier may be integrated at the emission end to compensate for light power taken out from the mode splitter.

Eighth Embodiment

Figure 24:
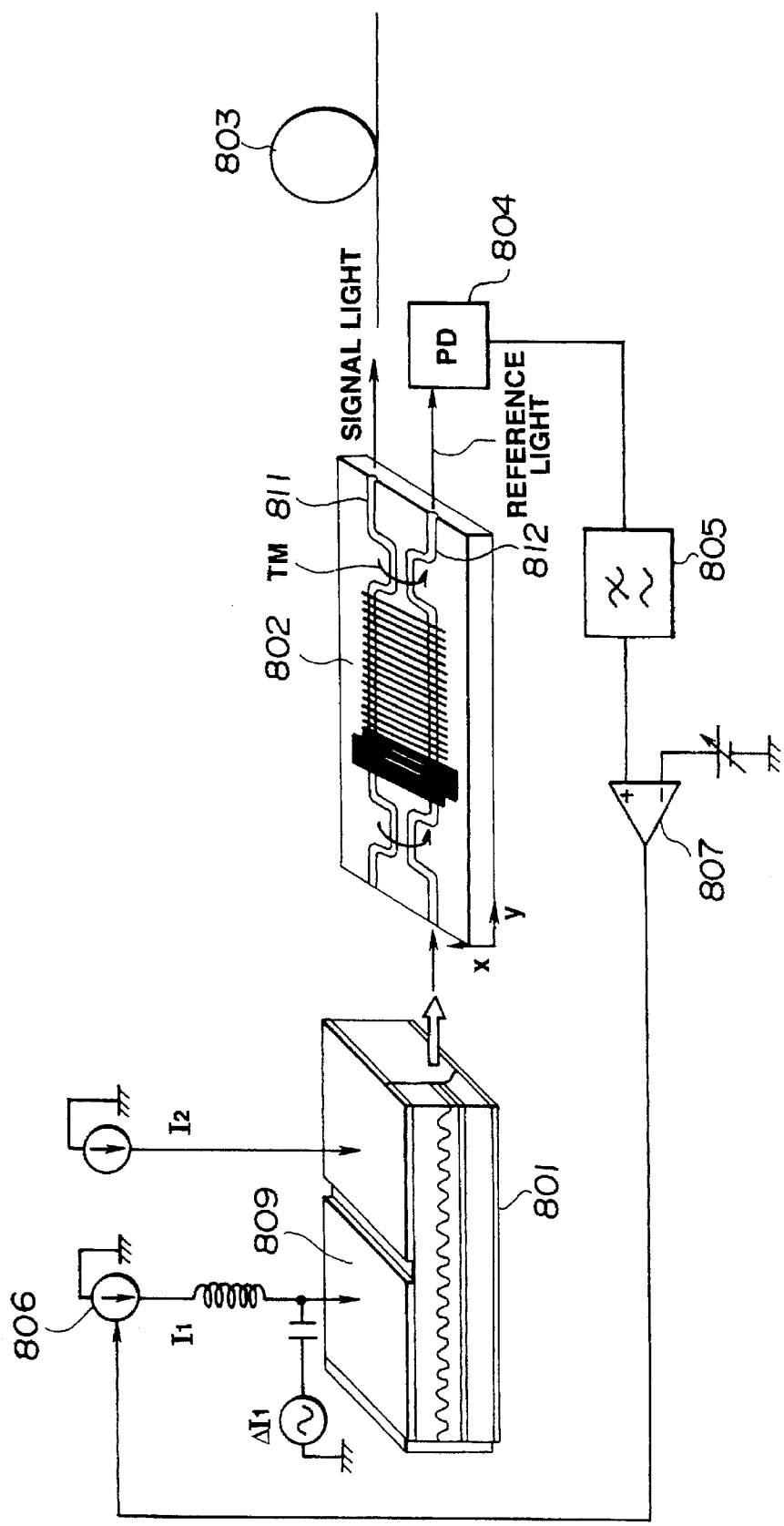
FIG. 24 is a view of an eighth embodiment of an arrangement for driving a semiconductor laser according to the present invention.

An eighth embodiment of the present invention will be described with reference to FIG. 24. In FIG. 24, reference numeral 801 is a DFB laser that acts as a light souce, and reference numeral 802 is a polarization insensitive AO wavelength filter for performing spatial wavelength separation. In the AO filter 802, a light wave at a predetermined wavelength of input light 810 is branched into a waveguide 811 and light waves of other wavelengths are branched into a waveguide 812. The FWHM (full-width at half maximum) of transmission bandwidth of the filter 802 is 2.6 nm. Further, reference numeral 803 is an optical fiber for transmitting a light signal therethrough, reference numeral 804 is a photodiode for receiving the light wave (reference light) branched by the AO filter 802, reference numeral 805 is a low pass filter, reference numeral 806 is an electric source for driving the DFB laser 801, and reference numeral 807 is a differential amplifier.

In the DFB laser 801 of this embodiment, when the bias current $I_1$ injected through an electrode 809 fluctuates, a desirable extinction ratio cannot be obtained even if the amplitude of the modulation current $\Delta I_1$ is increased. Therefore, a light wave, which is not be used as a light signal, is separated and detected using a PBS or the like, and feedback control is performed by using that detected amount. This method is described in the above embodiments. In this embodiment for obtaining a further high extinction ratio, the transmission center wavelength of the wavelength filter 802 is set to the wavelength of the TE mode (or TM mode) from the DFB laser 801 which is to be signal light, and those modes are separately guided into the waveguides 811 and 812. Out of the branched light waves, the signal light of the TE mode (or the TM mode) introduced into the waveguide 811 is coupled to the optical fiber 803 and transmitted therethrough. On the other hand, the light wave of the TM mode (or the TE mode) introduced into the waveguide 812 is received by the photodiode 804. A low frequency component is taken out from the thus-obtained signal light by the low pass filter 805, and this signal is fed back to the laser driving electric source 806 through the differential amplifier 807. Thus, a desirable drive of the DFB laser 801 can be achieved with a stable extinction ratio.

Ninth Embodiment

Figure 25:
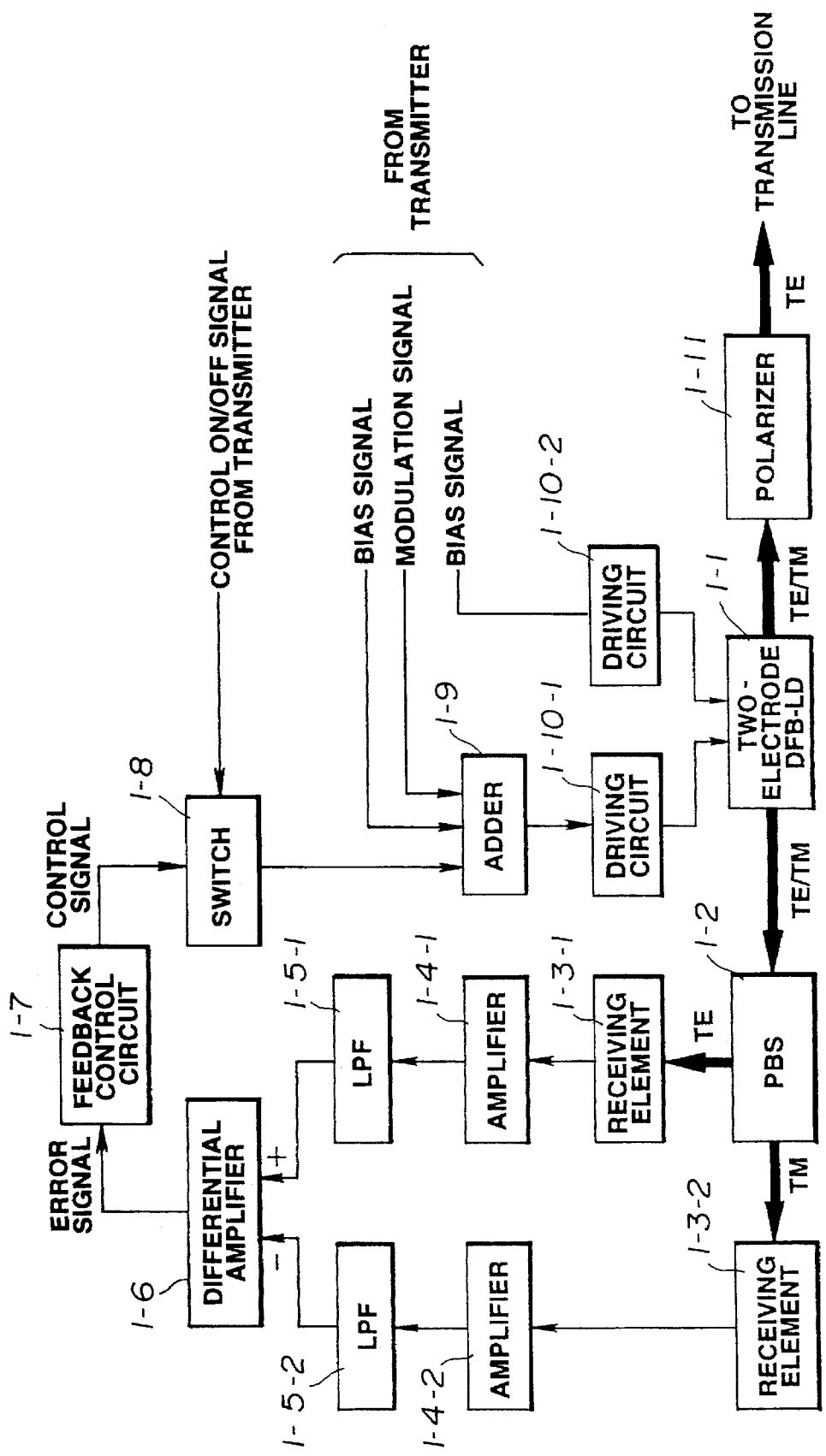
FIG. 25 is a block diagram of a ninth embodiment of a system for controlling a light source, whose oscillation light is directly polarization-modulated, according to the present invention.

A ninth embodiment of the present invention will be described with reference to FIG. 25. FIG. 25 illustrates a ninth embodiment of a method for directly controlling a polarization modulation selective light source. As shown in FIG. 25, a main part includes a two-electrode DFB-LD 1-1, a polarization beam splitter (PBS) 1-2, light receiving elements 1-3-1 and 1-3-2, amplifiers 1-4-1 and 1-4-2, low pass filters (LPFs) 1-5-1 and 1-5-2, a differential amplifier 1-6, a feedback control circuit 1-7, a switch 1-8, an adder 1-9, driving circuits 1-10-1 and 1-10-2, and a polarizer 1-11.

The two-electrode DFB-LD 1-1 is a conventional semiconductor laser. The two-electrode DFB-LD 1-1 emits light from its two opposite end surfaces. The light emitted from the front end surface is input into the polarizer 1-11 and only TE polarization is picked out. The light emitted from the rear end surface is used to control the bias current point. The light emitted from the rear end surface is separated into TE polarization and TM polarization by the PBS 1-2. The separated TE polarization is converted to an electric signal by the light receiving element 1-3-1, and the electric signal is amplified by the amplifier 1-4-1. After a low frequency component of the signal is extracted by the LPF 1-5-1, the extracted signal is input into a positive input terminal of the differential amplifier 1-6. The light in TM mode is treated by the light receiving element 1-3-2, the amplifier 1-4-2 and the LPF 1-5-2 in a similar manner.

The thus-treated signal is input into a negative input terminal of the differential amplifier 1-6. The differential amplifier 1-6 amplifies a difference between the two input signals. Its output is positive when the output of the LPF 1-5-1 is larger than the output of the LPF 1-5-2, and is negative when the output of the LPF 1-5-1 is smaller than the output of the LPF 1-5-2. The output of the differential amplifier 1-6 becomes an error signal in this control system.

The feedback control circuit 1-7 generates a control signal using the error signal from the differential amplifier 1-6. As a feedback control system, a well-known PIP control is preferably used. The output of the feedback control circuit 1-7, i.e., the control signal of this control system, is input into the adder 1-9 through the switch 1-8. The switch 1-8 controls ON/OFF switching in response to a control ON/OFF signal supplied from a transmitter. A bias signal and a modulation signal from the transmitter and the control signal are input into the adder 1-9. The adder 1-9 adds those three signals, and its output is input into the driving circuit 1-10-1. The driving circuit 1-10-1 ouputs a current corresponding to the signals input thereinto, and the current is supplied to the rear-side electrode of the two-electrode DFB-LD 1-1.

The driving circuit 1-10-2 outputs a current corresponding to the bias signal input from the transmitter, and the current is supplied to the front-side electrode of the two-electrode DFB-LD 1-1. In the above description, the transmitter is an apparatus into which the control system of this embodiment is incorporated.

Figure 26:
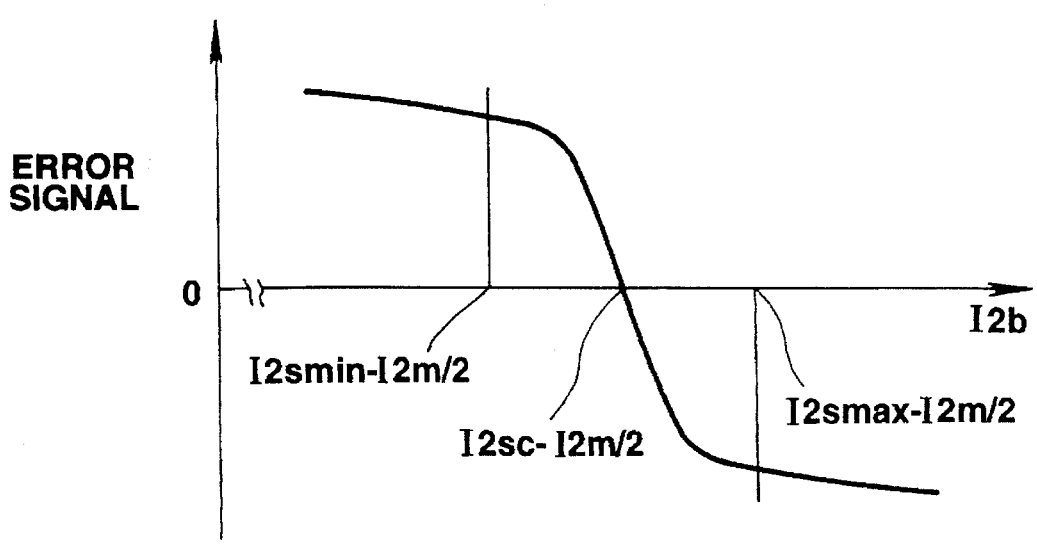
FIG. 26 is an illustration of the to relationship between $I_{2b}$ and an error signal.

FIG. 26 illustrates the relationship between the bias component $I_{2b}$ of the current injected into the rear electrode of the DFB-LD 1-1 and the error signal. A portion near the switching region is expanded in FIG. 26.

The operation of this embodiment noq will be described. The bias toward the switching region and the polarization modulation are the same as those of the prior art example described above.

Cut-off frequencies of the LPFs 1-5-1 and 1-5-2 are set sufficiently lower than the frequency of the modulation signal. Therefore, signals can be obtained from both the LPFs 1-5-1 and 1-5-2 when the modulation state is good (i.e., when the switching between TE polarization and TM polarization is conducted in accord with the modulation signal and the light output of the light source is as illustrated in FIG. 4A). When $I_{2b}+I_{2m}/2$ is coincident with the center $I_{2sc}$ of the switching region, those two signals from the LPFs 1-5-1 and 1-5-2 are approximately equal to each other. In this case, the duty of the modulation signal is set to 50%.

If the oscillation characteristic of the two-electrode DFB LD 1-1 varies due to a change in temperature and the like and values $I_{2sc}$, $I_{2smin}$ and $I_{2smax}$ of current in the switching region are shifted, the modulation state will be degraded. When relations of $I_{2b} < I_{2smin}$ and $I_{2b} > I_{2smax} - I_{2m}$ are satisfied, the degradation of the modulation state is not so large, but if not, the modulation state will be greatly degraded as illustrated in FIGS. 4B and 4C. Then, the difference between the output signals of the LPFs 1-5-1 and 1-5-2 or the output of the differential amplifier 1-6 becomes large.

The output signal or error signal of the differential amplifier 1-6 is a zero-cross signal that is zero at $I_{2b}=I_{2sc}-I_{2m}/2$. Therefore, $I_{2sc}+I_{2m}/2$ can be brought to $I_{2sc}$ by performing feedback control using that signal as the error signal. Thus, the modulation state (typically, a difference between light intensities in two polarization modes, and the light intensity may be taken as an averaged light intensity, a peak light intensity or the like) can be maintained in a favorable state as illustrated in FIG. 4A. The feedback control is initiated by ON-controlling the switch 1-8, after $I_{1b}$ and $I_{2b}$ are set to switching points. Further, deviations of $I_{1b}$ and $I_{2b}$ from the switching points at the setting time can be automatically compensated for by the feedback control, so that tolerance for that initial setting becomes moderate.

Tenth Embodiment

Figure 27:
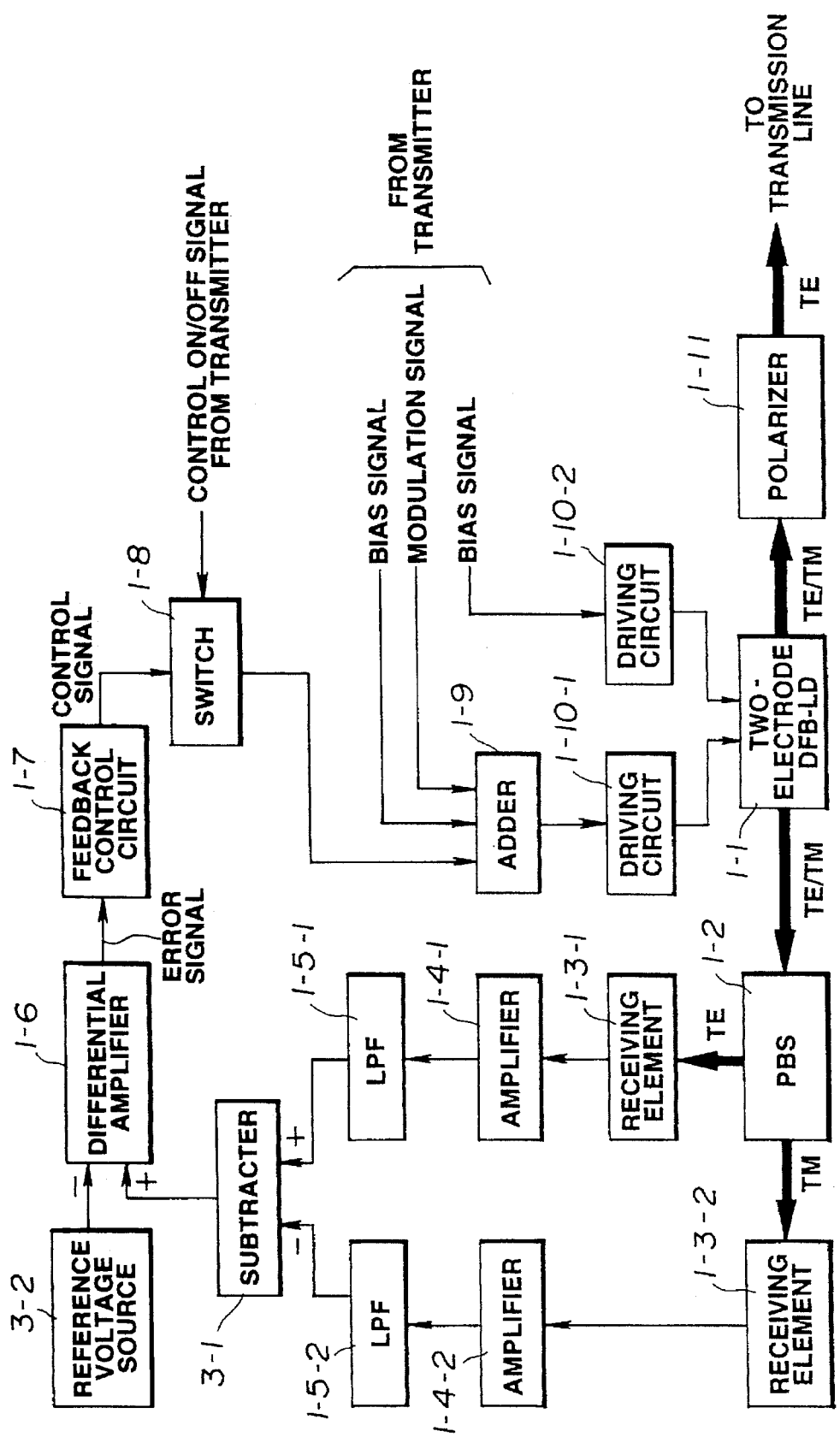
FIG. 27 is a block diagram of a tenth embodiment of a system for controlling a light source according to the present invention.

A tenth embodiment of the present invention will be described with reference to FIG. 27. FIG. 27 illustrates a tenth embodiment of a method for directly controlling a polarization modulation selective light source.

This embodiment is different from the ninth embodiment of FIG. 25 in that the outputs of the low pass filters (LPFs) 1-5-1 and 1-5-2 are input into a subtracter 3-1 and outputs of the subtracter 3-1 and the reference voltage source 3-2 are input into the differential amplifier 1-6.

The subtracter 3-1 outputs a value that is produced by subtracting the output signal of the LPF 1-5-2 from the output signal of the LPF 1-5-1. The output signal of the subtracter 3-1 is input into a positive input terminal of the differential amplifier 1-6, and the output signal of the reference voltage source 3-2 is input into a negative input terminal of the differential amplifier 1-6.

When the duty of the modulation signal deviates from 50%, the magnitude of the output signal of the LPF 1-5-1 will not be equal to that of the output signal of the LPF 1-5-2 even in a favorable modulation state. Therefore, in this case, in the construction of the ninth embodiment, the apparatus is stabilized by the feedback control at a state deviated from the favorable modulation state. The tenth embodiment aims at solving this problem. The output of the reference voltage source 3-2 is set to a difference between the output signal values of the LPFs 1-5-1 and 1-5-2 in the favorable modulation state. As a result, even when the modulation signal, whose duty ratio deviates from 50%, is used, the favorable modulation state can always be maintained. In other respects, the tenth embodiment is substantially the same as the ninth embodiment.

Eleventh Embodiment

In the above embodiments, the feedback control is performed for the current injected into the rear electrode of the two-electrode DFB-LD 1-1. The feedback control, however, can be performed for a current injected through the front electrode of the laser 1-1. Further, means for creating the error signal, such as the amplifiers, the LPFs, the differential amplifier and the like, may be replaced by another means for creating a zero-cross signal that becomes zero when the center value of modulation (in this embodiment, $I_{2b}+I_{2m}/2$) approaches the center value $I_{2sc}$ in the switching region. Furthermore, the two-electrode DFB-LD is used as a direct polarization modulation selective light source in the above embodiments, but a three-electrode DFB-LD may be used. Other light sources having the same function may also be used.

Twelfth Embodiment

Figure 7:
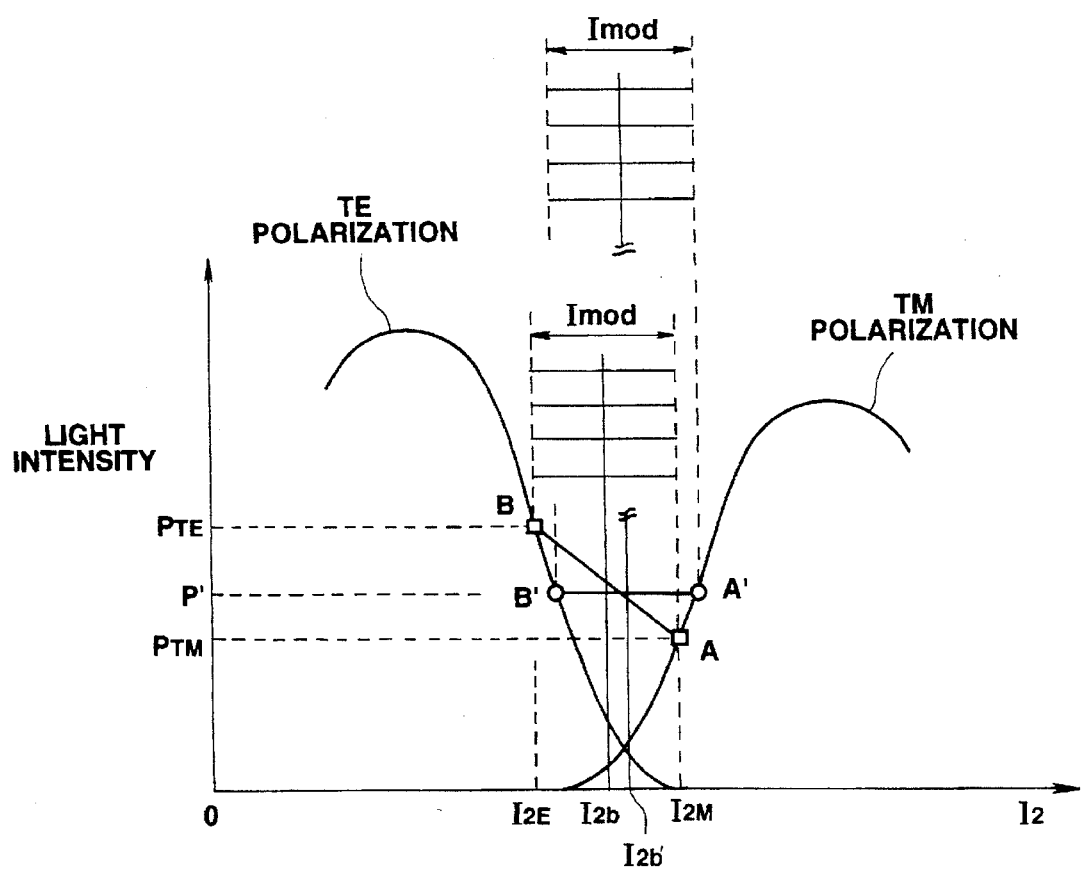
FIG. 7 is an illustration of a mechanism for maintaining a bias point.
Figure 8:
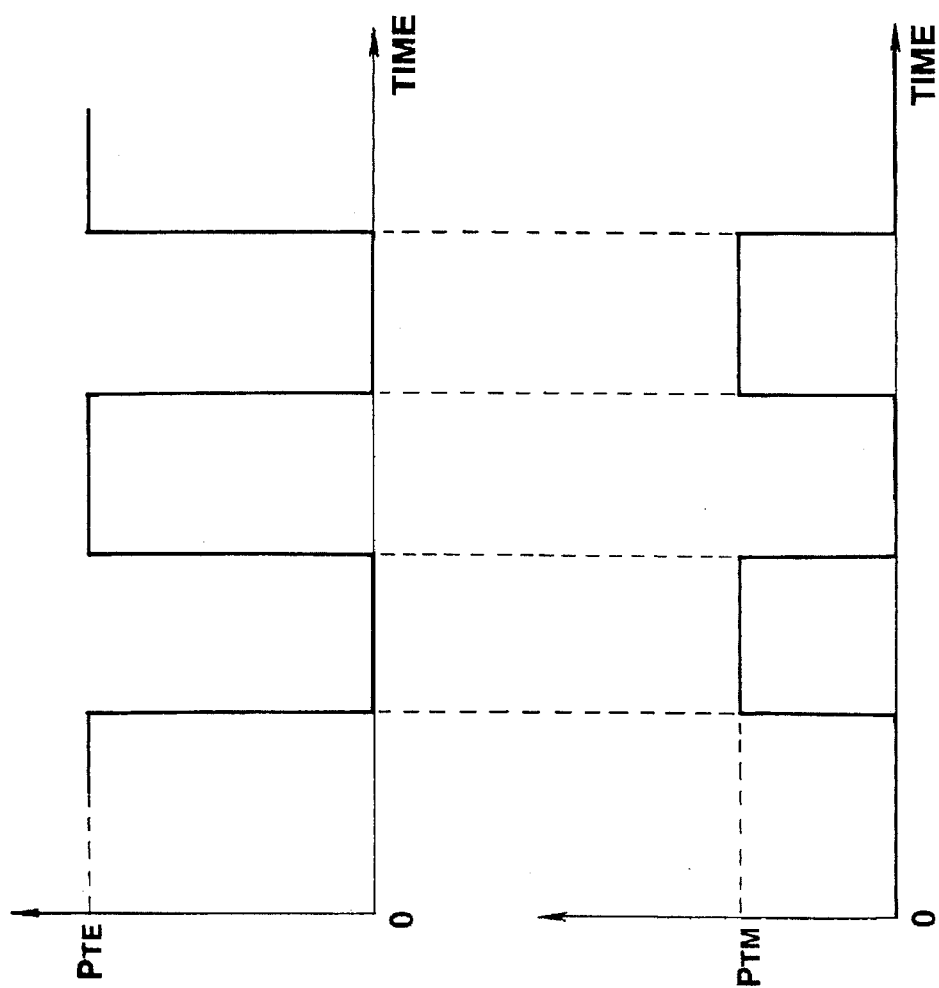
FIG. 8A is an illustration of a change in light output in TE mode occurring when oscillation characteristic varies.
FIG. 8B is an illustration of a change in light output in TM mode occurring when oscillation characteristic varies.

If shapes of oscillation characteristics for both polarization modes alter, the following problems may occur. For instance, if the oscillation characteristics for both polarization modes change as illustrated in FIG. 7 (shapes of the oscillation characteristics for both polarization modes are not symmetrical), the intensity of TE polarization becomes $P_{TE}$ when $I_2=I_{2E}$ (a point B in FIG. 7) and the intensity of TM polarization becomes $P_{TM}$ when $I_2=I_{2M}$, (a point A in FIG.). Thus, intensities of both polarization modes will differ ($P_{TE} \neq P_{TM}$). At this time, output signals of both polarization modes become as illustrated in FIGS. 8A and 8B. The change in the oscillation characteristics accompanying with a change in circumstances may cause the following adverse influences. 1) The modulation efficiency fluctuates due to fluctuation in the intensity of output light. 2) Chirp will occur in the optical frequency if the carrier density differs between points A and B. 3) The switching of polarization mode will not occur, and a correct modulation cannot be performed.

Therefore, such a construction, in which the bias component of $I_2$ is controlled, the bias point of modulation is maintained in the switching region and intensities of TE and TM polarization modes are made equal, can be considered to overcome that problem.

In FIG. 7, the intensities of output light in TE and TM polarization modes are equal to each other when the bias component of $I_2$ is $I_{2b}'$. The relationship between $\delta I_{2b}$ and the error signal is as illustrated in FIG. 26 (in FIG. 26, however, the modulation component is treated as a DC-like component) where $\delta I_{2b}$ is a minute deviation of the bias component of $I_2$ from $I_{2b}'$ at which output intensities of TE and TM polarization modes are equal. By inputting the error signal into the feedback control circuit and performing, for example, the PID control, $\delta I_{2b}$ can always be maintained at zero. In other words, output light intensities of TE and TM polarization modes can always be made equal to each other. This control system is also an effective method under certain conditions, but has the following limitation. When output light intensities of TE and TM polarization modes are made equal only by controlling the bias point, the output light intensity itself cannot always be stabilized over time if the oscillation characteristic itself varies. There may be a case where a change in the output light intensity with time impairs transmitted signals. The twelfth embodiment intends to overcome that limitation.

Figure 28:
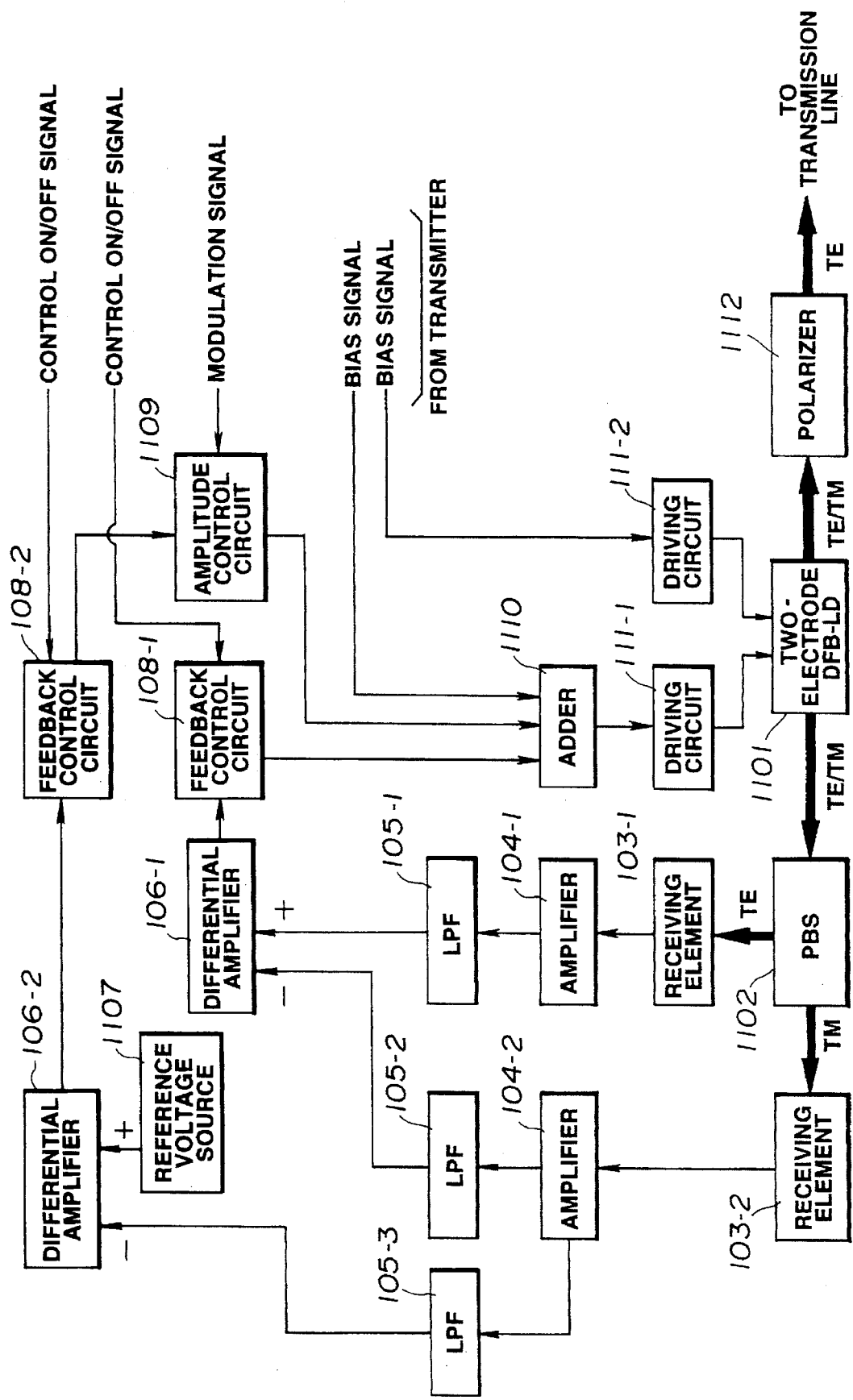
FIG. 28 is a block diagram of a twelfth embodiment of a system for controlling a light source according to the present invention.

The twelfth embodiment of the present invention will now be described with reference to FIG. 28. FIG. 28 illustrates the twelfth embodiment of a method for directly controlling a polarization modulation selective light source. As shown in FIG. 28, a main part includes a two-electrode DFB-LD 1101, a polarization beam splitter 1102, light receiving elements 103-1 and 103-2, amplifiers 104-1 and 104-2, low pass filters (LPFs) 105-1, 150-2 and 105-3, differential amplifiers 106-1 and 106-2, a reference voltage source 1107, feedback control circuits 108-1 and 108-2, an amplitude control circuit 1109, an adder 1110, driving circuits 111-1 and 111-2, and a polarizer 1112.

Figure 1:
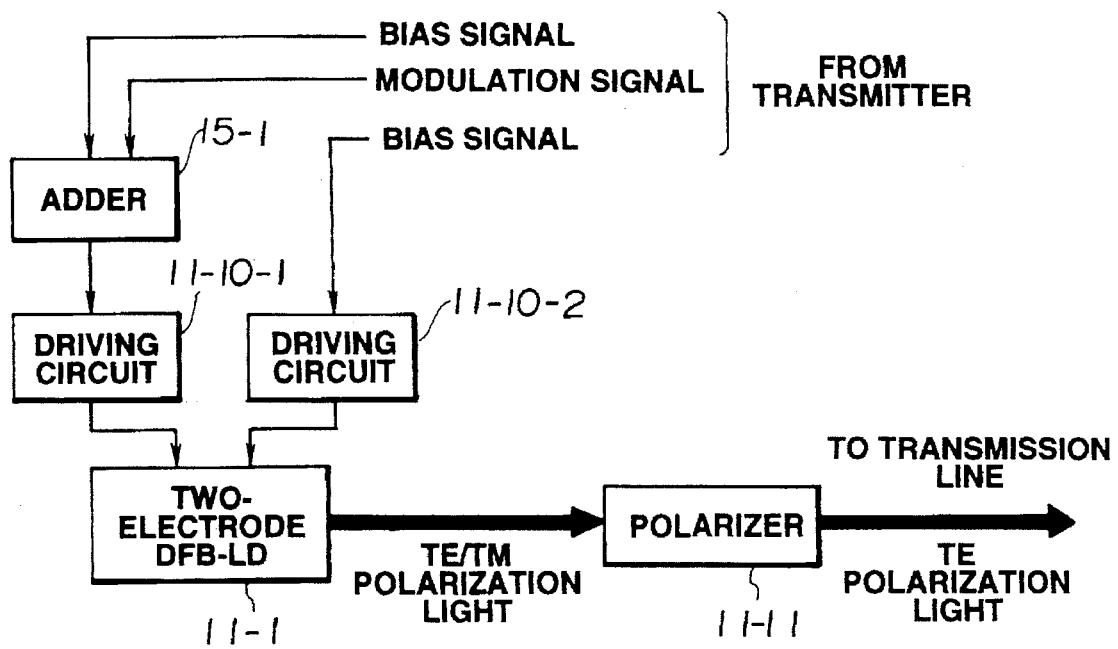
FIG. 1 is a block diagram of a conventional light source whose oscillation light is directly polarization-modulated.
Figure 2:
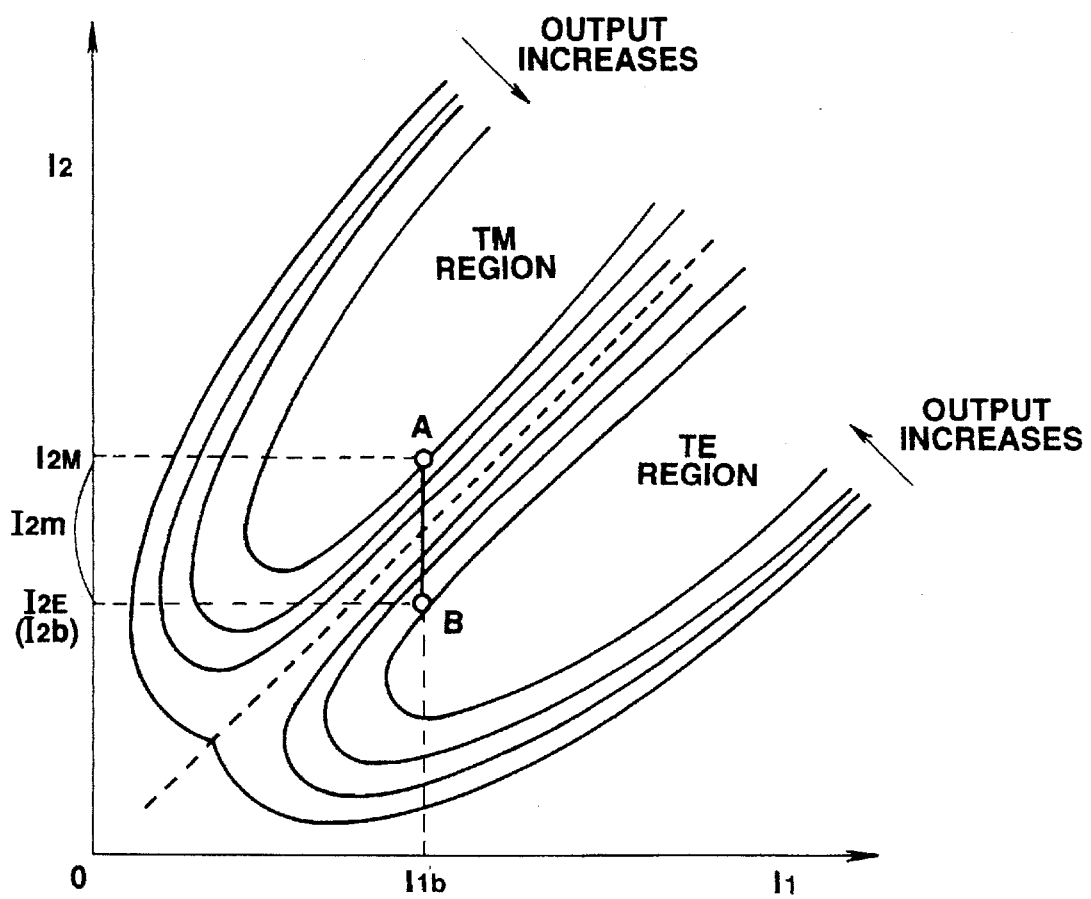
FIG. 2 illustrates oscillation characteristics of a two-electrode DFB-LD whose oscillation light is directly polarization-modulated.
Figure 3:
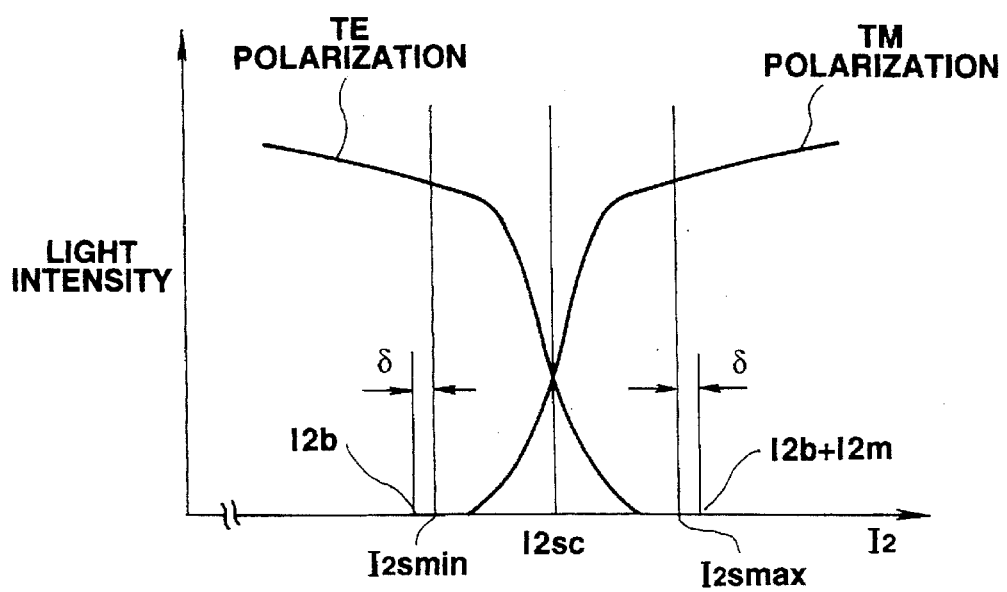
FIG. 3 illustrates a switching behavior of oscillation light between a TE mode and a TM mode.
Figure 5:
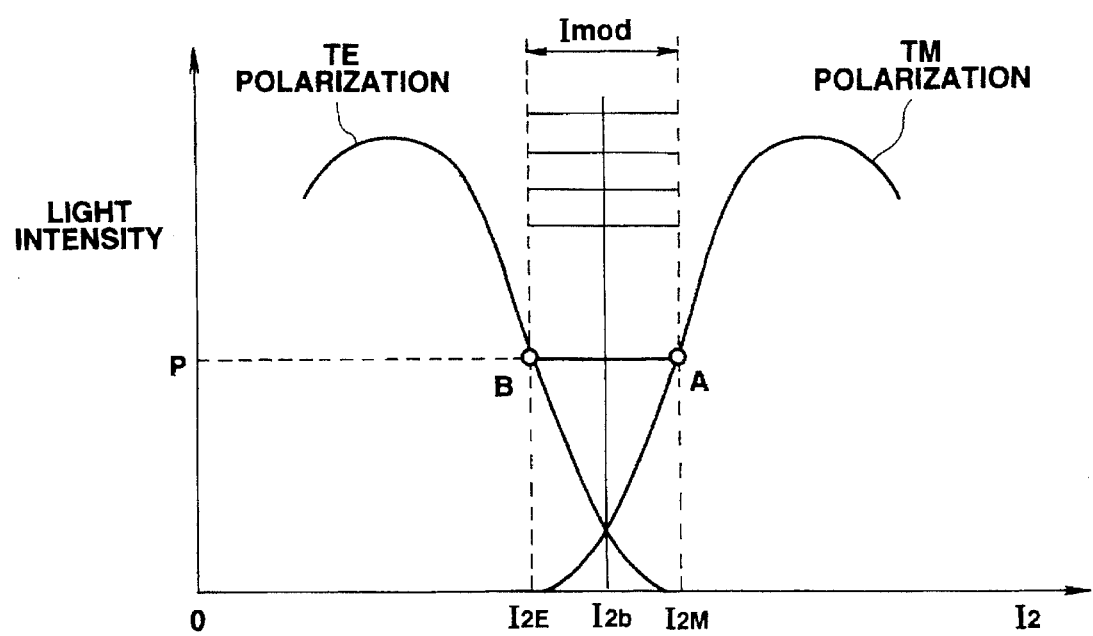
FIG. 5 is an illustration of a switching behavior of oscillation light between a TE mode and a TM mode.

The two-electrode DFB-LD 1101 is a conventional one. The DFB-LD 1101 has the structure as shown in FIG. 11A, and has characteristics as illustrated in FIG. 11B. The control method of this embodiment differs from the control method of a polarization modulation selective light source shown in FIG. 25 in that the LPF 105-3, the differential amplifier 106-2, the reference voltage source 1107, the feedback control circuit 108-2 and the amplitude control circuit 1109 are added to stabilize the output over time. Two independent output terminals are provided in the amplifier 104-2. The principle of polarization modulation and the maintenance of the bias point within the switching region (or the maintenance of $I_{2b}+I_{2M}/2$ illustrated in FIG. 3 near $I_{2sc}$) in this embodiment are the same as those of the ninth embodiment. Further, the duty of the modulation signal is fixed at 50% in this embodiment.

The light emitted from the rear end surface of the two-electrode DFB-LD 1101 is separated into TE polarization and TM polarization by the PBS 1102. The separated TM polarization is converted to an electric signal by the light receiving element 103-2, and the electric signal is amplified by the amplifier 104-2. The amplified signal is supplied both to the LPF 105-2 for maintenance of the bias point and to the LPF 105-3 for stabilization of the output intensity. After a low frequency component of the signal is extracted by the LPF 105-3, the extracted signal is input into the negative input terminal of the differential amplifier 106-2. The cut-off frequency of the LPF 105-3 is set sufficiently lower than the frequency of the modulation signal. The reference voltage source 1107 supplies a predetermined voltage signal to the positive input terminal of the differential amplifier 106-2. The differential amplifier 106-2 compares those signals. Its output voltage is negative when the output of the LPF 105-3 is larger than the output of the reference voltage source 1107, and is positive when the output of the LPF 105-3 is smaller than the reference voltage.

The feedback control circuit 108-2 generates a control signal using the signal from the differential amplifier 106-2 as the error signal, and the control signal is supplied to the amplitude control circuit 1109. As a feedback control system, a well-known PID control is preferably used. The output of the feedback control circuit 108-2 is ON/OFF-controlled in response to a control ON/OFF signal supplied from a transmitter. The amplitude control circuit 1109 receives the modulation signal from the transmitter, and adjusts its amplitude based on the control signal from the feedback control circuit 108-2. The adjusted modulation signal is supplied to the adder 1110. The adder 1110 adds three signals, i.e., the control signal from the feedback control circuit 108-1, the adjusted modulation signal from the amplitude control circuit 1109 and the bias signal from the transmitter, and its output is input into the driving circuit 111-1. The driving circuit 111-1 supplies a current to the rear electrode of the two-electrode DFB-LD 1101 based on the input signal from the adder 1110, and the driving circuit 111-2 supplies a current to the front electrode of the two-electrode DFB-LD 1110 based on the bias signal from the transmitter.

Figure 29:
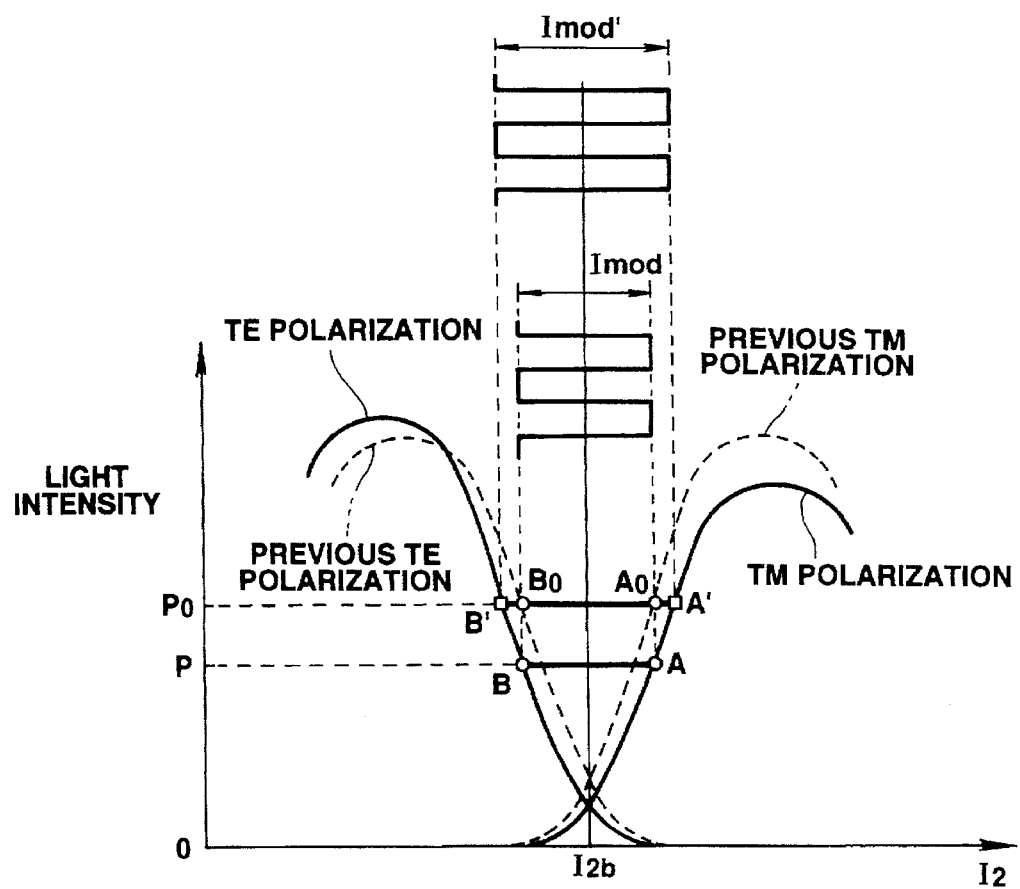
FIG. 29 is an illustration of the principle for stabilizing the output of a light source used in the twelfth embodiment.

FIG. 29 illustrates the manner of output stabilization of this embodiment. It is assumed that oscillation characteristics of TE and TM polarizations are as indicated by dotted curves. When the bias component of the injection current $I_2$ is $I_{2b}$, and the amplitude of the modulation component is $I_{mod}$, the polarization modulation is performed between points $A_0$ and $B_0$ in FIG. 29. Here, TE polarization and TM polarization are output with the same magnitude $P_0$ at points $B_0$ and $A_0$, respectively. Then, it is assumed that oscillation characteristics of TE and TM polarizations vary as indicated by solid curves for some reason. In the ninth embodiment, only a mechanism for maintaining the bias point works and a difference between output intensities of TE and TM polarizations is maintained at zero. In other words, the bias current component of $I_2$ is controlled such that the output intensities of the TE and TM polarizations are made equal. As a result, the TE mode operates about point B and the TM mode operates about point A. The output intensity, however, is reduced from $P_0$ to P since the output stabilization is not guaranteed in the ninth embodiment. In the twelfth embodiment, the output intensity is maintained at a constant value by controlling the amplitude of modulation in addition to the maintenance of the bias point. Namely, the amplitude $I_2$ of the modulation signal is controlled such that the output intensity of the TM polarization equals a predetermined magnitude.

Specifically, the differential amplifier 106-2 compares the output of TM polarization with the output from the reference voltage source 1107, and after the obtained signal is processed by the feedback control circuit 108-2, the signal is input into the amplitude control circuit 1109. The voltage of the reference voltage source 1107 is set to a magnitude corresponding to a desired output $P_0$. The amplitude control circuit 1109 produces a modulation signal having an appropriate amplitude based on the control signal from the feedback control circuit 108-2 and the modulation signal from the transmitter. The modulation signal is added to the bias signal and the control signal for maintenance of the bias point, by the adder 1110, and the added result is converted to a current by the driving circuit 111-1 to be injected into the DFB-LD 1101. As a result, the modulation amplitude increases from $I_{mod}$ to $I_{mod}'$, and the output is maintained at $P_0$. Thus, TE polarization operates about point B' and TM polarization operates about point A', and the polarization modulation is performed between those two points A' and B' to achieve the output stabilization.

Thirteenth Embodiment

Figure 30:
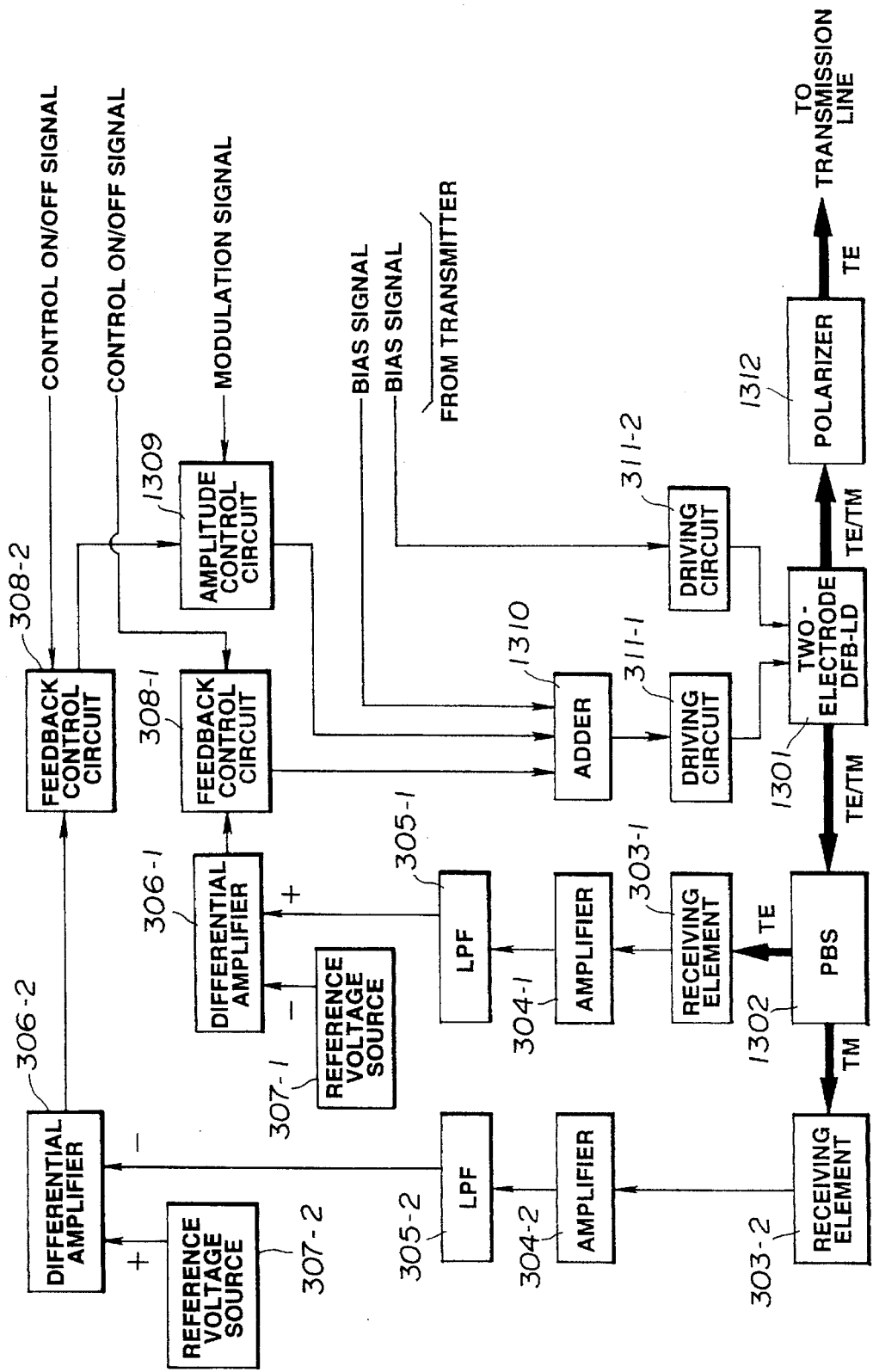
FIG. 30 is a block diagram of a thirteenth embodiment of a system for controlling a light source according to the present invention.

The thirteenth embodiment of the present invention will be described with reference to FIG. 30. FIG. 30 illustrates the thirteenth embodiment of a method for directly controlling a polarization modulation selective light source. As shown in FIG. 30, a main part includes a two-electrode DFB-LD 1301, a polarization beam splitter 1302, light receiving elements 303-1 and 303-2, amplifiers 304-1 and 304-2, low pass filters (LPFs) 305-1 and 305-2, differential amplifiers 306-1 and 306-2, reference voltage sources 307-1 and 307-2, feedback control circuits 308-1 and 308-2, an amplitude control circuit 1309, an adder 1310, driving circuits 311-1 and 311-2, and a polarizer 1312.

The two-electrode DFB-LD 1301 is a conventional one. The DFB-LD 1301 has the structure as shown in FIG. 11A, and has characteristics as illustrated in FIG. 11B. The structure of this embodiment differs from that of the twelfth embodiment in that outputs of respective polarization modes are stabilized in the thirteenth embodiment. For this purpose, reference voltage sources 307-1 and 307-2, which act as output references, are prepared for the respective polarization modes.

The light emitted from the rear surface of the two-electrode DFB-LD 1301 is separated into TE polarization and TM polarization by the PBS 1302. The separated TE polarization is converted to an electric signal by the light receiving element 303-1, and the electric signal is amplified by the amplifier 304-1. After a low frequency component of the amplified signal is extracted by the LPF 305-1, the extracted signal is input into a positive input terminal of the differential amplifier 306-1. The reference voltage source 307-1 supplies a predetermined voltage signal to a negative input terminal of the differential amplifier 306-1. The differential amplifier 306-1 amplifies a difference between those signals and creates an error signal.

The feedback control circuit 308-1 generates a TE control signal using this error signal, and the control signal is supplied to the adder 1310.

The TM polarization divided by the PBS 1302 is processed similarly to the TE polarization. A low frequency component of TM polarization output produced by the the light receiving element 303-2, the amplifier 304-2 and the LPF 305-2 is input into a negative input terminal of the differential amplifier 306-2. The reference voltage source 307-2 supplies a predetermined voltage signal to a positive input terminal of the differential amplifier 306-2. The differential amplifier 306-2 amplifies a difference between those signals and creates an error signal. The feedback control circuit 308-2 generates a TM control signal based on the error signal, and supplies the control signal to the amplitude control circuit 1309. The outputs of the feedback control circuits 308-1 and 308-2 are respectively ON/OFF-controlled in response to control ON/OFF signals supplied from a transmitter. The amplitude control circuit 1309 receives the modulation signal from the transmitter, and adjusts its amplitude based on the TM control signal from the feedback control circuit 308-2. The adjusted modulation signal is supplied to the adder 1310. The adjusted modulation signal has a square shape, and a negative voltage corresponds to a mark of FSK while zero voltage corresponds to a space of FSK (see FIG. 31).

The adder 1310 adds the three signals of the control signal from the feedback control circuit 308-1, the modulation signal from the amplitude control circuit 1309 and the bias signal from the transmitter, and its output is input into the driving circuit 311-1. The driving circuit 311-1 supplies a current to the rear electrode of the two-electrode DFB-LD 1301 based on the input signal from the adder 1310, and the driving circuit 311-2 supplies a current to the front side electrode of the two-electrode DFB-LD 1310 based on the bias signal from the transmitter.

Figure 31:
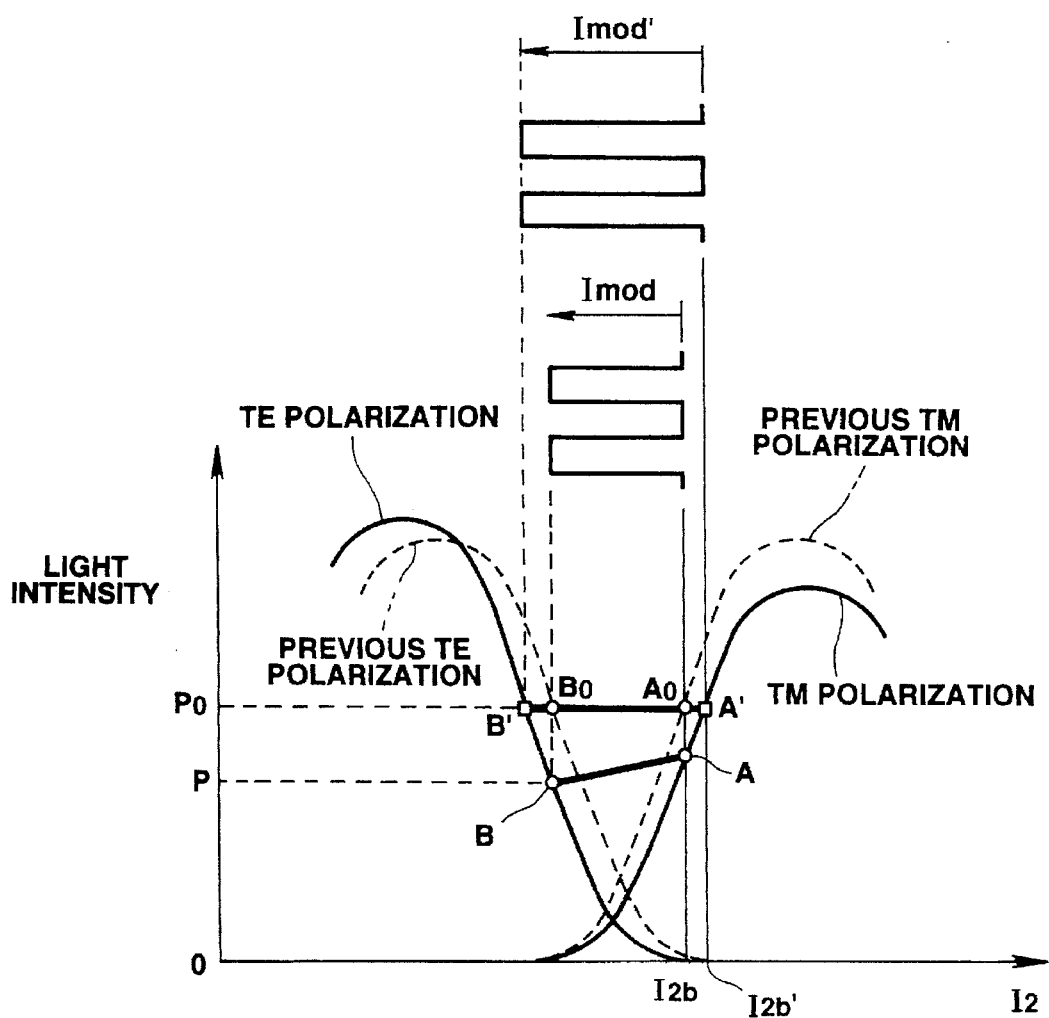
FIG. 31 is an illustration of the principle for stabilizing the output of a light source used in the thirteenth embodiment.

FIG. 31 illustrates the manner of output stabilization of this embodiment. It is assumed that oscillation characteristics of TE and TM polarizations are as indicated by dotted curves. When the bias component of the injection current $I_2$ is $I_{2b}$ and the amplitude of the modulation component is $I_{mod}$, $I_{2b}$ is injected into the rear side electrode for the modulation mark, and $I_{2b}-I_{mod}$ is injected into the rear side electrode for the modulation space. Here, the polarization modulation is performed between points $A_0$ and $B_0$ in FIG. 31. TE polarization and TM polarization are output with the same magnitude $P_0$ at points $B_0$ and $A_0$, respectively. Then, it is assumed that oscillation characteristics of TE and TM polarizations vary as indicated by solid curves for some reason. Absent feedback for the injection current, TE polarization would operate about point B and TM polarization would work about point A. At this time, the output intensity of TE polarization is reduced to P and a difference between intensities of TE and TM polarizations would occur. In this embodiment, the bias component of the injection current is controlled to maintain the output of TM polarization at $P_0$, and the amplitude of the modulation component is controlled to maintain the output of TE polarization at $P_0$. Specifically, after the output of TE polarization is compared with the output from the reference voltage source 307-1 by the differential amplifier 306-1, the result is processed by the feedback control circuit 308-1 and the bias component of the injection current $I_2$ is controlled such that the output intensity of TM polarization becomes $P_0$. Further, after the output of TM polarization is compared with the output from the reference voltage source 307-2 by the differential amplifier 306-2, the result is processed by the feedback control circuit 308-2 and the amplitude of the modulation component of the injection current $I_2$ is controlled such that the output intensity of TE polarization becomes $P_0$. At this time, the bias component of the injection current becomes $I_{2b}'$ and the amplitude of the modulation component becomes $I_{mod}'$. As a result, the TE mode operates about point B' and the TM mode operates about point A'. The polarization modulation is conducted between those points.

Fourteenth Embodiment

In the twelfth and thirteenth embodiments, feedback control is conducted for the injection current into the rear side electrode of the two-electrode DFB-LD, but the feedback control can be effected to the injection current into the front side electrode. Further, the TM polarization is used to stabilize the output in the twelfth embodiment, but the TE polarization may be used therefor. Moreover, if the duty of the modulation signal is not 50% in the twelfth embodiment, the problem can be coped with by such a structure in which a reference voltage source and a differential amplifier are newly arranged and, after the outputs of the differential amplifier 106-1 and the newly-added reference voltage source are compared in the newly-added differential amplifier, the result is supplied to the feedback control circuit 108-1. Furthermore, in the twelfth and thirteenth embodiments, an LPF or an integrator is used as means for detecting output intensities of TE and TM polarizations, but a peak-hold circuit may be used in place thereof.

Fifteenth Embodiment

Figure 32:
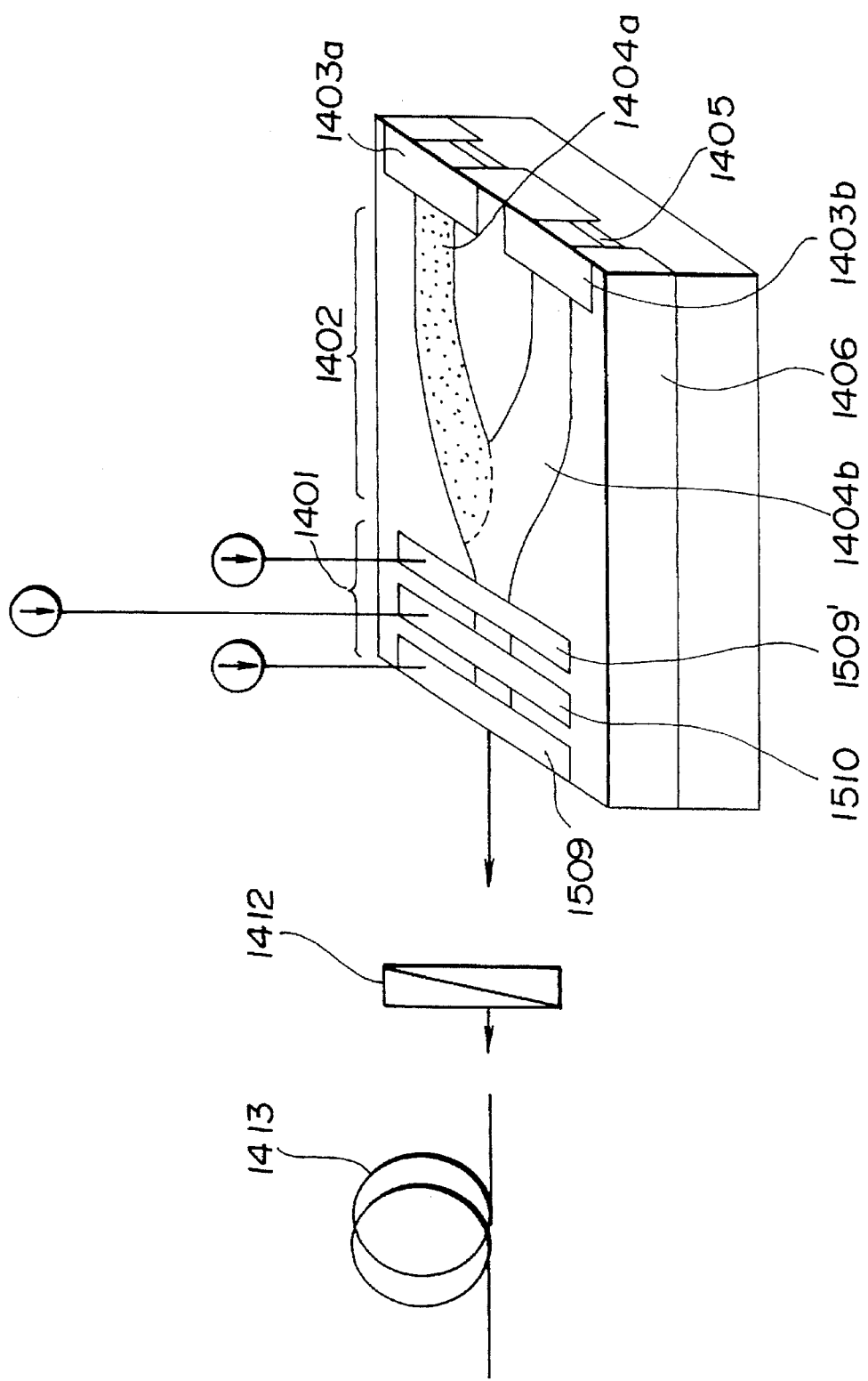
FIG. 32 is a perspective view of a fifteenth embodiment of an integrated optical semiconductor apparatus according to the present invention.

A fifteenth embodiment of the present invention will be described with reference to FIGS. 32 and 19. FIG. 32 is a perspective view of an integrated semiconductor device, and FIG. 19 also illustrates a cross section of this embodiment taken along its waveguide.

In the integrated optical semiconductor apparatus of this embodiment, as shown in FIG. 32, a three-electrode DFB laser 1401, a polarization mode splitter 1402 of a Y-branching structure, and photodetectors 1403a and 1403b for respectively detecting two light waves in different polarization modes divided by the mode splitter 1402 are integrated. Waveguides are formed by a burying structure 1406 of high-resistance InP. In this embodiment, an SiN film is loaded only on a region 1404a of the mode splitter 1402 and annealing is conducted to perform mixing or disordering of a super-lattice layer in the waveguide thereat. As a result, only TM polarization light is propagated along the region 1404a of the mode splitter 1402. Thus, light in TM mode of the light emitted by the DFB laser 1401 is branched into the waveguide 1404a by the mode splitter 1402, and light in TE mode of the light emitted by the DFB laser 1401 is branched into the waveguide 1404b by the mode splitter 1402. Those light waves are respectively received by the photodetectors 1403a and 1403b to be converted to electric signals.

The structure and the fabrication method of this embodiment are substantially the same as those described in the fourth embodiment (see FIG. 19).

The polarization-mode switching between TE and TM modes can be effectively performed by the DFB laser 1401. The polarization-modulated light wave is emitted from a rear side end surface 1405 of the device, and only the TE mode is taken out by a polarizer 1412. Thus, an ASK signal is incident on an optical fiber 1413 and transmitted therethrough.

The operation of this laser will be described with reference to FIGS. 32 and 25. This embodiment adopts the control method of the light source described in the ninth embodiment. The fifteenth embodiment has the structure wherein the DFB laser 1-1, the light receiving elements 1-3-1 and 1-3-2 and the like are replaced by the three-electrode DFB-LD 1401, the detectors 1403a and 1403b and the like.

When the DFB laser 1401 is driven, light waves are emitted from both front and rear end surfaces of the laser 1401, respectively. The light emitted from the rear end surface is input into the polarizer 1412 and only TE polarization is picked out. The light emitted from the front end surface is used to control the bias current point and the like. The light emitted from the front end surface is separated into TE polarization and TM polarization by the mode splitter 1402 integrated with the DFB laser 1401. The separated TE and TM polarizations are converted to electric signals by the integrated photodetectors 1403a and 1403b, and the electric signals are amplified by the amplifiers 1-4-1 and 1-4-2, respectively (see FIG. 25). Low frequency components of the signals are extracted by the LPFs 1-5-1 and 1-5-2. Those and the following are substantially the same as the description in the ninth embodiment.

Finally, the driving circuit 1-10-1 supplies a current corresponding to the input signal thereinto and the current is input into a center electrode 1510 of the DFB laser 1401. The driving circuit 1-10-2 supplies a current corresponding to the bias signal input from the transmitter and the current is input into electrodes 1509 and 1509' of the DFB laser 1401. The operation of the driving method is also substantially the same as that of the ninth embodiment.

In this embodiment, the feedback control is performed for the injection current into the same electrode (the electrode 1510) as the electrode into which the modulation signal is injected, but the feedback control may be conducted for the current injected into the electrodes (the electrodes 1509 and 1509') into which the bias current is injected.

Sixteenth Embodiment

Figure 33:
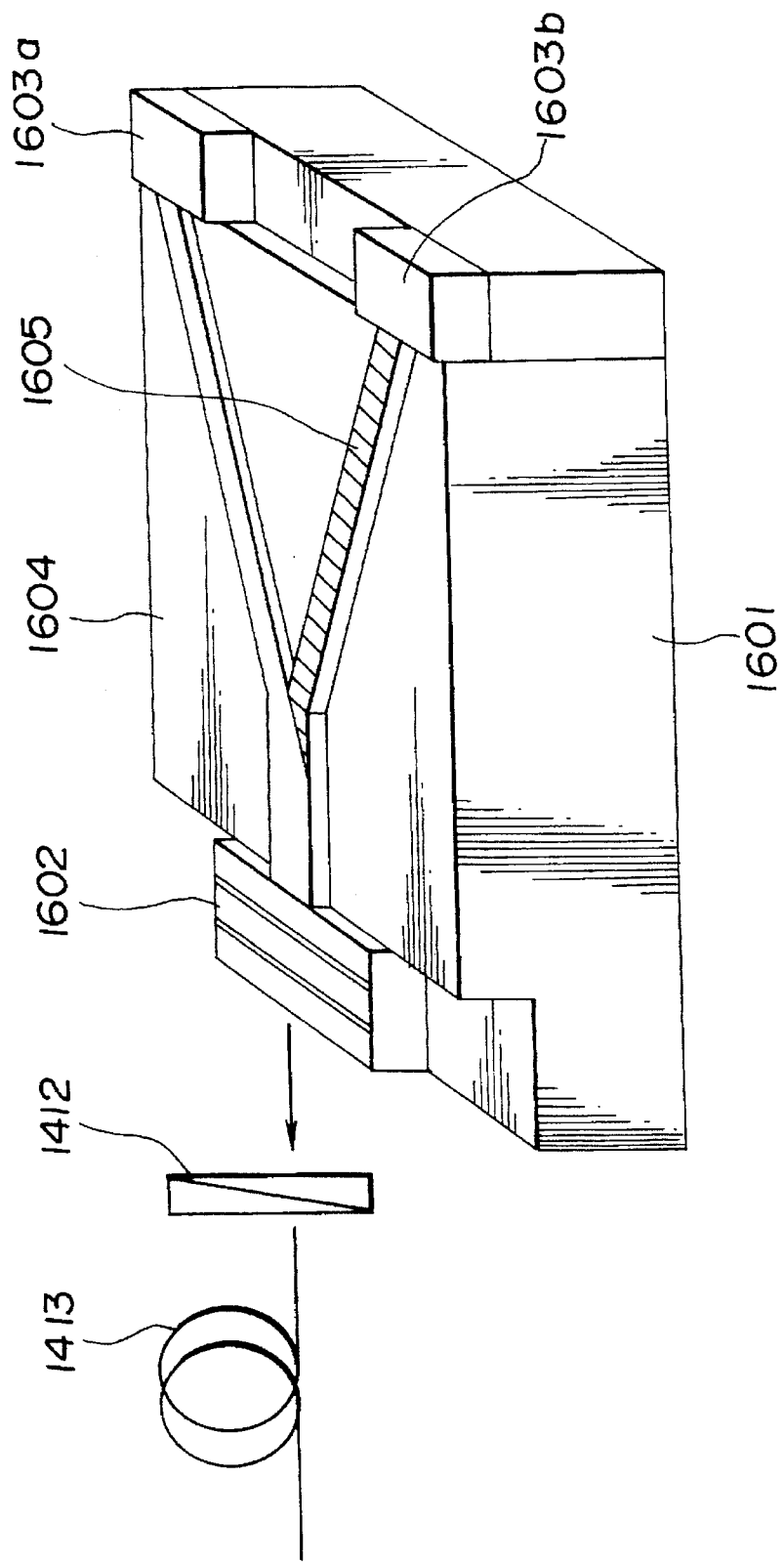
FIG. 33 is a perspective view of a sixteenth embodiment of a hybrid integrated optical semiconductor apparatus according to the present invention.

A sixteenth embodiment of the present invention will be described with reference to FIG. 33. In a hybrid apparatus shown in FIG. 33, a Y-branching type polarization mode splitter 1604 is formed on a LiNbO$_3$ substrate 1601, and a three-electrode DFB laser 1602 and photodiodes 1603a and 1603b are fixed to the substrate 1601 by adhesive, such as an ultraviolet hardening resin. In the mode splitter 1604, a metal thin film 1605 is loaded on one-side waveguide of the Y-branching such that only the TE mode can be propagated along the waveguide on this side. Only the TM mode is propagated along the other waveguide, and the respective outputs are detected by the photodiodes 1603a and 1603b. The DFB laser 1602 has the same structure as that of the DFB laser portion of the fifteenth embodiment. The light wave emitted from the front end surface is input into the polarization mode splitter 1604, and the light wave emitted from the rear end surface is coupled to an optical fiber 1413 through a polarizer 1412 and is used as a light signal. Antireflection coatings are respectively provided on optical coupling portions and the rear side emission end surface of the DFB laser 1602. The driving method and others of this embodiment are the same as those of the fifteenth embodiment.

Seventeenth Embodiment

Figure 34:
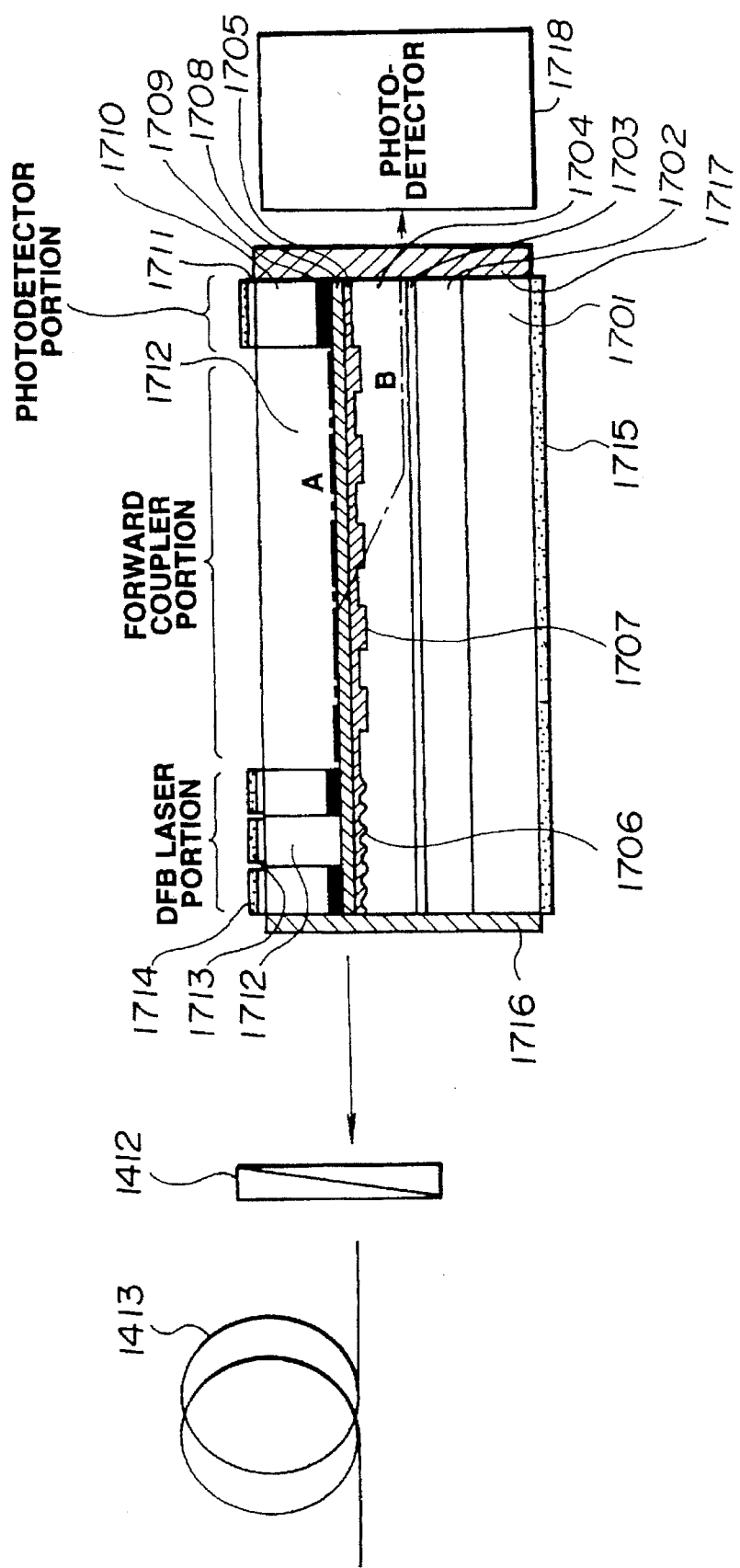
FIG. 34 is a cross-sectional view of a seventeenth embodiment of an integrated optical semiconductor apparatus according to the present invention.

A seventeenth embodiment of the present invention will be described with reference to FIG. 34. FIG. 34 is a cross section view of an integrated semiconductor device taken along its waveguide, in which a vertical type forward coupler is used as a polarization mode splitter and monolithically integrated on a semiconductor substrate.

The structure and the fabrication method of this embodiment of the present invention will now be described with reference to FIG. 34.

As shown in FIG. 34, an n-type InP buffer layer 1702, an n-type InGaAsP lower waveguide layer 1703 having a band gap wavelength of 1.1 µm, and an n-type InP clad layer 1704 are consecutively layered on an n-type InP substrate 1701 during a first growth. A diffraction grating 1706 with a fine pitch of 240 nm is formed on the clad layer 1704 in a DFB laser portion, and a diffraction grating 1707 with a rough pitch of 14.5 µm is formed on the clad layer 1704 in the forward coupler portion. No diffraction grating is formed in the photodetector portion.

An n-type InGaAsP light guide layer 1705 having a band gap wavelength of 1.1 µm, an n-type InGaAsP upper waveguide layer 1708 having a band gap wavelength of 1.3 µm, an active layer 1709 having a strained quantum well structure, a p-type InP clad layer 1710 and a p-InP contact layer 1711 having a band gap wavelength of 1.5 µm are consecutively layered on the clad layer 1704 during the second growth. The active layer 1709 is constructed of ten pairs of intrinsic In$_{0.53}$Ga$_{0.47}$As well layers (thickness: 5 nm) and intrinsic In$_{0.28}$Ga$_{0.72}$As barrier layers (thickness: 5 nm).

Then, in the center portion of the DFB laser portion and the forward coupler portion, etching is conducted down to the upper waveguide layer 1708 to remove the active layer 1709, and a p-type InP clad layer 1712 and a p-InP contact layer 1713 having a band gap wavelength of 1.5 µm are layered during the third selective growth. Then, p-side and n-side electrodes 1714 and 1715 are formed. In the DFB laser portion, the p-side electrode 1714 is formed into a three-electrode structure. In the forward coupler portion, electrode and contact layers are removed. After the wafer is cut, antireflection coatings 1716 and 1717 are deposited on opposite end surfaces. Reference numeral 1718 is a photodetector. The photodetector 1718 may be a planar type photodetector adhered on the antireflection coating 1717.

The operation of this embodiment will now be described. The oscillation polarization switching between TE and TM modes takes place in the DFB laser portion, similar to the fifteenth embodiment. In the forward coupler portion, a portion of light A propagated in the upper waveguide layer 1708 is coupled to the lower waveguide layer 1703 (light B), and the light B is taken out. FIG. 22 also illustrates coupling characteristics from the upper waveguide 1708 to the lower waveguide 1703 in the forward coupler portion. As shown in FIG. 22, filtering characteristic for the TE mode exhibits a center wavelength of 1.55 µm which is the oscillation wavelength of the laser. Its half width is about 5 nm. On the other hand, filtering characteristic for the TM mode exhibits a center wavelength of 1.52 µm which is about 30 nm shorter than 1.55 µm. Therefore, only the TE mode of the laser oscillation light at 1.55 µm is propagated through the lower waveguide 1703 and received by the external photodetector 1718. The TM mode thereof is propagated along the upper waveguide 1708 and detected by the photodetector portion on the substrate 1701. Here, the front side end surface of the photodetector portion may be damaged by etching or the like to prevent TM light leaking from the front side of the photodetector portion.

The light taken out by the polarizer 1412 is only in the TE mode of the polarization-modulated light, and thus is an ASK signal. This light in the TE mode is coupled to the optical fiber 1413.

The driving and other methods are the same as those of the fifteenth embodiment. The light wave emitted from the rear side end surface of the DFB laser is used as a signal. On the other hand, the TE mode component of the light wave emitted from the front side end surface is detected by the photodetector portion and the TM mode component thereof is detected by the photodetector 1718. Those components are respectively converted to electric signals to be used for feedback control.

In the forward coupler portion, the center wavelength of filtering can be changed by applying an electric field thereto. Therefore, when the center filtering wavelength is shifted corresponding to a change in the laser oscillation wavelength, the coupling efficiency can be kept unchanged.

Eighteenth Embodiment

An eighteenth embodiment of the present invention will be described with reference to FIG. 35. In this embodiment, a directional coupler is used as a polarization mode splitter.

Figure 35:
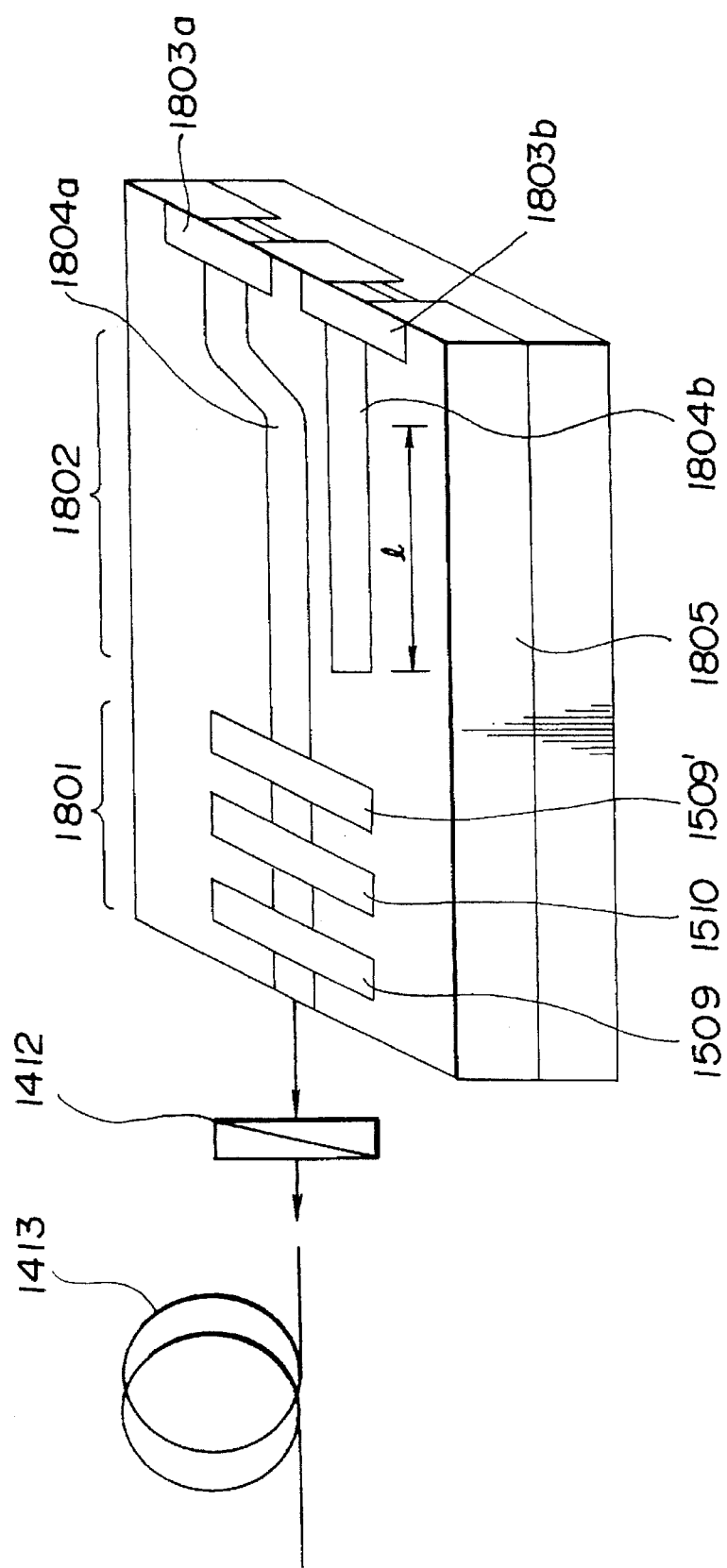
FIG. 35 is a perspective view of an eighteenth embodiment of an integrated optical semiconductor apparatus according to the present invention.

In FIG. 35, reference numeral 1801 is a DFB laser having the same structure as that of the fifteenth embodiment. Reference numeral 1802 is a directional coupler having a coupling length l. Reference numerals 1803a and 1803b are respectively photodetectors. The directional coupler 1802 is formed by forming waveguides 1804a and 1804b shaped as shown in FIG. 35 by etching and burying etched portions with high-resistance InP 1805.

The polarization-modulated light wave emitted from the front side end surface of the DFB laser 1801 enters the directional coupler 1802. In the waveguides 1804a and 1804b of the directional coupler 1802, equivalent refractive index for a TE mode wave emitted from the DFB laser 1801 is different from that for a TM mode wave, so the coupling efficiency in the directional coupler 1802 differs between the TE mode and the TM mode. Therefore, the coupling length λ of the directional coupler 1802 is determined such that the TE mode wave is coupled to the waveguide 1804a and the TM mode wave is coupled to the waveguide 1804b. Thus, the coupler can act as the polarization mode splitter 1802.

Thus-separated light waves are received and converted to electric signals by the photodetectors 1803a and 1803b, respectively. The driving method of this embodiment can be performed similarly to the fifteenth embodiment.

Nineteenth Embodiment

A nineteenth embodiment of the present invention will be described with reference to FIG. 36. In this embodiment, an etched mirror formed in an integrated optical device is used as a polarization mode splitter.

Figure 36:
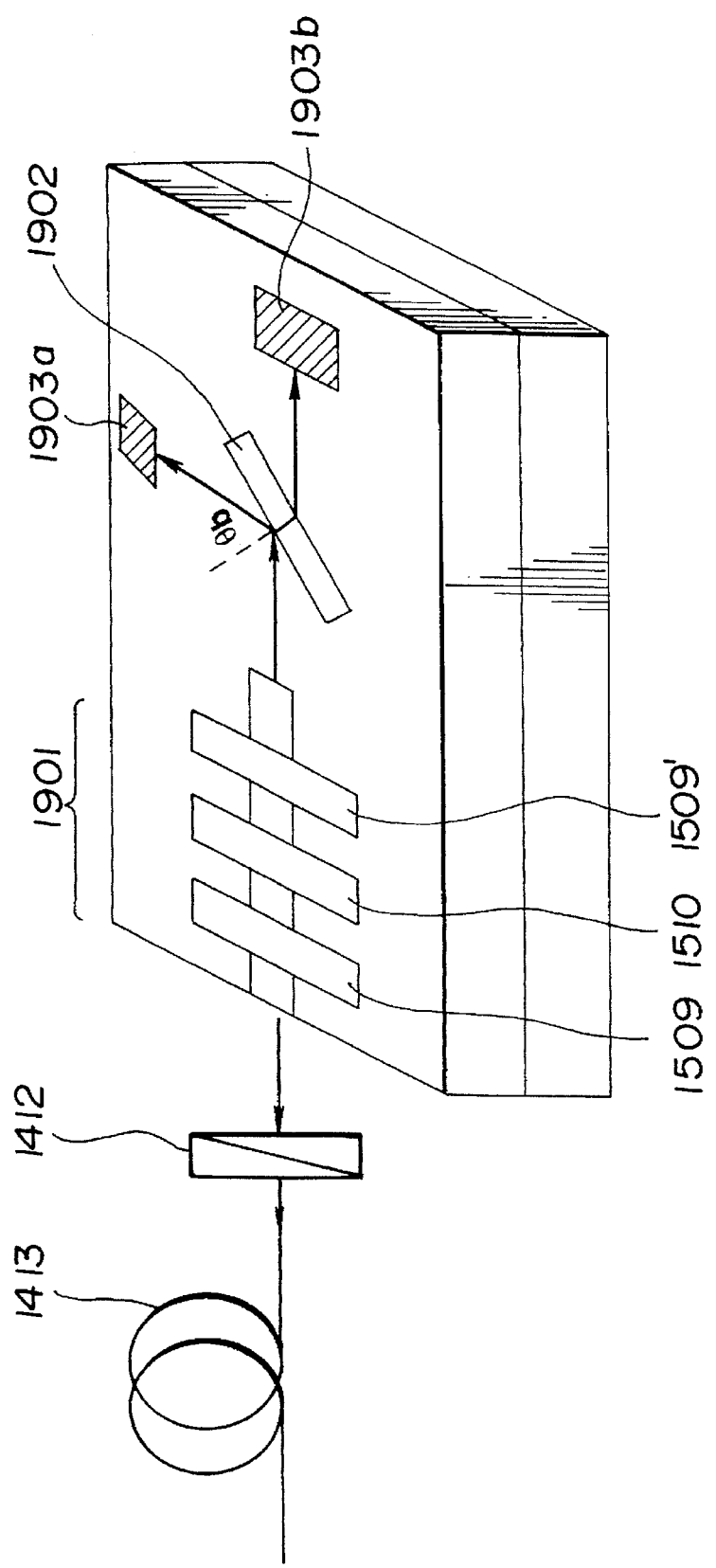
FIG. 36 is a perspective view of a nineteenth embodiment of an integrated optical semiconductor apparatus according to the present invention.

In FIG. 36, reference numeral 1901 is a DFB laser having the same structure as that of the fifteenth embodiment. Reference numeral 1902 is an etched mirror formed at an angle $\theta_b$ relative to a light wave emitted from the DFB laser 1901. Reference numerals 1903a and 1903b are respectively photodetectors. The etched mirror 1902 is formed by forming a fine etched groove shaped as shown in FIG. 36 by reactive ion beam etching. A material having appropriate refractive index may be put into the etched groove to adjust the refractive index of the reflective mirror 1902.

The operation of this embodiment is as follows:

The polarization-modulated light wave emitted from the front side end surface of the DFB laser 1901 enters the etched mirror 1902 at the incident angle $\theta_b$. Here, when the incident angle $\theta_b$ is set to a Brewster's angle for the oscillation light of the DFB laser 1901, a TE mode wave is transmitted therethrough without any reflective loss and a TM mode wave is mostly reflected by the etched mirror 1902. Thus, the etched mirror 1902 functions as a polarization mode splitter. Thus-separated light waves are received and converted to electric signals by the photodetectors 1903a and 1903b, respectively. The driving method of this embodiment can be performed similarly to the fifteenth embodiment.

Twentieth Embodiment

Figure 37:
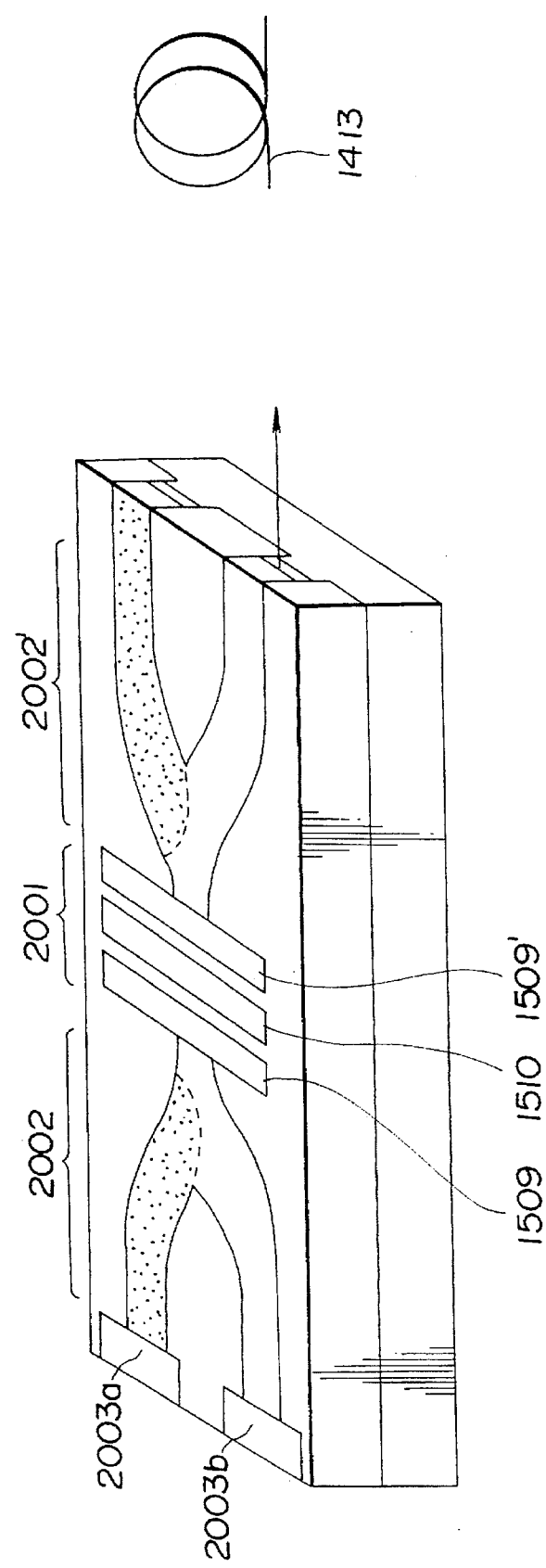
FIG. 37 is a perspective view of a twentieth embodiment of an integrated optical semiconductor apparatus according to the present invention.

A twentieth embodiment of the present invention will be described with reference to FIG. 37. In this embodiment, two Y-branching polarization mode splitters 2002 and 2002', as described in the fifteenth embodiment, are integrated on both emission end sides of a DFB laser 2001. In FIG. 37, reference numerals 2003a and 2003b are, respectively, photodetectors.

In the fifteenth through nineteenth embodiments, the polarization-modulated signal light is emitted from the rear side end surface of the DFB laser, and only a TE mode (or TM mode) light wave is picked out by the polarizer disposed at the emission end to perform ASK modulation. In such a construction, it is difficult to achieve a small-sized module, or productivity is lowered due to necessity of optical adjustment during the formation of the module and the like. A small-sized module and improved productivity can be achieved by integrating the polarization mode splitter 2002' at the opposite side to the emission side of the modulated signal, as in this embodiment.

Those polarization mode splitters 2002 and 2002' may also be any splitter as described in the sixteenth through nineteenth embodiments or combination thereof. In the integrated semiconductor apparatuse, a semiconductor optical amplifier may be integrated at the emission end to compensate for light power taken out from the polarization mode splitter. In the twentieth embodiment, the light in TE mode propagated in one waveguide of the polarization mode splitter 2002' is taken out and coupled to the optical fiber 1413 as a light signal.

Twenty-first Embodiment

In the fifteenth through twentieth embodiments of the present invention, the integrated optical semiconductor apparatus is controlled by the driving method as described in the ninth embodiment. In this embodiment, however, the integrated optical semiconductor apparatus is controlled by the driving method of the tenth embodiment (see FIG. 27). The integrated optical semiconductor apparatus in any of the fifteenth through twentieth embodiments is controlled by the driving method of the tenth embodiment.

Twenty-second Embodiment

Figure 38A:
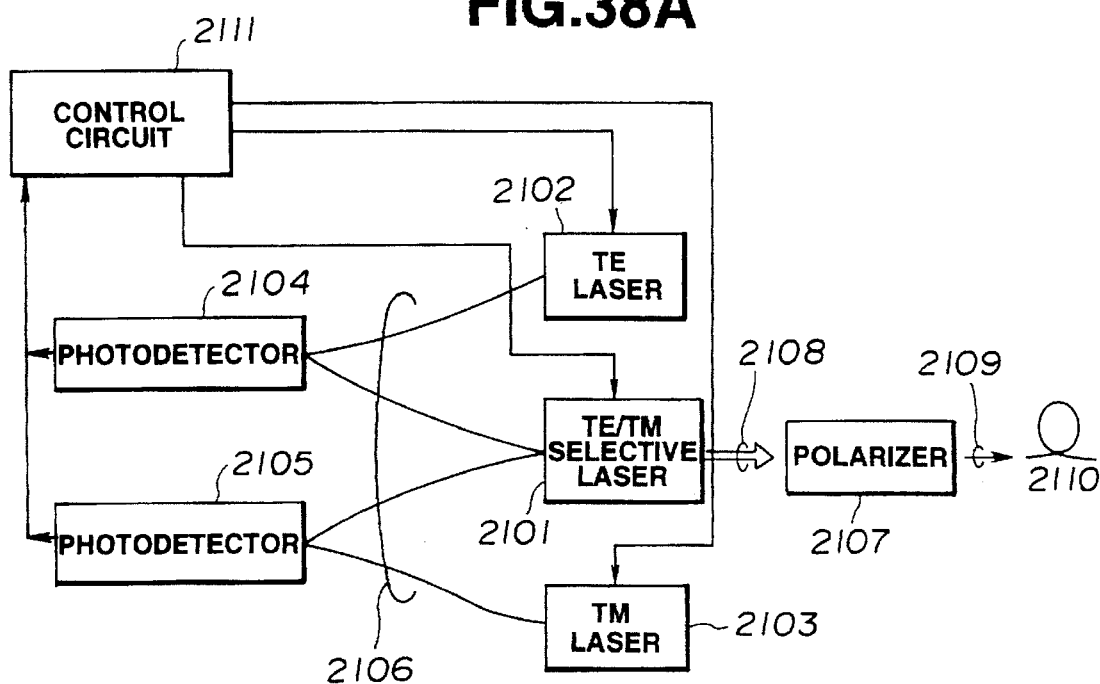
FIG. 38A is a block diagram of a conceptual structure of a twenty-second embodiment of an integrated optical semiconductor apparatus according to the present invention.
Figure 38B:
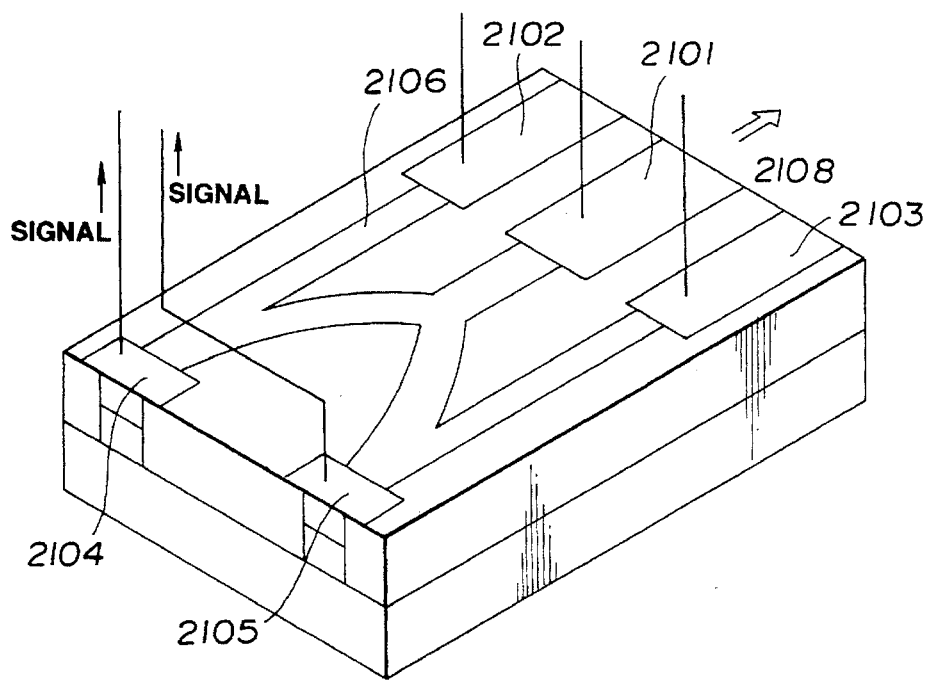
FIG. 38B is a perspective view of the structure of the twenty-second embodiment.

A twenty-second embodiment of the present invention will be described with reference to FIGS. 38A and 38B. FIG. 38A illustrates the fundamental concept of this embodiment, and FIG. 38B illustrates the structure of an integrated apparatus constructed based on the concept of FIG. 38A.

In FIG. 38A, reference numeral 2101 is a TE/TM polarization selective laser which can change the polarization state of output light depending on its excited condition. Reference numeral 2102 is a semiconductor laser whose output light is in a TE mode. Reference numeral 2103 is a semiconductor laser whose output light is in a TM mode. Reference numerals 2104 and 2105 are respectively photodetectors. Reference numeral 2106 is a light branching and combining element. Reference numeral 2107 is a polarizer. Reference numeral 2108 is output light of the TE/TM selective laser 2101. Reference numeral 2109 is a light signal in one of two mutually-perpendicular polarizations of the output light 2108, which is selected by the polarizer 2107. Reference numeral 2110 is an optical fiber. Reference numeral 2111 is a control circuit.

The TE/TM selective laser 2101 is a DFB semiconductor laser having the structure similar to that of the fifteenth embodiment. The TE oscillation laser 2102 is a DFB or DBR laser which emits light in a TE mode at the same wavelength as that of the TE oscillation of the TE/TM selective laser 2101. The TM oscillation laser 2103 is a DFB or DBR laser which emits light in a TM mode at the same wavelength as that of the TM oscillation of the TE/TM selective laser 2101. Each of the TE oscillation laser 2102 and the TM oscillation laser 2103 can be a laser which has the same structure as the TE/TM selective laser 2101 and in which the above oscillation condition is fullfiled by setting the operation point, in a simple case. The light branching and combining element 2106 is constructed such that the output light of the TE oscillation laser 2102 and the output light of the TE/TM selective laser 2101 are simultaneously detected by the photodetector 2104 and a beat signal therebetween can be obtained. Further, the light branching and combining element 2106 is also constructed such that the output light of the TM oscillation laser 2103 and the output light of the TE/TM selective laser 2101 are simultaneously detected by the photodetector 2105 and a beat signal therebetween can be obtained.

The operation of this embodiment is as follows: The TE/TM selective laser 2101 is polarization-modulated by a signal from the control circuit 2111. The TE oscillation laser 2102 and the TM oscillation laser 2103 are driven by the control circuit 2111 such that above operations can be obtained. In this operation state, the beat signal of the TE mode light can be obtained in the photodetector 2104 and the beat signal of the TM mode light can be obtained in the photodetector 2105. Those elements serve as the above-described polarization mode splitter, the polarization beam splitter or the like. The control circuit 2111 is constructed as in the ninth embodiment (see FIG. 25), the tenth embodiment (see FIG. 27), the twelfth embodiment (see FIG. 28) or the like such that the control circuit 2111 can control the TE/TM selective laser 2101 based on the output signals of the two photodetectors 2104 and 2105 and a stable operation can be attained. In this embodiment, however, the control circuit 2111 also has the function for stabilizing operations of the TE oscillation laser 2101 and the TM oscillation laser 2103 such that the beat signals can be obtained in the respective photodetecros 2104 and 2105.

The integrated apparatus having the above-discussed structure is illustrated in FIG. 38B in a perspective form. The apparatus consists of three buried-type DFB lasers 2101, 2102 and 2103, buried-type photodetectors 2104 and 2105 and the branching-combining element 2106 for connecting those elements. Portions of DFB lasers and photodetectors may have the same structures as those of the fifteenth embodiment, for example. The branching-combining element or waveguides 2106 may be a modified structure of the fifteenth embodiment in which no super-lattice structure of the waveguides is mixed (i.e., the structure without any polarization sensitivity). In the thus-constructed integrated apparatus, the operation as described referring to FIG. 38A can be achieved.

Twenty-third Embodiment

Figure 39A:
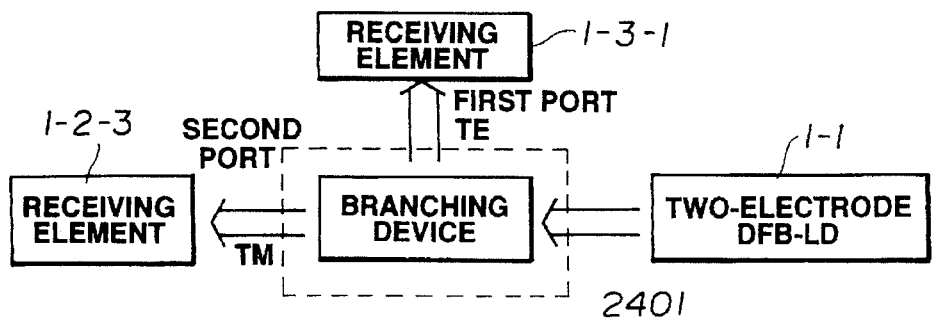
FIGS. 39A and 39B are respectively block diagrams showing main portions of a twenty-third embodiment of the present invention.
Figure 39B:
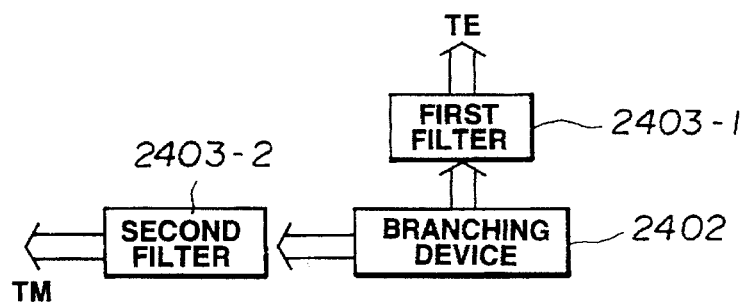
Figure 39C:
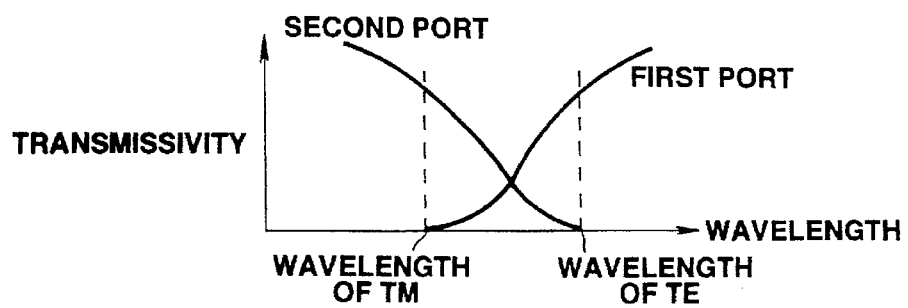
FIGS. 39C and 39D are respectively illustrations of characteristics of a demultiplexer and optical filters used in the twenty-third embodiment of the present invention.
Figure 39D:
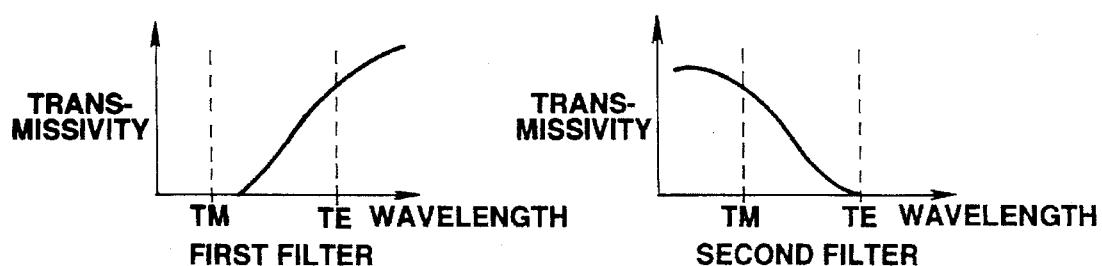

In the multi-electrode DFB laser which is used for polarization modulation, the oscillation wavelength is also switched when the polarization mode is switched between TE and TM polarizations (a difference in wavelength betwwen TE and TM polarizations is about 1 nm). In the ninth embodiment and the like, the polarization modes appearing during the modulation time are separated and the modulation state is appropriately maintained based on a difference in the light intensity between TE and TM modes, but it is possible to separate the two polarizations based on their wavelengths. Specifically, a portion of the polarization beam splitter or the like is replaced by a demultiplexer 2401 as illustrated in FIG. 39A, which divides the incident light into two outputs at the boundary of a center wavelength between wavelengths of TE and TM polarizations, or a portion of the polarization beam splitter or the like is replaced by a light branching device 2402 and two optical filters 2403-1 and 2403-2 as illustrated in FIG. 39B. Characteristics of the demultiplexer 2401 are illustrated in FIG. 39C, and characteristics of the optical filters 2403-1 and 2403-2 are illustrated in FIG. 39D.

Twenty-fourth Embodiment

A twenty-fourth embodiment of the present invention will now be described with reference to FIGS. 40 through 44D.

Figure 40:
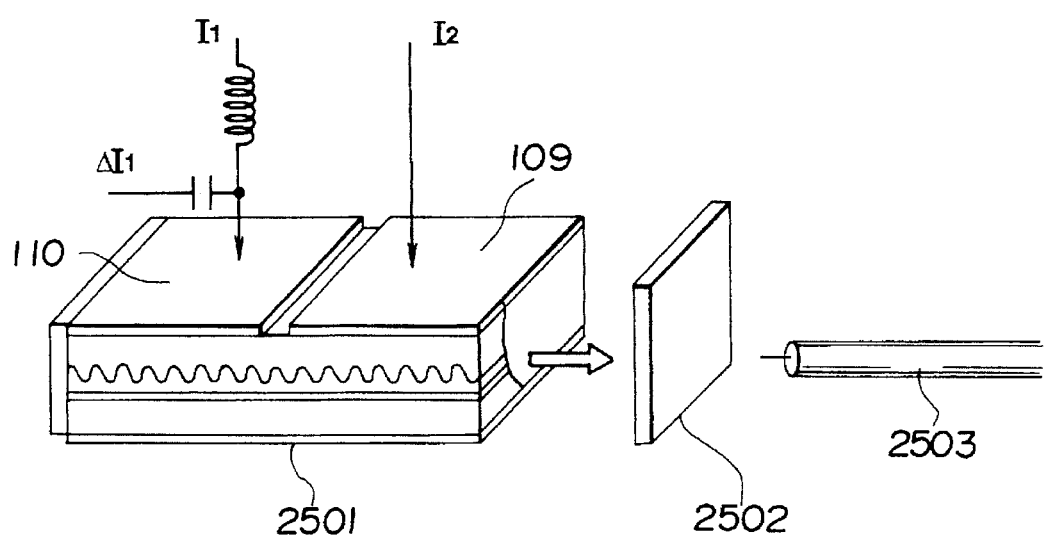
FIG. 40 is a perspective view of a twenty-fourth embodiment of the present invention.

In FIG. 40, reference numeral 2501 is a DFB semiconductor laser which is a light source in this embodiment. Reference numeral 2502 is a Fabry-Perot etalon used as a wavelength filter. Reference numeral 2503 is an optical fiber for transmitting a light signal therethrough. The structure of the DFB laser 2501 is substantially the same as shown in FIG. 11A.

In the DFB laser 2501 of this embodiment, when a constant bias current $I_2$ is injected through the electrode 109 formed on one light emission side without any AR coating and a current $I_1$, injected through another electrode 110 at another light emission side with AR coating, is varied, the oscillation polarization mode is switched from a TE mode to a TM mode at a predetermined value of $I_1$ as illustrated in FIG. .41. Therefore, when a minute digital signal $\Delta I_1$ is superposed on a constant bias current near the bias switching point with the amplitude which is set such that the output intensity of the TE mode is about the same as that of the TM mode after switching, as illustrated in FIG. 41, TM mode light of an electric field component $E^y$ is oscillated in phase with the superposed current waveform and TE mode light of an electric field component $E_x$ is oscillated in anti-phase with the superposed current waveform, as illustrated in FIG. 42. The oscillation wavelength of light from the light source 2501 having the above-discussed structure is switched between 1.562 µm in the TE mode and 1.558 µm in the TM mode. A difference in the oscillation wavelength between TE and TM modes is 4 nm, which is a sufficiently large value.

Figure 43A:
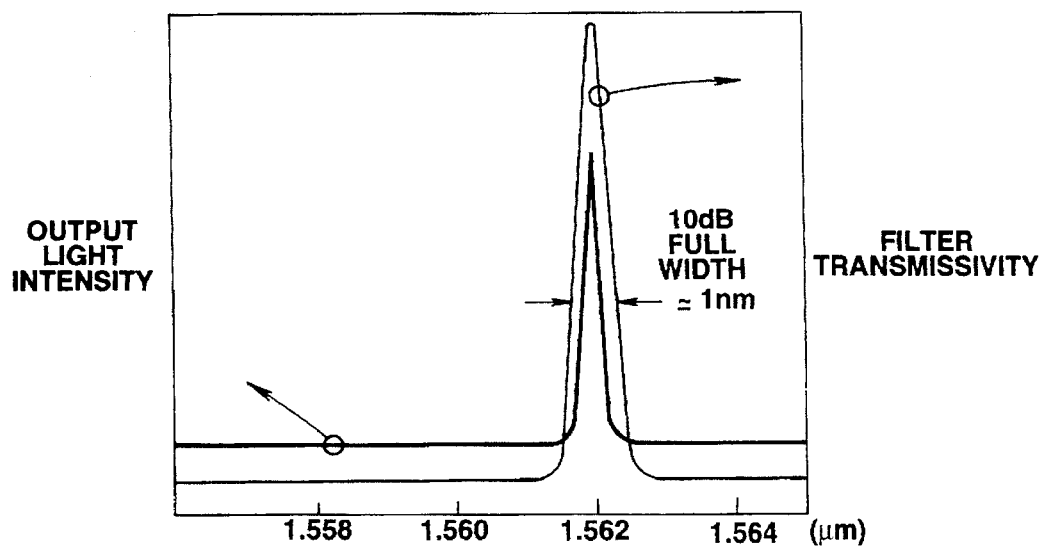
FIGS. 43A and 43B are respectively illustrations of oscillation spectra of light sources and transmissivities of optical filters used in the twenty-fourth embodiment of the present invention.
Figure 43B:
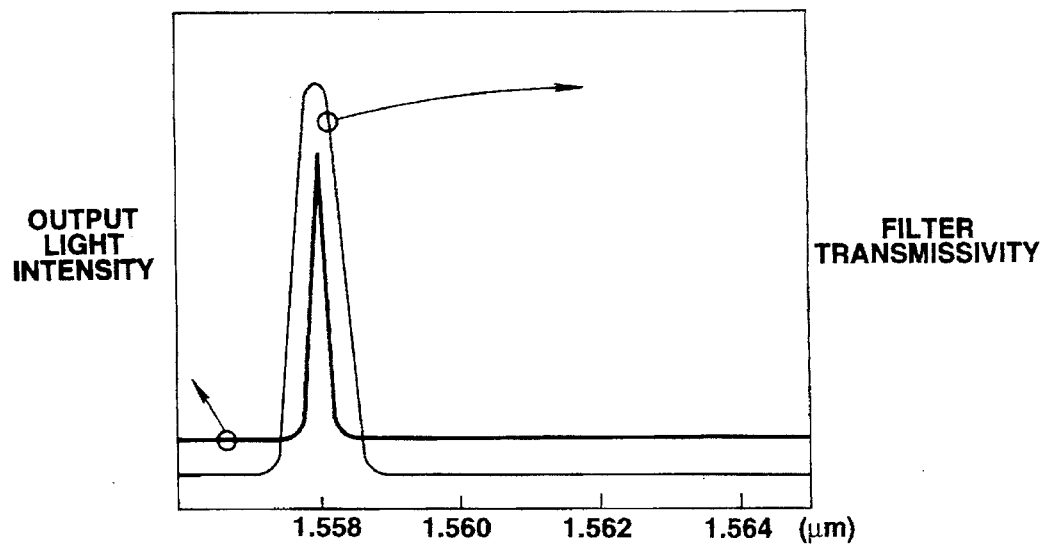
Figure 44A:
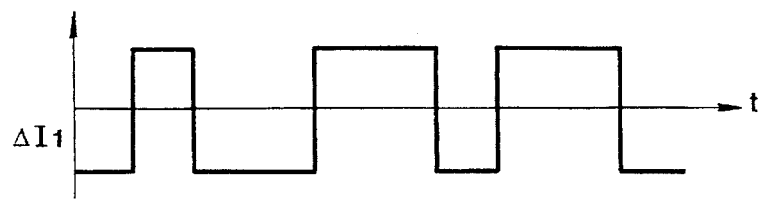
FIGS. 44A and 44C are illustrations of a change in current into a light source used in the twenty-fourth embodiment of the present invention.
Figure 44B:
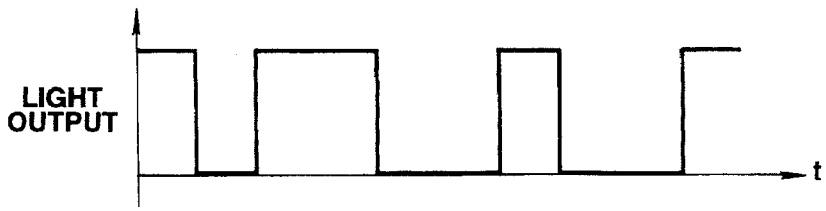
FIGS. 44B and 44D are respectively illustrations of a change in light output in a TE mode and a change in light output in a TM mode.
Figure 44C:
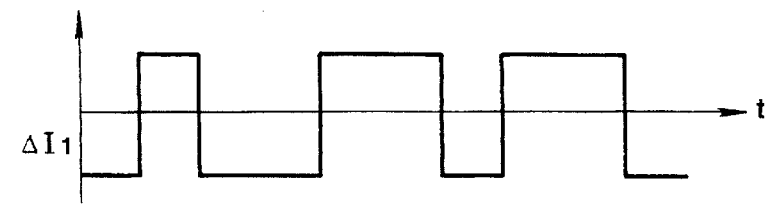
Figure 44D:
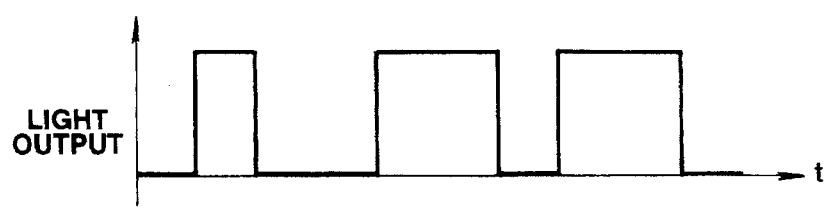

The light emitted from the DFB laser 2501, which is a light source having the above-discussed characteristics, is incident on the Fabry-Perot etalon 2502 which is a wavelength filter, as shown in FIG. 40. The transmission characteristic of the Fabry-Perot etalon 2502 has a peak at the oscillation wavelength for the TE mode as illustrated in FIG. 43A, and its 10 dB-down full width is much smaller than a difference in wavelength between two oscillation wavelengths of the DFB laser 2501. Further, this transmission characteristic has no transmission peak near the oscillation wavelength for the TM mode. Therefore, when the DFB laser 2501 is modulated by a current that has a waveform as illustrated in FIG. 44A, an ASK-modulated output waveform, which is in anti-phase with the signal current as illustrated in FIGS. 44A and 44B, can be obtained since only the oscillation light in the TE mode is transmitted through the etalon 2502. Similarly, if the transmission characteristic of the Fabry-Perot etalon 2502 has a peak at the oscillation wavelength for the TM mode as illustrated in FIG. 43B, its 10 dB-down full width which is much smaller than a difference in wavelength between two oscillation wavelengths of the DFB laser 2501 and there is no transmission peak near the oscillation wavelength for the TE mode, an ASK-modulated output waveform, which is in phase with the signal current as illustrated in FIGS. 44C and 44D, can be obtained when the DFB laser 2501 is modulated by a current that has a waveform as illustrated in FIG. 44C, since only the oscillation light in the TM mode is transmitted through the etalon 2502.

Dynamic wavelength fluctuation of the modulated light can be reduced to a very small magnitude less than 0.01 nm at the time of the modulation frequency of 5 GHz, since fluctuations in carrier density and photon density in the laser 2501 are quite small. Further, the difference in wavelength between two oscillation wavelengths of the DFB laser 2501 is large, say several nm, so this difference can become much larger than the 10dB-down transmission full width of the optical filter 2501. Thus, the extinction ratio can be increased and signal receiving at a low error rate can be achieved by a simple structure.

In this embodiment, although the Fabry-Perot etalon is used as the wavelength filter 2502, other wavelength filters which have transmission characteristics such that no crosstalk occurs between two oscillation modes of the DFB laser 2501, such as a DFB filter and a dielectric filter, may be used to attain similar effects.

In this embodiment, the feedback control is effected by using the polarization-modulated light emitted from the left-hand side of the laser 2501 in FIG. 40 in accordance with the driving method described above.

Twenty-fifth Embodiment

FIG. 45 illustrates a twenty-fifth embodiment which relates to a wavelength division multiplexing optical communication system using an above-discussed semiconductor laser. In FIG. 45, reference numeral 2601 is a DFB semiconductor laser that is a three-electrode DFB laser to be used as a light source. Reference numeral 2602 is a tunable DFB filter. Reference numeral 2603 is an optical fiber for transmitting a light signal therethrough. Reference numeral 2604 is a tunable DFB filter provided on a receiver side. Reference numeral 2605 is a light receiving device.

The structure of the DFB laser 2601 is substantially the same as that illustrated in FIG. 14. The tunable characteristic for the TE mode of the three-electrode DFB laser 2601 is the same as that illustrated in FIG. 17. Currents $I_2$ and $I_2'$ are independently injected through the respective electrodes, and the oscillation wavelength can be changed while maintaining a single TE mode, by controlling a ratio between those currents with the value of $(I_2+I_2')$ being maintained at 60 mA. Here, $I_1$ is maintained at 20 mA. The wavelength can be varied over a tunable range of about 3.0 nm with a single mode being maintained, by changing a ratio of current $I_2$ relative to current $(I_2+I_2')$ in a range between 0.1 and 0.4. Similarly, the oscillation wavelength can be changed for TM mode. When a modulation current $\Delta I_1$ corresponding to a transmission signal and having the amplitude of 2 mA is superposed on the bias current $I_1$, the semiconductor laser 2601 emits light whose polarization mode is modulated in accordance with the transmission signal.

The modulated light emitted from the laser 2601 is incident on the optical filter 2602. At this time, the transmission center wavelength of the optical filter 2602 is set such that only the TE mode (or the TM mode) can be transmitted. Thus, ASK-modulated signal light can be obtained. The signal light is coupled to the optical fiber 2603 and transmitted therethrough. The signal light is selectively demultiplexed by the optical filter 2604 which constitutes the light receiving device, and then is converted to an electric signal by the photodetector 2605.

In such a wavelength division multiplexing communication system, the wavelength multiplicity is determined by the tunable range (about 3 nm) and the transmission bandwidth (about 0.03 nm in 10 dB-down transmission bandwidth) of the tunable DFB filters 2602 and 2604. In general, however, the tunable DFB filter is sensitive to polarization, and transmission center wavelengths for TE and TM modes are different from each other even in the same driven state. Therefore, those values need to be set such that no crosstalk occurs. When the transmission wavelengths of the tunable DFB filters 2602 and 2604 are adjusted to the TE mode, the oscillation light in the TM mode would not adversely influence the crosstalk if the oscillation wavelength in TM mode is set not to be transmitted even if changed in a tunable range (about 3 nm) of the tunable DFB filters 2602 and 2604. As a result, when the tunable range of the tunable DFB filters 2602 and 2604 is 3 nm and the 10dB-down transmission bandwidth thereof is 0.03 nm, wavelength multiplexing transmisson of about 100 channels can be attained as wavelength division multiplexing optical communication systems in the tunable range.

Also in this embodiment, the feedback control is effected by using the polarization-modulated light emitted from the left-hand side of the laser 2601 in FIG. 45 in accordance with the driving method described above.

Twenty-sixth Embodiment

Figure 46:
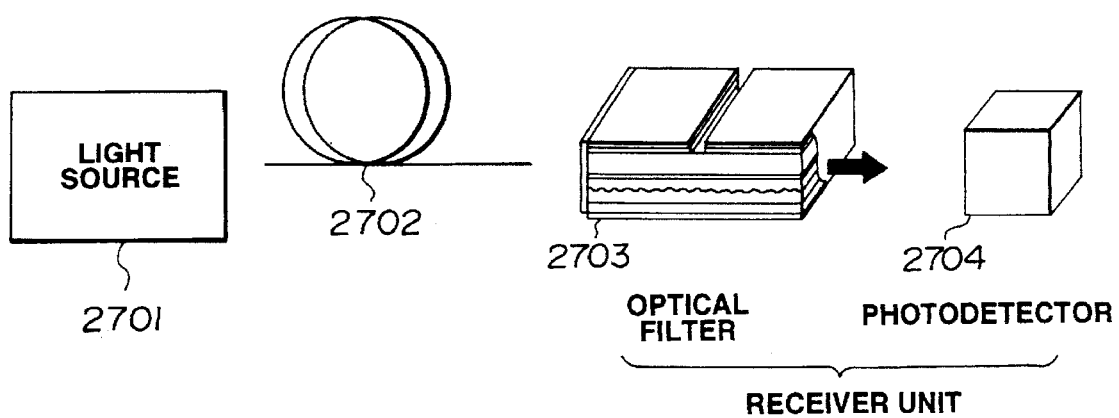
FIG. 46 is a view of a twenty-sixth embodiment of an optical communication system according to the present invention.

FIG. 46 illustrates a twenty-sixth embodiment in which a light source apparatus or an integrated optical semiconductor apparatus of the present invention is used as a light source for optical communications and hence optical transmission is performed.

In FIG. 46, reference numeral 2701 is a light source apparatus or an integrated optical semiconductor apparatus of the present invention in which the extinction ratio is stably controlled and oscillation polarization is modulated. In the light source 2701, its wavelength can be changed in a range of 3 nm. Further, in the polarization modulation, dynamic wavelength fluctuation, which is called chirping and has been the problem in an ordinary direct intensity modulation system, is very small, say less than 2 GHz (about 0.01 nm in wavelength), so that no crosstalk between adjacent channels occurs when wavelengths are multiplexed even if channels are arranged at wavelength intervals of about 10 GHz (about 0.05 nm) or about 0.03 nm. Therefore, when the light source 2701 is used, the wavelength division multiplexing of 60 (=3/0.06) channels or 100 (=3/0.03) channels can be achieved.

Figure 47:
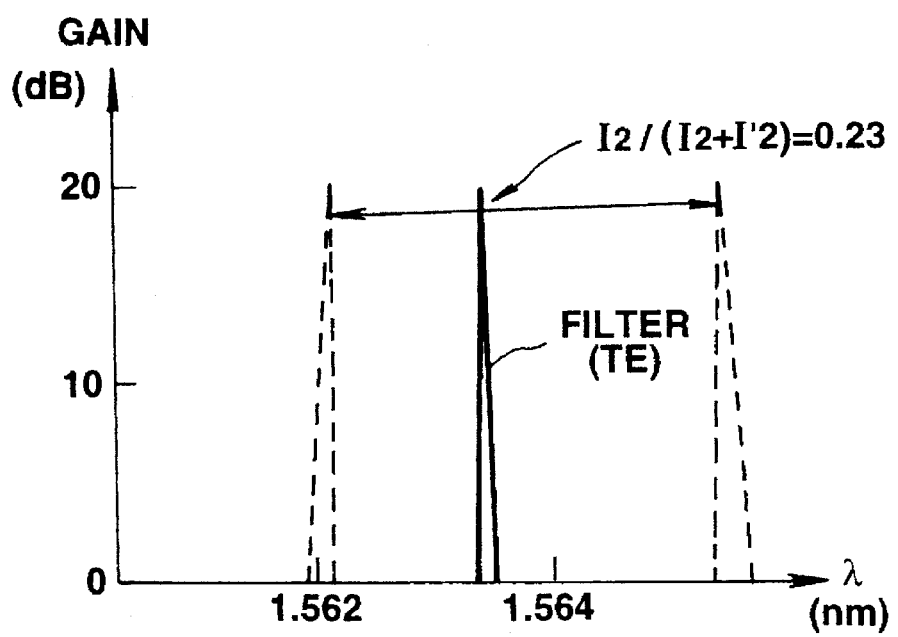
FIG. 47 is an illustration of a tuning characteristic of a tunable laser used in the twenty-sixth embodiment.

The light emitted from the light source 2701 is coupled to a single mode fiber 2702 and transmitted therethrough. In a receiver unit, light at a desired wavelength of the signal light transmitted through the optical fiber 2702 is selectively demultiplexed by an optical filter 2703 and detected by a photodetector 2704. Here, a filter having the same structure as that of the DFB laser is used as the optical filter 2703, and a bias current below its threshold is injected thereinto. When the ratio of currents injected through two electrodes is varied, the transmission wavelength can be changed in a range of 3 nm while the transmission gain is maintained at 20 dB. FIG. 47 illustrates this behavior. This graph exhibits the characteristic for a TE mode of the optical filter 2703, and when coupling is conducted in a TM mode, the transmission peak exists at a location about 4 nm shorter than that of the graph. The 10 dB-down transmission bandwidth of the filter 703 is 0.03 nm, and those values are sufficient to perform the wavelength multiplexing at intervals of 0.05 nm or 0.03 nm as discussed above.

As a filter, other filters, such as a Mach-Zehnder type filter and a Fabry-Perot type filter, may be used. Further, although only one light source 2701 and only one receiver unit are illustrated in FIG. 46, plural light sources and plural receiver units which are respectively coupled by an optical coupler or the like may be used to perform optical transmissions.

Also in this embodiment, the feedback control is effected by using the polarization-modulated light emitted from the left-hand side of the light source 2701 in FIG. 46 in accordance with the driving method described above.

Twenty-seventh Embodiment

Figure 48:
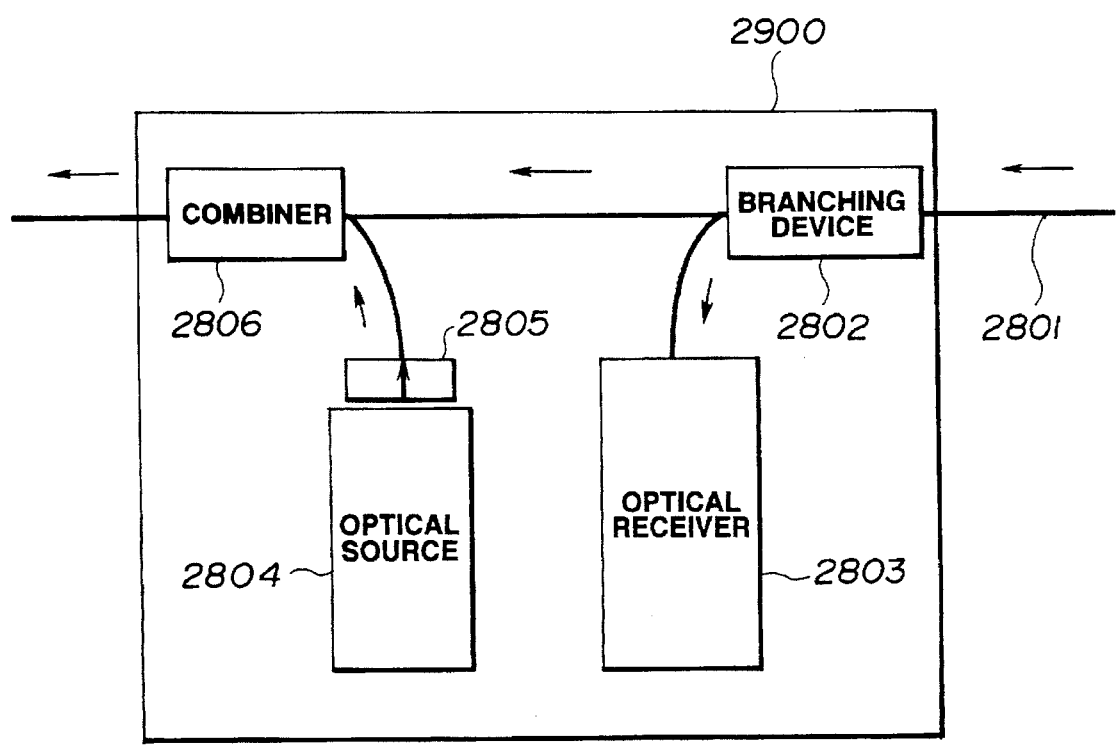
FIG. 48 is a view of a twenty-seventh embodiment of an optical node according to the present invention.

A twenty-seventh embodiment will now be described with reference to FIGS. 48 and 49. The twenty-seventh embodiment is directed to an optical local area network (LAN) system or a wavelength division multiplexing optical LAN system using a method for driving a light source for optical communication of the present invention. FIG. 48 illustrates an opto-electric converting unit (node), which is connected to a terminal of the optical LAN system shown in FIG. 49.

Figure 49:
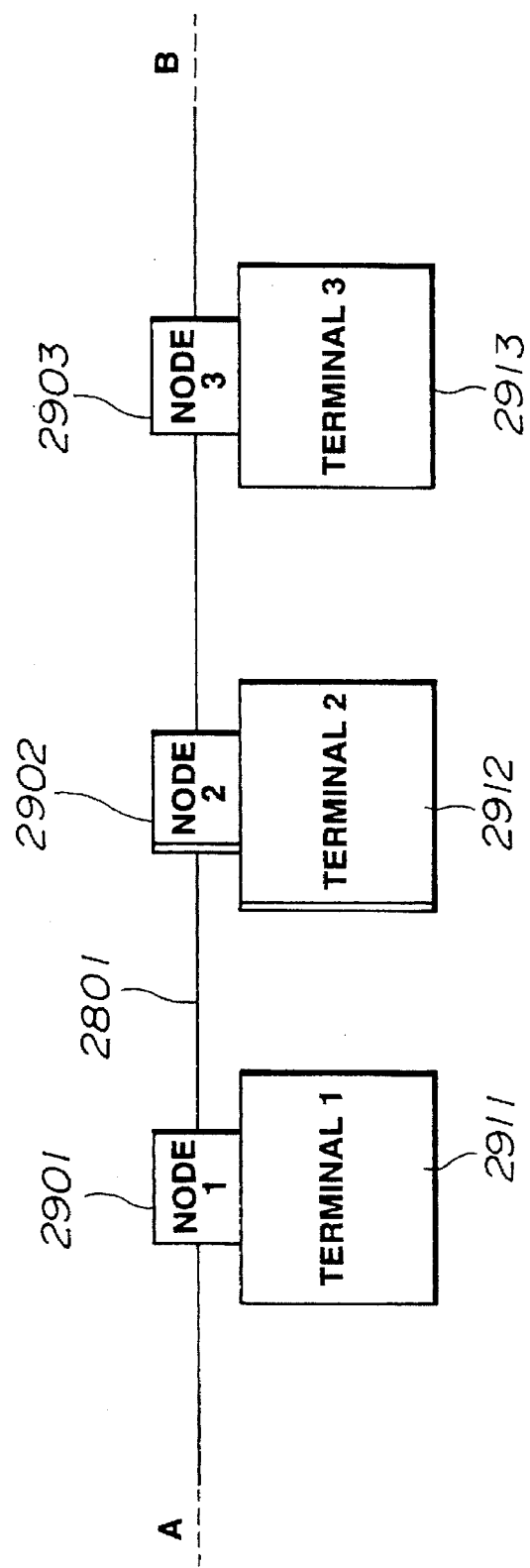
FIG. 49 is a view of an optical LAN system using optical nodes of FIG. 48 according to the present invention.

In the bus-type network shown in FIG. 49, multiple terminals 2911, 2912, 2913, . . . are respectively connected to an optical fiber 2801 through nodes 2901, 2902, 2903, . . . along a direction A-B.

In FIG. 48, a light signal is taken into the node 2900 through the optical fiber 2801, and a portion of the signal is input into an optical receiver 2803 by a branching device 2802. The optical receiver 2803 includes a tunable optical filter and a photodetector described in the above embodiments, and only signal light at a desired wavelength is taken out from the incident signal light, and the signal is detected.

On the other hand, when a light signal is transmitted from the node 2900, signal light from a light source apparatus or tunable DFB laser 2804 is input into the optical fiber 2801 at a combining portion 2806 through an isolator 2805. The laser 2804 is driven by a method described in the above embodiments, and a polarization-modulated light wave emitted from the laser 2804 is converted to an intensity-modulated light output by a polarization beam splitter, the isolator 2805 and the like. At this time, by using the driving method described in the above embodiments, a desired wavelength may be oscillated and stabilized.

A plurality of tunable optical filters and semiconductor lasers may be arranged in a node to widen the wavelength tunable range. Further, two nodes may be connected to each terminal and two optical fibers may be provided to accomplish bi-directional transmission of a DQDB system.

In such an optical network system, when the driving method and the optical transmission system of the present invention are used, a high-density wavelength or optical frequency division multiplexing network having a multiplicity of 60 or 100, for example, as described above can be constructed.

As a network, a loop type, which is constructed by connecting A and B in FIG. 49, a star type, a loop type or a compound configuration thereof may be used.

Twenty-eighth Embodiment

Figure 50:
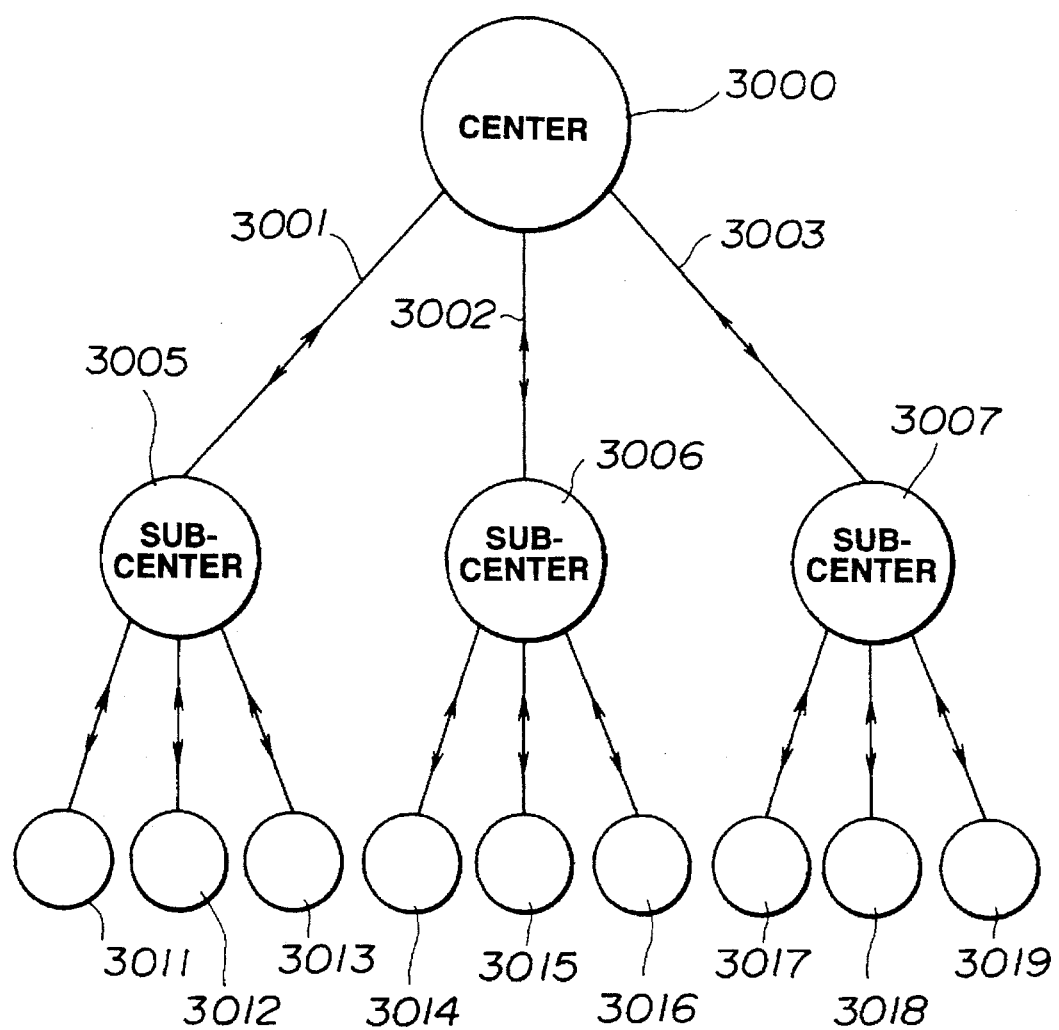
FIG. 50 is a view of a twenty-eighth embodiment of an optical CATV system according to the present invention.

A bi-directional optical CATV system, as shown in FIG. 50, can be constructed using a driving method and an optical communication system of the present invention. In FIG. 50, reference numeral 3000 is a CATV center, reference numerals 3005, 3006 and 3007 are respectively sub-centers connected to the center 3000 by optical fibers 3001, 3002 and 3003, and reference numerals 3011, 3012, ..., 3019 are respectively receivers of subscribers connected to the sub-centers 3005, 3006 and 3007. In the center 3000, a light source apparatus or tunable laser is polarization-modulated by a driving method described in the above embodiments, and a plurality of video signals are carried on signal light of different wavelengths to transmit the signals to the receivers 3011, 3012, ..., 3019. Each receiver includes a tunable wavelength filter and a photodetector, and only signal light at a desired wavelength of input signal light is detected to reproduce a picture image on a monitor. On the subscriber side, the transmission wavelength of the tunable filter is changed to select a desired channel. Thus, a desired picture image can be obtained. Conventionally, it was difficult to use such a DFB filter in that system due to dynamic wavelength fluctuation of a DFB laser. The present invention enables the use of such a DFB filter.

Further, a hi-directional CATV is possible in the following manner. Each of the receivers 3011, 3012, ..., 3019 has an external modulator (an example of a simple bi-directional optical CATV, see, for example, Ishikawa and Furuta "LiNbO$_3$ Optical Wavelength Modulator For Bi-directional Transmission in Optical CATV Subscriber Systems", OCS 91–82 1991), and a signal from the subscriber is received as a reflected light (reflected light of a signal light transmitted to the subscriber) from its external modulator. Thus, highly improved services can be obtained.

Twenty-ninth Embodiment

Figure 51:
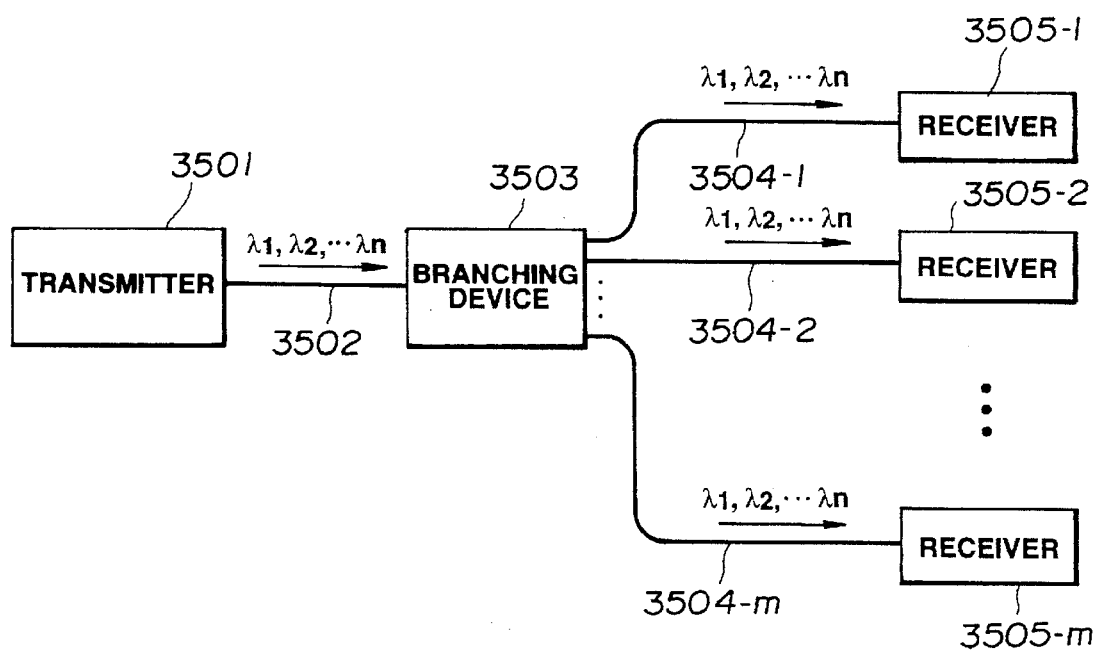
FIG. 51 is a view of a twenty-ninth embodiment of an optical communication system according to the present invention.

FIG. 51 illustrates a wavelength division multiplexing optical communication system of the present invention. This system is preferably used for picture image delivery. In FIG. 51, the number of channels is n, the number of the receivers 3505 is m and wavelengths of the channels are $\lambda_1, \lambda_2, \ldots, \lambda_n$. In a transmitter 3501, an n-number of light sources are respectively modulated by digital image signals and light signals are transmitted to an optical fiber 3502. The light signals are branched into portions in optical fibers 3504-1, 3504-2, ..., 3504-m by a light branching device 3503, and branched portions are respectively input into the receivers 3505-1, 3505-2, ..., 3505-m. The transmitter 3501 includes a plurality of oscillation polarization selective light sources or integrated semiconductor devices to which control methods of the above embodiments are applied.

By using the control method for the polarization selective light source of the present invention, a wavelength division multiplexing optical communication system can be achieved in which an occupied optical frequency for each channel is small and the modulation state is made favorable by a simple direct modulation method of the present invention.

According to the present invention, when a light source is directly polarization-modulated, the modulation state can be preferably stabilized and an occupied oscillation optical frequency can be narrowed by a relatively simple method or structure. Further, the intensity of output light can be maintained at a constant magnitude.

According to the present invention, a high-density optical frequency division multiplexing communication system using a semiconductor laser driven by a direct polarization modulation method with small dynamic wavelength fluctuation can be constructed without necessitating high-degree wavelength control techniques and electronic circuit techniques, such as coherent optical communication techniques.

Further, a small-sized and highly-productive light source for optical communication and the like can be constructed for a high-density optical frequency division multiplexing communication system using a direct polarization modulation method with very small dynamic wavelength fluctuation, etc.

Furthermore, when a light source for optical communication is constructed, optical devices, such as a semiconductor DFB laser, a polarization beam splitter and a photodiode, are needed. Therefore, it is difficult to construct a small-sized module and optical adjustment is needed when the module is built, leading to poor productivity. According to the present invention, those difficulties can be solved.

Except as otherwise disclosed herein, the various components shown in outline or block form in the Figures are individually well known in the optical semiconductor device and optical communication arts, and their internal construction and operation are not critical either to the making or using of this invention or to a description of the best mode of the invention.

While the present invention has been described with respect to what are presently considered to be the preferred embodiments, it is to be understood that the invention is not limited to the disclosed embodiments. The present invention is intended to cover various modifications and equivalent arrangements included within the sprit and scope of the appended claims.

What is claimed is:

1. A method for driving a semiconductor laser, said method comprising:
    an injecting step of injecting a current including a modulation current into a portion of a light waveguide of a semiconductor laser, whose polarization mode of oscillation light can be switched between two different polarization modes, to switch the polarization mode of oscillation light between the two different polarization modes;

an obtaining step of obtaining light in one of the two different polarization modes and light in the other of the two different polarization modes from the oscillation light from the semiconductor laser;

a converting step of converting the oscillation light in at least one of the two different polarization modes to an electric signal; and a controlling step of controlling the current injected into the semiconductor laser based on the electric signal to stabilize a modulation state of the oscillation light.

2. A method for driving a semiconductor laser according to claim 1, wherein said obtaining step comprises a step of dividing the oscillation light from the semiconductor laser into light in one of the two different polarization modes and light in the other of the two different polarization modes.

3. A method for driving a semiconductor laser according to claim 2, further comprising a coupling step of coupling the light in one of the two different polarization modes to a light transmission line.

4. A method for driving a semiconductor laser according to claim 3, wherein said converting step comprises a step of converting the light in the other of the two different polarization modes to an electric signal, and said controlling step comprises a step of controlling the current injected into the semiconductor laser based on the electric signal to stabilize the modulation state of the light coupled to the light transmission line.

5. A method for driving a semiconductor laser according to claim 1, wherein the current controlled in said controlling step is injected into a portion of the semiconductor laser into which the modulation current is injected.

6. A method for driving a semiconductor laser according to claim 1, wherein the current controlled in said controlling step is injected into a portion of the light waveguide different from the portion into which the modulation current is injected.

7. A method for driving a semiconductor laser according to claim 1, wherein the semiconductor laser is a distributed feedback semiconductor laser in which a diffraction grating is formed near the light waveguide and the waveguide contains an active layer of a quantum well structure and a pitch of the diffraction grating is set such that Bragg wavelengths for the two different polarization modes are close to a wavelength corresponding to a band gap energy between a light-hole level in a valence band and an electron ground level in a conduction band and such that threshold gains at the Bragg wavelengths for the two different polarization modes are substantially equal to each other.

8. A method for driving a semiconductor laser according to claim 7, wherein the active layer comprises a layer of a multiple quantum well structure into which a tensile strain is introduced and the light-hole level in the valence band is equal to a heavy-hole level in the valence band or is closer to the electron ground level in the conduction band than the heavy-hole level in the valence band.

9. A method for driving a semiconductor laser according to claim 1, wherein said controlling step comprises a step of transmitting the electric signal through a low pass filter, a step of comparing an output of the low pass filter with a reference voltage in a differential amplifier and a step of feeding an output of the differential amplifier back to a DC current source for driving the semiconductor laser through proportional and integral circuit at a feedback rate so as to control the current injected into the semiconductor laser.

10. A method for driving a semiconductor laser according to claim 1, further comprising a step of modulating the current injected into the semiconductor laser with a low-frequency sinusoidal wave and a step of multiplying the low-frequency sinusoidal wave with the electric signal in a multiplying means, and wherein said controlling step comprises a step of transmitting an output of the multiplying means through a low pass filter, a step of comparing an output of the low pass filter with a reference voltage in a differential amplifier and a step of feeding an output of the differential amplifier back to a DC current source for driving the semiconductor laser through proportional and integral circuit at a feedback rate so as to control the current injected into the semiconductor laser.

11. A method for driving a semiconductor laser according to claim 1, wherein the semiconductor laser is a laser whose oscillation wavelength is tunable by changing a ratio between currents injected into at least two portions of the light waveguide, and further comprising a step of changing a fluctuation in oscillation wavelength of oscillation light from the semiconductor laser to a fluctuation in light intensity by a wavelength discriminator, between said obtaining step and said converting step.

12. A method for driving a semiconductor laser according to claim 11, wherein said controlling step comprises a step of transmitting an electric signal converted from the fluctuation in light intensity by the wavelength discriminator, through a low pass filter, a step of comparing an output of the low pass filter with a reference voltage in a differential amplifier and a step of feeding an output of the differential amplifier back to a DC current source for driving the semiconductor laser in a proportional plus integral circuit at a feedback rate so as to control the current injected into the semiconductor laser and to stabilize at least the oscillation wavelength.

13. A method for driving a semiconductor laser according to claim 11, further comprising a step of modulating the currents injected into the semiconductor laser with a low-frequency sinusoidal wave and a step of multiplying the low-frequency sinusoidal wave with an electric signal converted from the fluctuation in light intensity by the wavelength discriminator, by a multiplying means, and wherein said controlling step comprises a step of transmitting an output of the multiplying means through a low pass filter, a step of comparing an output of the low pass filter with a reference voltage in a differential amplifier and a step of feeding an output of the differential amplifier back to a DC current source for driving the semiconductor laser by a proportional and integral circuit at a feedback rate so as to control the current injected into the semiconductor laser and to stabilize at least the oscillation wavelength.

14. A method for driving a semiconductor laser according to claim 9, wherein the semiconductor laser is a laser whose oscillation wavelength is tunable by changing a ratio between currents injected into at least two portions of the light waveguide, further comprising a step of changing a fluctuation in oscillation wavelength of light from the semiconductor laser to a fluctuation in light intensity by a wavelength discriminator, between said obtaining step and said converting step, and wherein said controlling step comprises a step of transmitting an electric signal converted from the fluctuation in light intensity by the wavelength discriminator, through a low pass filter, a step of comparing an output of the low pass filter with a reference voltage in a differential amplifier and a step of feeding an output of the differential amplifier back to a DC current source for driving the semiconductor laser by a proportional plus integral circuit at a feedback rate so as to control the current injected into the semiconductor laser and stabilize the oscillation wavelength.

15. A method for driving a semiconductor laser according to claim 10, wherein the semiconductor laser is a laser whose oscillation wavelength is tunable by changing a ratio between currents injected into at least two portions of the light waveguide, further comprising a step of changing a fluctuation in oscillation wavelength of light from the semiconductor laser to a fluctuation in light intensity by a wavelength discriminator, between said obtaining step and said converting step, further comprising a step of modulating the current injected into the semiconductor laser by a low-frequency sinusoidal wave and a step of multiplying the low-frequency sinusoidal wave with an electric signal converted from the fluctuation in light intensity by the wavelength discriminator, by a multiplying means, and wherein said controlling step comprises a step of transmitting an output of the multiplying means through a low pass filter, a step of comparing an output of the low pass filter with a reference voltage in a differential amplifier and a step of feeding an output of the differential amplifier back to a DC current source for driving the semiconductor laser by a proportional and integral circuit at a feedback rate to control the current injected into the emiconductor laser and stabilize the oscillation wavelength.

16. A method for driving a semiconductor laser according to claim 1, wherein said converting step comprises a step of converting light in both of the two different polarization modes to electric signals, and said controlling step comprises a step of processing the electric signals by a differential amplifier and a step of feeding an output of the differential amplifier back to a driving circuit for driving the semiconductor laser so as to control the current injected into the semiconductor laser and maintain a difference between light intensities of the two different polarization modes at a predetermined value.

17. A method for driving a semiconductor laser according to claim 1, wherein said converting step comprises a step of converting light in both of the two different polarization modes to electric signals, and said controlling step comprises a step of producing a difference signal between the electric signals, a step of amplifying a difference between the difference signal and a reference voltage by a differential amplifier and a step of feeding an output of the differential amplifier back to a driving circuit for driving the semiconductor laser so as to control the current injected into the semiconductor laser and maintain a difference between light intensities of the two different polarization modes at a predetermined value.

18. A method for driving a semiconductor laser according to claim 1, wherein said converting step comprises a step of converting light in both of the two different polarization modes to electric signals, and said controlling step comprises a step of feeding signals derived from the electric signals back to a driving circuit for driving the semiconductor laser so as to concurrently control the current injected into the semiconductor laser and stabilize light intensities of the two different polarization modes.

19. A method for driving a semiconductor laser according to claim 18, wherein said controlling step comprises a step of producing a difference signal between the electric signals, a step of amplifying a difference between one of the electric signals and a reference voltage in a differential amplifier and a step of feeding the difference signal and an output of the differential amplifier back to the driving circuit for driving the semiconductor laser so as to control the current injected into the semiconductor laser and maintain a difference between light intensities of the two different polarization modes at a predetermined value and stabilize a light intensity of the oscillation light of one of the two different polarization modes.

20. A method for driving a semiconductor laser according to claim 18, wherein said controlling step comprises a step of producing a first difference signal between one of the electric signals and a first reference voltage, a step of producing a second difference signal between the other of the electric signals and a second reference voltage and a step of feeding the first and second difference signals back to the driving circuit for driving the semiconductor laser so as to control the current injected into the semiconductor laser and maintain light intensities of the oscillation light of the two different polarization modes at predetermined values, respectively.

21. A method for driving a semiconductor laser according to claim 16, wherein the predetermined value is zero.

22. A method for driving a semiconductor laser according to claim 19, wherein the predetermined value is zero.

23. A method for driving a semiconductor laser according to claim 1, wherein said obtaining step comprises a step of dividing the light from the semiconductor laser into light in one of the two different polarization modes and the light in the other polarization mode, based on the polarization mode of light.

24. A method for driving a semiconductor laser according to claim 1, wherein said obtaining step comprises a step of dividing the light from the semiconductor laser into the light in one of the two different polarization modes and the light in the other of the two different polarization modes, based on a wavelength of the oscillation light.

25. A method for driving a semiconductor laser according to claim 1, wherein said obtaining step comprises a step of branching the oscillation light from the semiconductor laser into two light portions, a step of of combining one of the two light portions and the light from one of two local oscillators, one of which emits light of the same polarization mode and wavelength as those of light in one of the two different polarization modes from the semiconductor laser and the other of which emits light of the same polarization mode and wavelength as those of light in the other of the two different polarization modes from the semiconductor laser, in a first photodetector, and a step of combining the other of the two light portions and the light from the other of the two local oscillators in a second photodetector.

26. A method for driving a semiconductor laser according to claim 1, further comprising a coupling step of coupling oscillation light from the semiconductor laser to a light transmission line through a polarization mode selecting means for selecting the light in one of the two different polarization modes.

27. A method for driving a semiconductor laser according to claim 1, further comprising a coupling step of coupling oscillation light from the semiconductor laser to a light transmission line through a wavelength selecting means for selecting the light in one of the two different polarization modes.

28. An apparatus for driving a semiconductor laser, said apparatus comprising:

a semiconductor laser, a polarization mode of oscillation light from said semiconductor laser being switched between two different polarization modes by injecting a current including a modulation current into a portion of a light waveguide of said semiconductor laser;

obtaining means for obtaining light in one of the different polarization modes and light in the other of the different polarization modes from the oscillation light from said semiconductor laser;

converting means for converting the light in at least one of the two different polarization modes to an electric signal; and controlling means for controlling the current injected into said semiconductor laser based on the electric signal such that a modulation state of the oscillation light from said semiconductor laser is stabilized.

29. An apparatus for driving a semiconductor laser according to claim 28, wherein said obtaining means comprises dividing means for dividing the oscillation light from the semiconductor laser into the light in one of the different polarization modes and the light in the other of the different polarization modes.

30. An apparatus for driving a semiconductor laser according to claim 29, wherein said dividing means comprises a polarization beam splitter.

31. An apparatus for driving a semiconductor laser according to claim 28, further comprising coupling means for coupling the light in one of the two different polarization modes to a light transmission line.

32. An apparatus for driving a semiconductor laser according to claim 31, wherein said coupling means comprises an isolator.

33. An apparatus for driving a semiconductor laser according to claim 31, wherein said converting means converts the light in the other of the two different polarization modes to an electric signal, and said controlling means controls the current injected into said semiconductor laser based on the electric signal such that the modulation state of the light coupled to the light transmission line is stabilized.

34. An apparatus for driving a semiconductor laser according to claim 28, wherein the current controlled in said controlling means is injected into a portion of the waveguide into which the modulation current is injected.

35. An apparatus for driving a semiconductor laser according to claim 28, wherein the current controlled in said controlling means is injected into a portion of the light waveguide different from a portion into which the modulation current is injected.

36. An apparatus for driving a semiconductor laser according to claim 28, wherein said semiconductor laser comprises a distributed feedback semiconductor laser which includes a diffraction grating formed near the light waveguide that contains an active layer of a quantum well structure and in which a pitch of said diffraction grating is set such that Bragg wavelengths for the two different polarization modes are close to a wavelength corresponding to a band gap energy between a light-hole level in a valence band and an electron ground level in a conduction band and such that threshold gains at the Bragg wavelengths for the two different polarization modes are substantially equal to each other.

37. An apparatus for driving a semiconductor laser according to claim 36, wherein said active layer comprises a layer of a multiple quantum well structure into which a tensile strain is introduced and the light-hole level in the valence band is equal to a heavy-hole level in the valence band or is closer to the electron ground level in the conduction band than the heavy-hole level in the valence band.

38. An apparatus for driving a semiconductor laser according to claim 28, wherein said controlling means comprises a low pass filter for transmitting the electric signal therethrough, a differential amplifier for comparing an output of said low pass filter with a reference voltage and feedback means for feeding an output of said differential amplifier back to a DC current source for driving said semiconductor laser through a proportional plus integral circuit at a feedback rate so as to control the current injected into said semiconductor laser.

39. An apparatus for driving a semiconductor laser according to claim 28, further comprising a low-frequency sinusoidal wave generator for modulating the current injected into the semiconductor laser by a low-frequency sinusoidal wave and multiplying means for multiplying the low-frequency sinusoidal wave with the electric signal, and wherein said controlling means comprises a low pass filter for transmitting an output of said multiplying means therethrough, a differential amplifier for comparing an output of said low pass filter with a reference voltage and feedback means for feeding an output of said differential amplifier back to a DC current source for driving said semiconductor laser through a proportional plus integral circuit at a feedback rate so as to control the current injected into said semiconductor laser.

40. An apparatus for driving a semiconductor laser according to claim 28, wherein said semiconductor laser comprises a laser whose oscillation wavelength is tunable by changing a ratio between currents injected into at least two portions of the light waveguide, and further comprising a wavelength discriminator for changing a fluctuation in oscillation wavelength of light from said semiconductor laser to a fluctuation in light intensity, said wavelength discriminator being disposed between said obtaining means and said converting means.

41. An apparatus for driving a semiconductor laser according to claim 28, wherein said converting means converts the oscillation light in both of the two different polarization modes to electric signals, and said controlling means comprises a differential amplifier for processing the electric signals and feedback means for feeding an output of the differential amplifier back to a driving circuit for driving said semiconductor laser so as to control the current injected into said semiconductor laser and maintain a difference between light intensities of the light of the two different polarization modes at a predetermined value.

42. An apparatus for driving a semiconductor laser according to claim 28, wherein said converting means converts the light in both of the two different polarization modes to electric signals, and said controlling means comprises a subtracter for producing a difference signal between the electric signals, a differential amplifier for amplifying a difference between the difference signal and a reference voltage and feedback means for feeding an output of the differential amplifier back to a driving circuit for driving said semiconductor laser so as to control the current injected into said semiconductor laser and maintain a difference between light intensities of the two different polarization modes at a predetermined value.

43. An apparatus for driving a semiconductor laser according to claim 28, wherein said converting means converts the light in both of the two different polarization modes to electric signals, and said controlling means comprises feedback means for feeding signals derived from the electric signals back to a driving circuit for driving said semiconductor laser so as to concurrently control the current injected into said semiconductor laser and stabilize light intensities of the two different polarization modes.

44. An apparatus for driving a semiconductor laser according to claim 43, wherein said controlling means comprises a subtracter for producing a difference signal between the electric signals, a differential amplifier for amplifying a difference between one of the electric signals and a reference voltage and feedback means for feeding the difference signal and an output of the differential amplifier back to said driving circuit for driving said semiconductor laser so as to control the current injected into said semiconductor laser and maintain a difference between light intensities of the light of the two different polarization modes at a predetermined value and stabilize a light intensity of one of the light of the two different polarization modes.

45. An apparatus for driving a semiconductor laser according to claim 43, wherein said controlling means comprises a subtracter for producing a first difference signal between one of the electric signals and a first reference voltage, a subtracter for producing a second difference signal between the other of the electric signals and a second reference voltage and feedback means for feeding the first and second difference signals back to said driving circuit for driving said semiconductor laser so as to control the current injected into said semiconductor laser and maintain light intensities of the light of the two different polarization modes at predetermined values, respectively.

46. An apparatus for driving a semiconductor laser according to claim 28, wherein said obtaining means comprises dividing means for dividing the light from the semiconductor laser into the light in one of the two different polarization modes and the light in the other of the two different polarization modes, based on the polarization mode of the oscillation light.

47. An apparatus for driving a semiconductor laser according to claim 28, wherein said obtaining means comprises dividing means for dividing the light from the semiconductor laser into the light in one of the two different polarization modes and the light in the other of the two different polarization modes, based on a wavelength of the oscillation light.

48. An apparatus for driving a semiconductor laser according to claim 28, wherein said obtaining means comprises means for branching the light from said semiconductor laser into two light portions, two local oscillators one of which emits light of the same polarization mode and wavelength as those of the light in one of the two different polarization modes from said semiconductor laser and the other of which emits light of the same polarization mode and wavelength as those of the light in the other of the two different polarization modes from said semiconductor laser, a first photodetector for combining one of the two light portions and the light from one of the two local oscillators therein and a second photodetector for combining the other of the two light portions and the light from the other of the two local oscillators therein.

49. An apparatus for driving a semiconductor laser according to claim 28, further comprising coupling means for coupling oscillation light from said semiconductor laser to a light transmission line through a polarization mode selecting means for selecting light in one of the two different polarization modes.

50. An apparatus for driving a semiconductor laser according to claim 28, further comprising coupling means for coupling oscillation light from said semiconductor laser to a light transmission line through a wavelength selecting means for selecting light in one of the two different polarization modes.

51. An apparatus for driving a semiconductor laser according to claim 28, further comprising a substrate, and wherein said obtaining means comprises a waveguide type polarization mode splitter for dividing the oscillation light from said semiconductor laser into light in one of the two different polarization modes and light in the other of the two different polarization modes and wherein said semiconductor laser, said waveguide type polarization mode splitter and said converting means are integrated on said substrate.

52. An apparatus for driving a semiconductor laser according to claim 51, wherein said substrate comprises a semiconductor substrate, and said semiconductor laser, said waveguide type polarization mode splitter and said converting means are monolithically integrated on said semiconductor substrate.

53. An apparatus for driving a semiconductor laser according to claim 51, wherein said semiconductor laser, said waveguide type polarization mode splitter and said converting means are integrated on said substrate in a hybrid form.

54. An apparatus for driving a semiconductor laser according to claim 51, wherein said polarization mode splitter comprises a Y-branching waveguide having two waveguide branches formed on a common plane, said Y-branching waveguide including a semiconductor super-lattice layer, and said super-lattice layer in one of the waveguide branches being mixed.

55. An apparatus for driving a semiconductor laser according to claim 51, wherein said polarization mode splitter comprises a Y-branching waveguide having two waveguide branches formed on a common plane, and a metal film is loaded on one of the waveguide branches.

56. An apparatus for driving a semiconductor laser according to claim 51, wherein said polarization mode splitter comprises at least two waveguide layers formed with an intermediate layer therebetween, and a diffraction grating is formed close to one of said waveguide layers.

57. An apparatus for driving a semiconductor laser according to claim 51, wherein said polarization mode splitters are arranged on both light emission sides of said semiconductor laser.

58. An apparatus for driving a semiconductor laser according to claim 51, wherein said converting means comprises at least one photodetector for detecting light propagated through at least one of plural waveguides of said polarization mode splitter.

59. An apparatus for driving a semiconductor laser according to claim 51, wherein said polarization mode splitter comprises a directional coupler.

60. An apparatus for driving a semiconductor laser according to claim 51, wherein said polarization mode splitter comprises an etched mirror.

61. An apparatus for driving a semiconductor laser according to claim 51, wherein said obtaining means comprises means for branching the light from said semiconductor laser into two light portions, two local oscillating semiconductor lasers one of which emits light of the same polarization mode and wavelength as those of light in one of the two different polarization modes from said semiconductor laser and the other of which emits light of the same polarization mode and wavelength as those of light in the other of the two different polarization modes from said semiconductor laser, a first photodetector for combining one of the two light portions and the light from one of the two local oscillators therein and a second photodetector for combining the other of the two light portions and the light from the other of the two local oscillators therein, and said semiconductor laser, said two local oscillating semiconductor lasers and said first and second photodetectors are integrated on said substrate.

62. An apparatus for driving a semiconductor laser according to claim 61, wherein wavelengths and line widths of said semiconductor laser and said two local oscillating semiconductor lasers are set such that beat signals created in said first and second photodetectors have frequencies that can be processed by an electric circuit.

* * * * *

UNITED STATES PATENT AND TRADEMARK OFFICE
CERTIFICATE OF CORRECTION

PATENT NO. : 5,659,560
DATED : Aug. 19, 1997
INVENTOR(S) : OUCHI ET AL.

It is certified that error appears in the above-identified patent and that said Letters Patent is hereby corrected as shown below:

Column 10

Line 36, "Ee$\phi$)" should read --$E_{eo}$)--; and
Line 42, "Ee$\phi$)." should read --$E_{eo}$).--; and
Line 43, "1,562" should read --1.562--.

Column 11

Line 51, "$P_{0.5}$" should read --$P_{0.6}$--.

Column 15

Line 18, "low" should read --is low--.

Column 17

Line 15, "$P_{0.5}$" should read --$P_{0.6}$--

Column 18

Line 61, "not" should read --not to--.

UNITED STATES PATENT AND TRADEMARK OFFICE
CERTIFICATE OF CORRECTION

PATENT NO. : 5,659,560
DATED : Aug. 19, 1997
INVENTOR(S) : OUCHI ET AL.

It is certified that error appears in the above-identified patent and that said Letters Patent is hereby corrected as shown below:

Column 19

Line 52, "PIP" should read --PID--.

Column 20

Line 8, "noq" should read --now--.

Column 21

Line 42, "$(P_{TE} \neq P_{TM})$." should read --$(P_{TE} \neq P_{TM})$.--.

Column 24

Line 34, "the the" should read --the--.

Column 28

Line 64, "$\lambda$" should read --$\ell$--.

UNITED STATES PATENT AND TRADEMARK OFFICE
CERTIFICATE OF CORRECTION

PATENT NO. : 5,659,560
DATED : Aug. 19, 1997
INVENTOR(S) : OUCHI ET AL.

It is certified that error appears in the above-identified patent and that said Letters Patent is hereby corrected as shown below:

Column 29

Line 61, "apparatuse" should read --apparatus--.

Column 32

Line 4, "$E^y$" should read --Ey--.

Column 35

Line 54, "hi-directional" should read --bi-directional--.

Column 36

Line 59, "sprit" should read --spirit--.

Column 37

Line 64, "proportional" should read --a proportional--.

Column 38

Line 9, "proportional" should read --a proportional--.

UNITED STATES PATENT AND TRADEMARK OFFICE
CERTIFICATE OF CORRECTION

PATENT NO. : 5,659,560
DATED : Aug. 19, 1997
INVENTOR(S) : OUCHI ET AL.

It is certified that error appears in the above-identified patent and that said Letters Patent is hereby corrected as shown below:

<u>Column 39</u>

Line 17, "emiconductor" should read --semiconductor--.

<u>Column 40</u>

Line 25, "of of" should read --of--.

Signed and Sealed this

Fourteenth Day of April, 1998

Attest:

BRUCE LEHMAN

*Attesting Officer*   *Commissioner of Patents and Trademarks*